US008604513B2

(12) United States Patent
Ashida et al.

(10) Patent No.: US 8,604,513 B2
(45) Date of Patent: Dec. 10, 2013

(54) SEMICONDUCTOR DEVICE HAVING SOI SUBSTRATE

(75) Inventors: Youichi Ashida, Nukata-gun (JP); Norihito Tokura, Okazaki (JP); Shigeki Takahashi, Okazaki (JP); Yoshiaki Nakayama, Okazaki (JP); Satoshi Shiraki, Toyohashi (JP); Kouji Senda, Nishikamo-gun (JP)

(73) Assignee: DENSO CORPORATION, Kariya (JP)

( * ) Notice: Subject to any disclaimer, the term of this patent is extended or adjusted under 35 U.S.C. 154(b) by 404 days.

(21) Appl. No.: 12/923,469

(22) Filed: Sep. 23, 2010

(65) Prior Publication Data

US 2011/0073904 A1     Mar. 31, 2011

(30) Foreign Application Priority Data

Sep. 30, 2009 (JP) ................... 2009-227157
Oct. 6, 2009 (JP) ................... 2009-232421
Aug. 6, 2010 (JP) ................... 2010-177427

(51) Int. Cl.
*H01L 29/66* (2006.01)
(52) U.S. Cl.
USPC ................... 257/139; 257/E29.018
(58) Field of Classification Search
USPC ............ 257/525, 544, E27.06, E29.019, 257/E29.073, E21.361, E29.261, 139
See application file for complete search history.

(56) References Cited

U.S. PATENT DOCUMENTS

| 5,485,030 | A | * | 1/1996 | Terashima ................ 257/506 |
| 5,708,287 | A | * | 1/1998 | Nakagawa et al. ......... 257/350 |
| 6,049,109 | A | | 4/2000 | Omura et al. |
| 2004/0227188 | A1 | | 11/2004 | Terashima |
| 2007/0108533 | A1 | * | 5/2007 | Sekiguchi et al. ......... 257/379 |
| 2008/0290366 | A1 | * | 11/2008 | Lerner ..................... 257/133 |

OTHER PUBLICATIONS

Office Action dated Jun. 18, 2012 in corresponding CN Application No. 201010503591.6 (with English translation).

* cited by examiner

*Primary Examiner* — Daniel Luke
*Assistant Examiner* — Latanya N Crawford
(74) *Attorney, Agent, or Firm* — Posz Law Group, PLC

(57) ABSTRACT

A semiconductor device includes: a SOI substrate; a semiconductor element having first and second impurity layers disposed in an active layer of the SOI substrate, the second impurity layer surrounding the first impurity layer; and multiple first and second conductive type regions disposed in a part of the active layer adjacent to an embedded insulation film of the SOI substrate. The first and second conductive type regions are alternately arranged. The first and second conductive type regions have a layout, which corresponds to the semiconductor element.

25 Claims, 33 Drawing Sheets

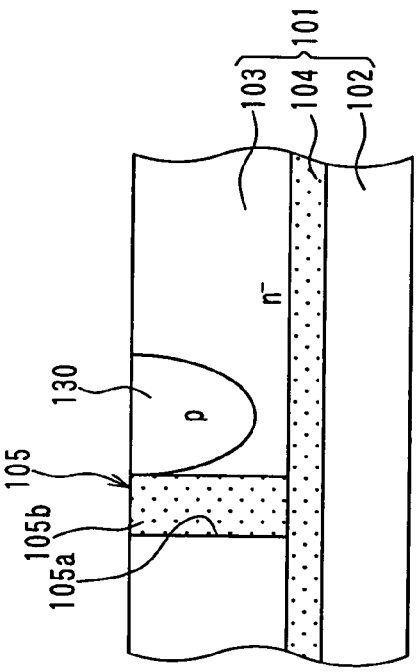
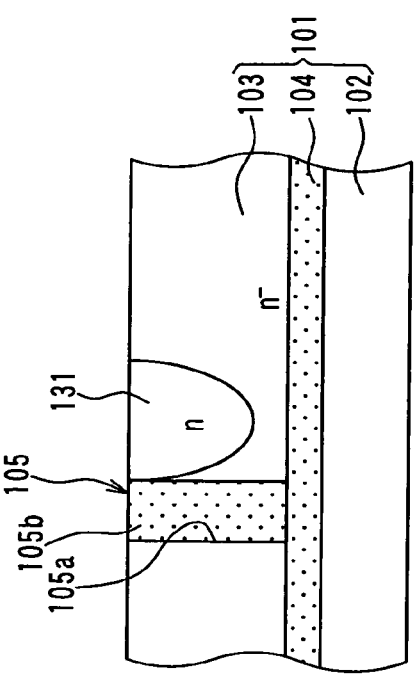
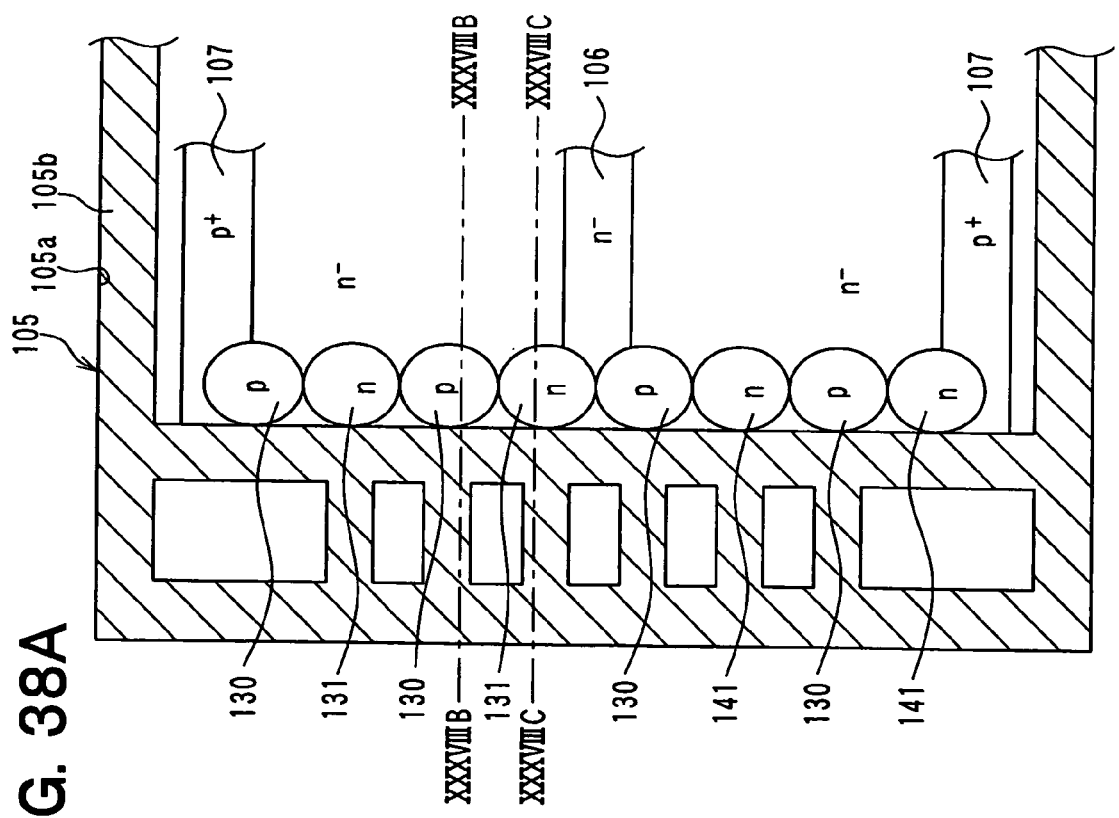

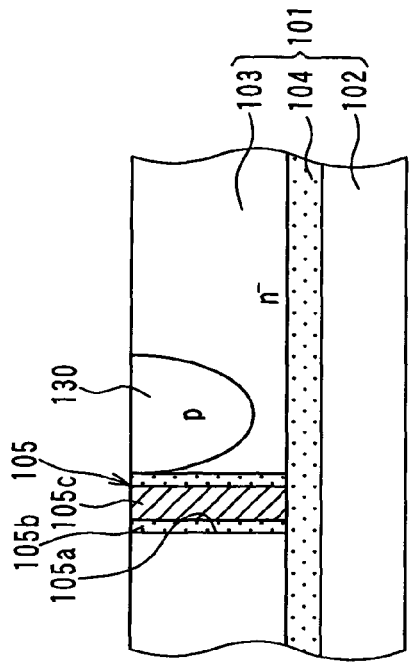
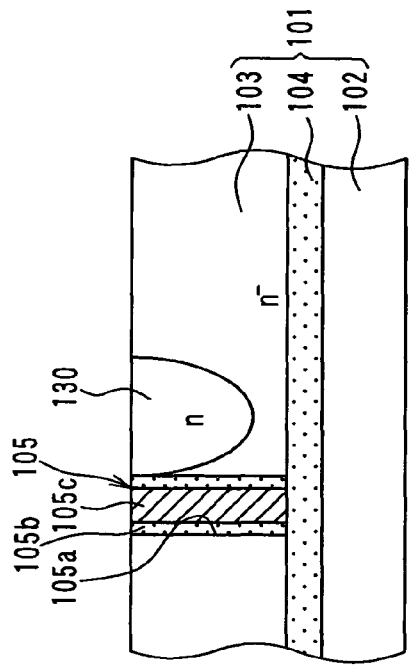
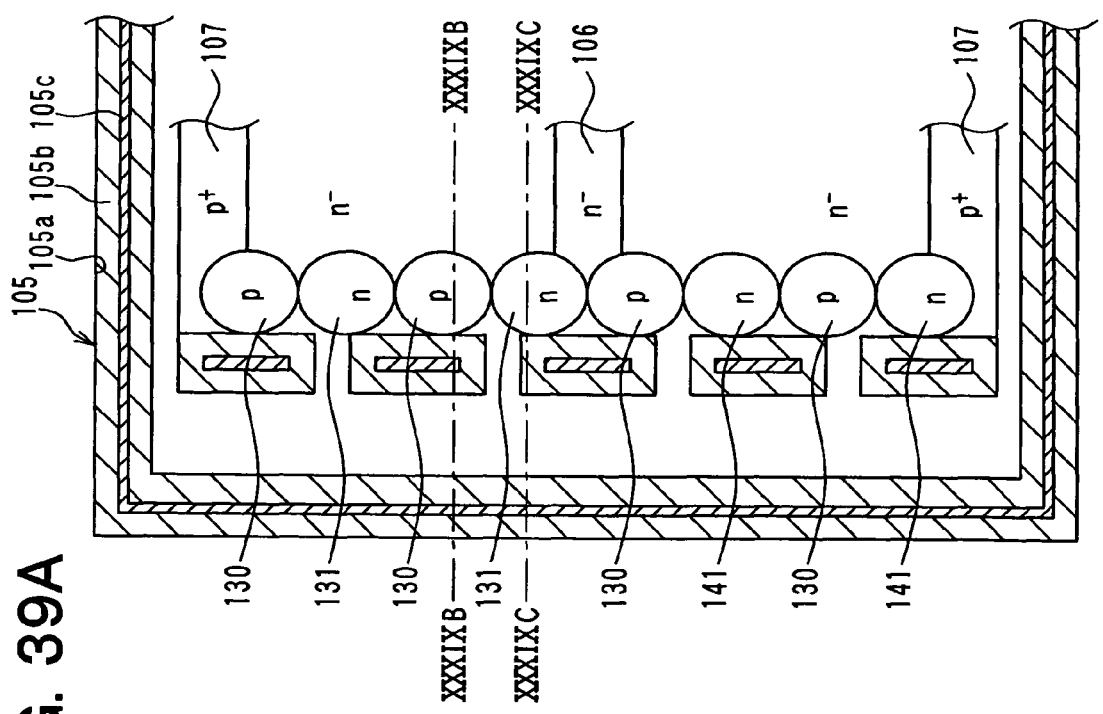

US 8,604,513 B2

SEMICONDUCTOR DEVICE HAVING SOI SUBSTRATE

CROSS REFERENCE TO RELATED APPLICATIONS

This application is based on Japanese Patent Applications No. 2009-227157 filed on Sep. 30, 2009, No. 2009-232421 filed on Oct. 6, 2009, and No. 2010-177427 filed on Aug. 6, 2010, the disclosures of which are incorporated herein by reference.

FIELD OF THE INVENTION

The present invention relates to a semiconductor device having a SOI substrate and a method for manufacturing the same. The semiconductor device has a sufficient breakdown voltage.

BACKGROUND OF THE INVENTION

Conventionally, a semiconductor device has a semiconductor element, which is formed in a SOI substrate. The SOI substrate is prepared such that a support substrate and an active layer are bonded to each other via an embedded insulation film. In the semiconductor device, a potential of the support substrate is fixed to be a predetermined potential such as a GND potential when the device is operated. Under a condition that the potential of the support substrate is fixed to be the predetermined potential, when a high voltage is applied to a predetermined part of the active layer, an electric charge is induced to a part of the active layer, which is adjacent to the insulation film, so that an inversion layer is formed. Accordingly, a breakdown voltage is reduced. This reduction will be explained with reference to FIG. 22.

FIG. 22 shows an equivalent electric potential distribution in the semiconductor device having a lateral type PN diode with respect to a SOI substrate J1. When a high voltage is applied to a cathode electrode J2 of the PN diode, and an anode electrode J3 is grounded, a positive charge is induced to a part of the active layer J4 adjacent to the embedded insulation film J5 so that a inversion layer is formed in the part of the active layer j4. Thus, a distance of adjacent equivalent electric potential lines between the N+ cathode region 36 and the insulation film J5 is narrowed. Accordingly, the electric field becomes high between the N+ cathode region J6 and the insulation film J5. Thus, the breakdown voltage of the device is reduced.

To prevent the breakdown voltage reduction, a semiconductor device having an insulation film, a surface of which is concaved and convexed, is disclosed in JP-B2-3959125 corresponding to U.S. Pat. No. 6,049,109. FIG. 23 shows a cross sectional view of the device. A concavity J5a and a convexity J5b are formed on the embedded insulation film J5 so that a positive charge is localized at the concavity J5a. Thus, a pseudo field plate is formed. When the pseudo field plate is formed, the equivalent electric potential lines are arranged in a vertical direction toward the convexity J5b. Accordingly, the distance between adjacent equivalent electric potential lines is modified, so that the breakdown voltage is improved.

However, when the concavity and convexity are formed on the embedded insulation film, various steps for forming the concavity and convexity are necessary. Thus, a manufacturing process is complicated. Specifically, before a silicon substrate as the active layer is bonded to the support substrate, a concavity is formed on the backside of the silicon substrate by a photo etching method. Thus, the concavity and convexity are formed on the silicon substrate in a concavity and convexity forming step. Then, in an insulation forming step, an insulation film is deposited on the backside of the silicon substrate, on which the concavity and convexity are formed. In a flattening step, the surface of the insulation film is flattened. Further, to localize the charge at the concavity, it is necessary to form the concavity having a sufficient depth in the concavity and convexity forming step. In the insulation forming step, the insulation film is formed to have a sufficient thickness so that the concavity is embedded with the insulation film. Furthermore, in the flattening step, the insulation film is flattened. Thus, the manufacturing process of the device is complicated.

Further, conventionally, a semiconductor device having a high breakdown voltage is prepared from a SOI substrate, which includes a support substrate, an active layer and an embedded insulation film. In this device, a breakdown voltage reduction at a periphery of the device may arise. In JP-B2-4204895 corresponding to US 2004/0227188, voltage-dividing diodes are arranged on a side of the high breakdown voltage device via an insulation film, the device having a rectangular shape. The diodes are coupled with each other via a wiring. In this case, the voltage-dividing diode provides to divide the voltage in multiple steps between an end of the device on the high voltage side to the other end of the device on the low voltage side in accordance with a distance. Thus, a electric potential control is performed through the side of the device, and therefore, the electric field is reduced. The breakdown voltage reduction is restricted.

However, in the above device, to control the electric potential of the side of the device, the voltage-dividing diode as a control device is additionally formed in the device. Thus, dimensions of the device increase.

SUMMARY OF THE INVENTION

In view of the above-described problem, it is an object of the present disclosure to provide a semiconductor device having a SOI substrate and a method for manufacturing the same. A breakdown voltage of the device is improved.

According to a first aspect of the present disclosure, a semiconductor device includes: a SOI substrate having a support substrate, an embedded insulation film and an active layer, which are stacked in this order, wherein the active layer is made of silicon having a first conductive type; a semiconductor element having a first impurity layer and a second impurity layer, which are disposed in a surface portion of the active layer, wherein the second impurity layer surrounds the first impurity layer so that the first impurity layer and the second impurity layer have a first layout; a element separation region disposed in the active layer and surrounded with an element separation structure; and a plurality of first conductive type regions and a plurality of second conductive type regions, which are disposed in the element separation region. The first conductive type regions and the second conductive type regions are disposed in a part of the active layer, which is adjacent to the embedded insulation film, and are alternately arranged between the first impurity layer and the second impurity layer. The first conductive type regions and the second conductive type regions have a second layout, which corresponds to the semiconductor element. The first conductive type regions have an impurity concentration, which is higher than the active layer.

In the above device, the second conductive type regions sandwich the first conductive type region so that the second conductive type regions are spaced apart from each other by a predetermined distance. The first and second conductive type regions are disposed in the part of the active layer adjacent to the embedded insulation film and under the semiconductor element. Accordingly, a charge is induced to a part of the second conductive type regions adjacent to the insulation film. Specifically, no charge is induced to a part of the first conductive type regions adjacent to the insulation film. Thus, a reverse layer is localized in the part of the second conductive type regions. Accordingly, a pseudo field plate is formed. Thus, a voltage drop is generated in accordance with a distance of the first conductive type region in a lower portion of the active layer adjacent to the insulation film. Without forming concavity and convexity having a large depth, the breakdown voltage is improved.

According to a second aspect of the present disclosure, a semiconductor device includes: a SOI substrate having a support substrate, an embedded insulation film and an active layer, which are stacked in this order, wherein the active layer is made of silicon having a first conductive type; a semiconductor element having a first impurity layer and a second impurity layer, which are disposed in a surface portion of the active layer, wherein the second impurity layer surrounds the first impurity layer so that the first impurity layer and the second impurity layer have a first layout; and a plurality of first conductive type regions and a plurality of second conductive type regions, which are disposed in a part of the active layer adjacent to the embedded insulation film. The first conductive type regions and the second conductive type regions are alternately arranged. The first conductive type regions and the second conductive type regions have a second layout, which corresponds to the semiconductor element.

In the above device, the second conductive type regions sandwich the first conductive type region so that the second conductive type regions are spaced apart from each other by a predetermined distance. The first and second conductive type regions are disposed in the part of the active layer adjacent to the embedded insulation film and under the semiconductor element. Accordingly, a charge is induced to a part of the second conductive type regions adjacent to the insulation film. Specifically, no charge is induced to a part of the first conductive type regions adjacent to the insulation film. Thus, a reverse layer is localized in the part of the second conductive type regions. Accordingly, a pseudo field plate is formed. Thus, a voltage drop is generated in accordance with a distance of the first conductive type region in a lower portion of the active layer adjacent to the insulation film. Thus, the equivalent electric potential lines extends in the vertical direction toward the first conductive type region, and therefore, the distance between the equivalent electric potential lines is compensated. Thus, the breakdown voltage is improved. Without forming concavity and convexity having a large depth, the breakdown voltage of the device is improved.

According to a third aspect of the present disclosure, a method for manufacturing a semiconductor device includes: preparing a silicon substrate having a first conductive type; forming a plurality of first conductive type regions and a plurality of second conductive type regions in a first surface portion of the silicon substrate in such a manner that the second conductive type regions include a center region, and the first conductive type regions and the second conductive type regions are alternately arranged to have a second layout around the center region; bonding the silicon substrate to a support substrate via an embedded insulation film in such a manner that the first surface portion of the silicon substrate faces the support substrate through the embedded insulation film; removing a part of a second surface portion of the silicon substrate so that the silicon substrate is thinned, and the silicon substrate provides an active layer, wherein the second surface portion is opposite to the first surface portion; forming a semiconductor element in the second surface portion of the silicon substrate. The semiconductor element includes a first impurity layer and a second impurity layer. The second impurity layer surrounds the first impurity layer, and the first impurity layer and the second impurity layer has a first layout, which corresponds to the second layout.

In the above method, the second conductive type regions sandwich the first conductive type region so that the second conductive type regions are spaced apart from each other by a predetermined distance. The first and second conductive type regions are disposed in the part of the active layer adjacent to the embedded insulation film and under the semiconductor element. Accordingly, a charge is induced to a part of the second conductive type regions adjacent to the insulation film. Specifically, no charge is induced to a part of the first conductive type regions adjacent to the insulation film. Thus, a reverse layer is localized in the part of the second conductive type regions. Accordingly, a pseudo field plate is formed. Thus, a voltage drop is generated in accordance with a distance of the first conductive type region in a lower portion of the active layer adjacent to the insulation film. Thus, the equivalent electric potential lines extends in the vertical direction toward the first conductive type region, and therefore, the distance between the equivalent electric potential lines is compensated. Thus, the breakdown voltage is improved. Without forming concavity and convexity having a large depth, the breakdown voltage of the device is improved.

According to a fourth aspect of the present disclosure, a semiconductor device includes: a SOI substrate having a support substrate, an embedded insulation film and an active layer, which are stacked in this order, wherein the active layer has a first conductive type; a first region having a first semiconductor element region and a first trench separation structure and disposed in the SOI substrate; a second region having a second semiconductor element region and a second trench separation structure and disposed in the SOI substrate. The first region is separated from the second region. The first trench separation structure surrounds an outer periphery of the first region, and the second trench separation structure surrounds an outer periphery of the second region. The first semiconductor element region includes a first semiconductor element. The first semiconductor element includes a first impurity layer, a second impurity layer, a first electrode and a second electrode. The first impurity layer and the second impurity layer are disposed in a surface portion of the active layer. Each of the first impurity layer and the second impurity layer has a stripe pattern along with one direction as a longitudinal direction. A first voltage is applicable to the first impurity layer via the first electrode, and a second voltage is applicable to the second impurity layer via the second electrode. The first voltage is higher than the second voltage. The first region further includes a plurality of electric potential control regions, which are disposed on both sides of the semiconductor element region along with the longitudinal direction. The electric potential control regions are arranged between the first impurity layer and the second impurity layer along with each side of the semiconductor element region. The first region further includes an electrode pattern, which is disposed on the semiconductor element region and the electric potential control regions. The electrode pattern extends from the first impurity layer to the second impurity layer. The electrode pattern is electrically coupled with each electric potential control region.

In the above device, the electric potential of the surface portion of the semiconductor element region is gradually reduced from the first impurity layer as a high potential side to the second impurity layer as a low potential side since the voltage drop is generated by the inner resistance of the electrode pattern. Further, the electric potential of each electric potential control region on the side of the semiconductor element region is reduced in a stepwise manner from the first impurity layer as a high potential side to the second impurity layer as a low potential side since the voltage drop is generated by the inner resistance of the electrode pattern. Accordingly, since the electric potential of the semiconductor element region from the first impurity layer to the second impurity layer is reduced, the electric potential of each electric potential control region disposed on the side of the semiconductor element region and the electric potential of the surface portion of the semiconductor element region are reduced. Accordingly, the electric field at both ends of the first and second impurity layers along with the longitudinal direction is restricted from concentrating. Thus, the breakdown voltage reduction is prevented. Further, the electric potential of each electric potential control region disposed on the side of the semiconductor element region can be controlled to be different from each other by using the electrode pattern. Accordingly, it is not necessary to form a control device such as a conventional dividing diode around the semiconductor element region. Accordingly, the dimensions of the device is reduced, and the electric field concentration at the periphery of the high breakdown voltage device is restricted. Thus, the device has a high breakdown voltage.

BRIEF DESCRIPTION OF THE DRAWINGS

The above and other objects, features and advantages of the present invention will become more apparent from the following detailed description made with reference to the accompanying drawings. In the drawings:

FIG. 38A is a diagram showing an upper layout of a trench separation structure in a semiconductor device according to a sixteenth embodiment, FIG. 38B is a diagram showing a cross sectional view of the device taken along line XXXVIIIB-XXXVIIIB in FIG. 38A, and FIG. 38C is a diagram showing a cross sectional view of the device taken along line XXXVIIIC-XXXVIIIC in FIG. 38A;

FIG. 39A is a diagram showing an upper layout of a trench separation structure in a semiconductor device according to a seventeenth embodiment, FIG. 39B is a diagram showing a cross sectional view of the device taken along line XXXIXB-XXXIXB in FIG. 39A, and FIG. 39C is a diagram showing a cross sectional view of the device taken along line XXXIXC-XXXIXC in FIG. 39A;

DETAILED DESCRIPTION OF THE PREFERRED EMBODIMENTS

First Embodiment

Figure 1:
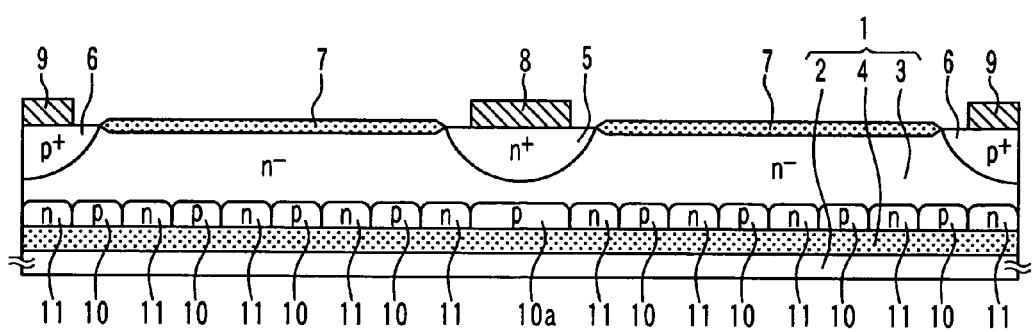
FIG. 1 is a diagram showing a cross sectional view of a semiconductor device according to a first embodiment.
Figure 2A:
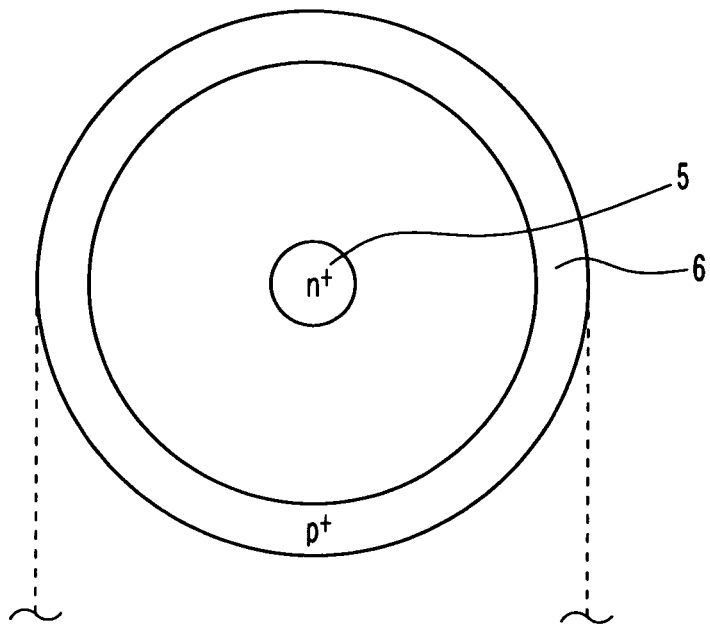
FIG. 2A is a diagram showing a layout of a top surface of the device in FIG. 1.
Figure 2B:
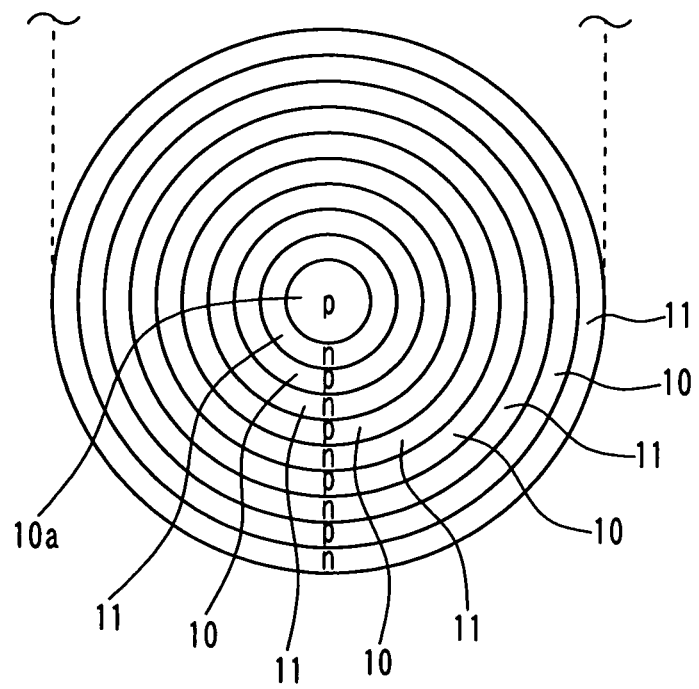
FIG. 2B is a diagram showing a layout of a backside surface of the device in FIG. 1.

First embodiment will be explained. In the first embodiment, a semiconductor device has a lateral PN diode as a semiconductor element. FIG. 1 shows a cross sectional view of the semiconductor device. FIGS. 2A and 2B are a top surface layout and a backside surface layout of the device.

As shown in FIG. 1, the device is formed from a SOI substrate 1. The substrate 1 is prepared such that a support substrate 2 made of a silicon substrate and an active layer 3 are bonded to each other via an embedded insulation film 4. The embedded insulation film 4 is made of an oxide film or the like. The active layer 3 is prepared such that a N− type silicon substrate is thinned. The active layer 3 is divided into multiple element separation regions by an element separation structure. The PN diode is formed in one element separation region surrounded with the element separation structure.

The thickness of the active layer 3 is, for example, 5 to 25 micrometers. A N+ type cathode region 5 as a first impurity layer made of a diffusion layer and a P+ type anode region 6 as a second impurity layer made of a diffusion layer are formed in a surface portion of the active layer 3. The cathode region 5 has a N type impurity concentration in a range between $1\times10^{19}$ cm$^{-3}$ and $1\times10^{21}$ cm$^{-3}$, and a junction depth in a range between 0.1 micrometers and 0.5 micrometers. The anode region 6 has a N type impurity concentration in a range between $1\times10^{19}$ cm$^{-3}$ and $1\times10^{21}$ cm$^{-3}$, and a junction depth in a range between 0.1 micrometers and 1.0 micrometers. As shown in FIG. 2A, the cathode region 5 and the anode region 6 has an upper layout such that the anode region 6 surrounds the cathode region 5 as a center, the cathode region 5 has a circular shape, and the cathode region 5 is spaced a part from the anode region 6 by a predetermined distance.

A LOCOS oxide film 7 is formed in a surface portion of the active layer 3 between the cathode region 5 and the anode region 6. A cathode electrode 8 is spaced apart from the LOCOS oxide film 7, and formed on the cathode region 5. The cathode electrode 8 is electrically coupled with the cathode region 5. A anode electrode is spaced apart from the LOCOS oxide film 7, and formed on the anode region 6. The anode electrode 9 is electrically coupled with the anode region 6. Thus, the active layer 3, the cathode region 5, the anode region 6, the cathode electrode 8 and the anode electrode 9 provide a lateral PN diode.

As shown in FIG. 2B, the P type regions 10 and the N type regions 11 have a backside layout such that one of the P type regions 10 has a circular shape and provides a center region 10a, the N type regions 11 and the P type regions 10 surround the center region 10a alternately and concentrically. The P type regions 10 and the N type regions 11 have the same junction depth from the insulation film 4. The junction depth is in a range between 1.0 micrometers and 10 micrometers.

The P type region 10 has a P type impurity concentration in a range between $1\times10^{15}$ cm$^{-3}$ and $1\times10^{19}$ cm$^{-3}$. The N type region 11 has a N type impurity concentration in a range between $1\times10^{15}$ cm$^{-3}$ and $1\times10^{19}$ cm$^{-3}$.

Thus, the semiconductor device is prepared. In the device, the P type regions 10 having a ring shape and the N type regions 11 having a ring shape are alternately arranged to surround the center region 10a having the circular shape. The P type regions 10 and the N type regions 11 are disposed in the active layer 3 under the semiconductor element, i.e., the PN diode. Thus, the following effects and functions are obtained.

When a high voltage is applied to the cathode electrode 8, and the anode electrode 9 and the support substrate 2 are grounded, a positive charge is induced to a part of the P type regions 10 adjacent to the insulation film 4. The positive charge is not induced to a part of the N type regions 11 adjacent to the insulation film 4 since the impurity concentration of the N type regions 11 is sufficiently large so that the N type regions 11 do not provide an inversion layer. Thus, the inversion layer is localized in the part of the P type regions 10 other than the N type regions 11. Thus, a pseudo field plate is formed so that homogeneous voltage drop corresponding to the distance between the P type regions 10 is caused between the cathode region 5 and the anode region 6 in a lower portion of the active layer 3.

When only the N type regions 11 are formed, a depletion layer from the N type regions 11 does not sufficiently expand, so that a RESURF (reduced surface field) effect is not obtained, and the breakdown voltage may not be improved. In this embodiment, since the P type regions 10 are formed in addition to the N type regions 11, the depletion layer sufficiently expands, and therefore, the breakdown voltage is improved.

Figure 3A:
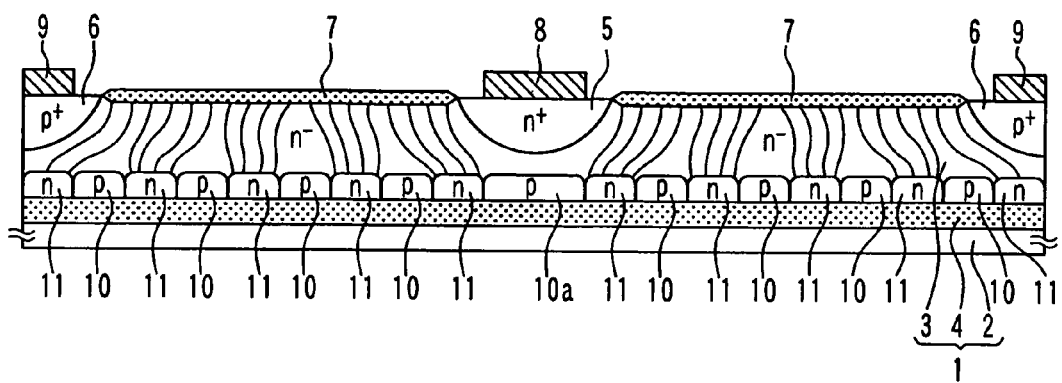
FIG. 3A is a diagram showing an equivalent electric potential distribution in the device in FIG. 1.
Figure 3B:
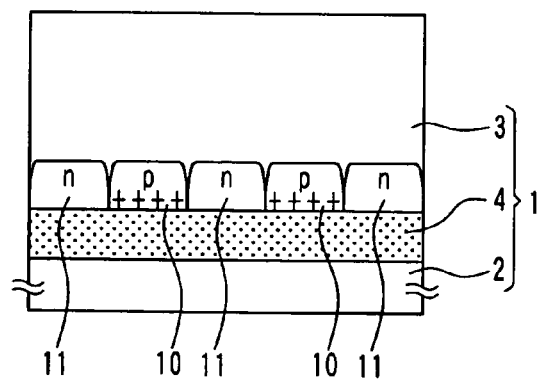
FIG. 3B is a diagram showing a state that a charge is induced.

The above features are also confirmed by an equivalent electric potential distribution in the semiconductor device. FIG. 3A shows the equivalent electric potential distribution of the device when a high voltage is applied to the cathode electrode 8 of the ON diode, and the anode electrode 9 and the support substrate 2 are grounded. FIG. 3B is a partially enlarged cross sectional view of the device when a charge is induced.

As shown in FIG. 3B, the charge is induced to a part of the P type region 10 adjacent to the insulation film 4. Accordingly, the P type region 10 and the N type region 11 provide a pseudo field plate. Thus, as shown in FIG. 3A, the equivalent electric potential line extends toward the N type region. 11 along with the vertical direction. Thus, similar to a conventional art that provides the embedded insulation film having the concavity and convexity, the distance between adjacent equivalent electric potential lines is improved, so that the breakdown voltage is improved.

In the device according to the present embodiment, the P type region 10 and the N type region 11 are disposed in the active layer 3 near the insulation film 4 under the semiconductor element. Thus, the breakdown voltage is improved, and therefore, the device has sufficient breakdown voltage even if the device has not convexity and concavity structure with a deep concavity.

The manufacturing method of the device according to the present embodiment will be explained. FIGS. 4A to 4D shows the manufacturing process of the device.

Figure 4A:
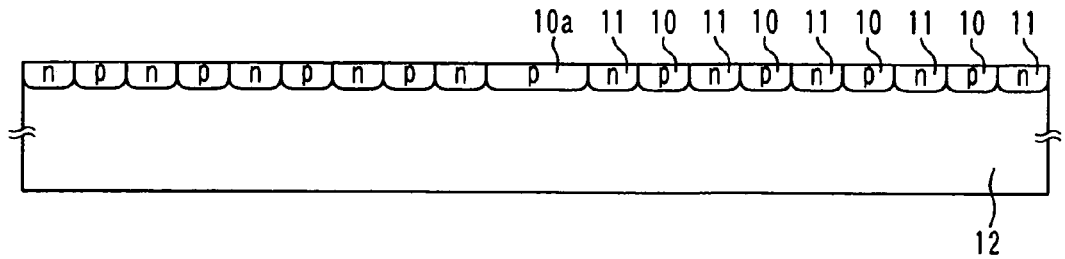
FIGS. 4A to 4D are diagrams showing a manufacturing process of the device in FIG. 1.

<Step in FIG. 4A>

First, a silicon substrate 12 having a N− conductive type for forming the active layer 3 is prepared. A mask (not shown) is formed on the surface of the silicon substrate 12 by a photo etching method. The mask has an opening corresponding to a P type region to-be-formed region. Then, a P conductive type impurity is implanted on the substrate 12 through the mask. After than, the mask is removed, another mask (not shown) is formed on the surface of the silicon substrate 12 by the photo etching method. The other mask has an opening corresponding to the N type region to-be-formed region. Then, a N conductive type impurity is implanted on the substrate through the other mask. After the other mask is removed, the implanted P conductive type impurity and the implanted N conductive type impurity are diffused by a thermal diffusion method. Thus, the P type regions 10 and the N type regions 11 are formed.

The height of each of the P type regions 10 and the N type regions 11, i.e., the distance between the insulation film 4 and a top end of the P type regions 10 and the N type regions 11, is determined by a diffusion amount of the impurities in the thermal diffusion process. In the thermal diffusion process, the height of the P type region 10 is equal to or lower than the height of the N type region 11. If the height of the P type region 10 is higher than the height of the N type region 11, and the adjacent P type regions 10 overlap each other over the N type region 11 therebetween, the pseudo field plate may not function. To prevent this feature, the height of the P type region 10 and the height of the N type region 11 are determined.

Figure 4B:
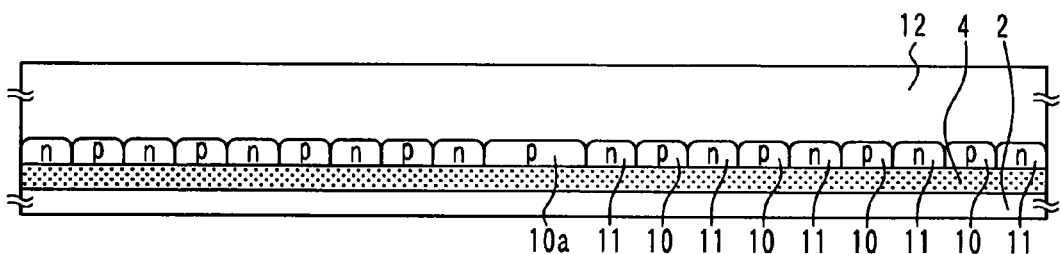

<Step in FIG. 4B>

After the P type regions 10 and the N type regions 11 are formed in the substrate 12, the support substrate 2 made of a silicon substrate is bonded to the substrate 12 via the insulation film 4. Thus, the SOI substrate 1 is formed.

Figure 4C:
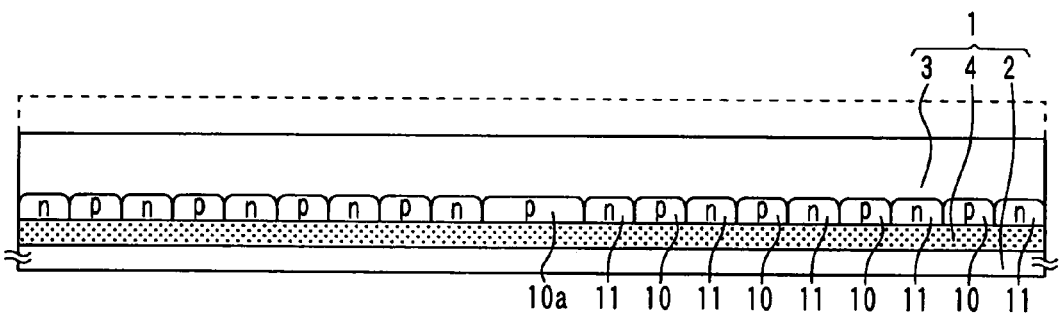

<Step in FIG. 4C>

The surface of the silicon substrate 12 in the SOI substrate 1 is partially removed by a polishing method or the like so that the SOI substrate 1 is thinned. Then, the surface of the SOI substrate 1 is polished by a CMP (chemical mechanical polishing) method or the like. Thus, the active layer 3 is formed from the silicon substrate 12 in the SOI substrate 1.

Figure 4D:
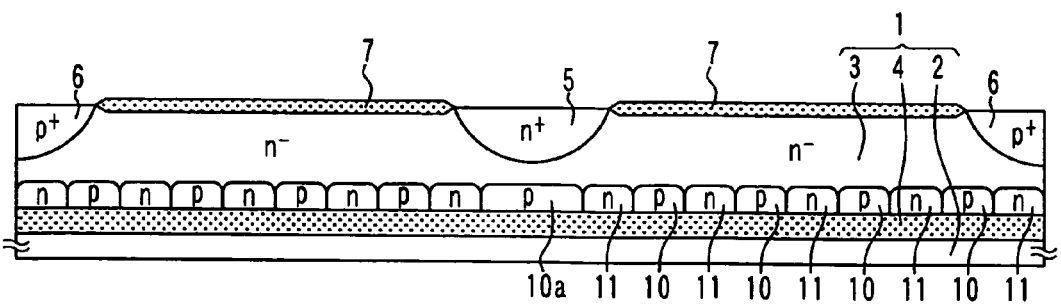

<Step in FIG. 4D>

The surface of the active layer 3 is oxidized by a LOCOS oxidation method or the like, so that the LOCOS oxide film 7 is formed. The LOCOS oxide film 7 has an opening corresponding to a cathode region to-be-formed region and an anode region to-be-formed region. Then, a mask (not shown) is formed on the surface of the SOI substrate 1 by the photo etching method. The mask has an opening corresponding to the cathode region to-be-formed region. The N conductive type impurity is implanted on the substrate 1 through the mask. After the mask is removed, another mask (not shown) is formed on the surface of the SOI substrate 1. The other mask has an opening corresponding to the anode region to-be-formed region. Then, the p conductive type impurity is implanted on the surface of the SOI substrate 1 through the other mask. After the other mask is removed, the implanted P conductive impurity and the implanted N conductive impurity are diffused by the thermal diffusion method. Thus, the cathode region 5 and the anode region 6 are formed.

Then, a step for forming an interlayer insulation film, a step for forming the cathode electrode 8 and the anode electrode 9, a step for forming a protection film and the like (which are not shown in the drawings) are performed, so that the semiconductor device shown in FIG. 1 is manufactured.

A wire retrieving structure for the semiconductor device may be any structure. It is preferred that the wire retrieving structure is an layout structure shown in FIG. 5.

In the present embodiment, the cathode region 5 is surrounded with the anode region 6. In such a structure, a pad for electrically connecting between the cathode electrode 8 and an external circuit may be formed only on the cathode region 5. In this case, an area of the pad is small. Here, the cathode electrode 8 is electrically connected to the cathode region 5.

Figure 5:
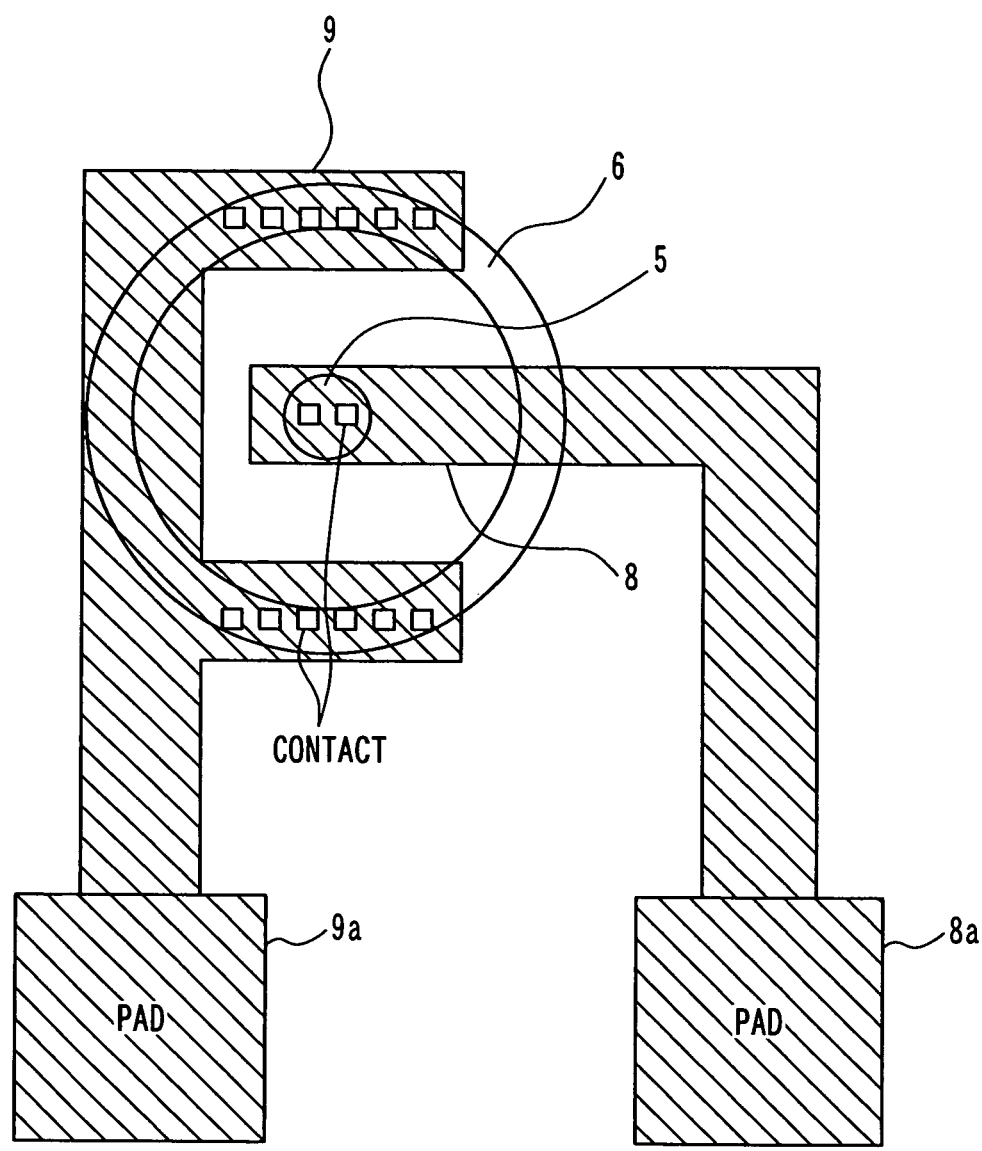
FIG. 5 is a diagram showing a layout of a wire retrieving structure of the device in FIG. 1.

Accordingly, it is preferred that the wire retrieving structure is the layout structure shown in FIG. 5. A contact portion between the anode electrode 9 and the anode region 6 has a C shape. The cathode electrode 8 is retrieved from the inside of the C shape of the anode electrode 9 to the outside of the C shape. Specifically, the anode electrode 9 is not formed on a whole of the anode region 6. Instead, the contact portion of the anode electrode 9 is divided to an upper portion and a lower portion of the anode region 6. The anode electrode 9 and the cathode electrode 8 are retrieved to the outside of the diode forming region. Thus, the anode electrode 9 and the cathode electrode 8 are connected to an anode pad 9a and a cathode pad 8a, respectively.

In the above structure, the cathode pad 8a is not formed only on the cathode region 5. Thus, an area of the cathode pad 8a is sufficiently large.

Second Embodiment

A second embodiment will be explained.

Figure 6:
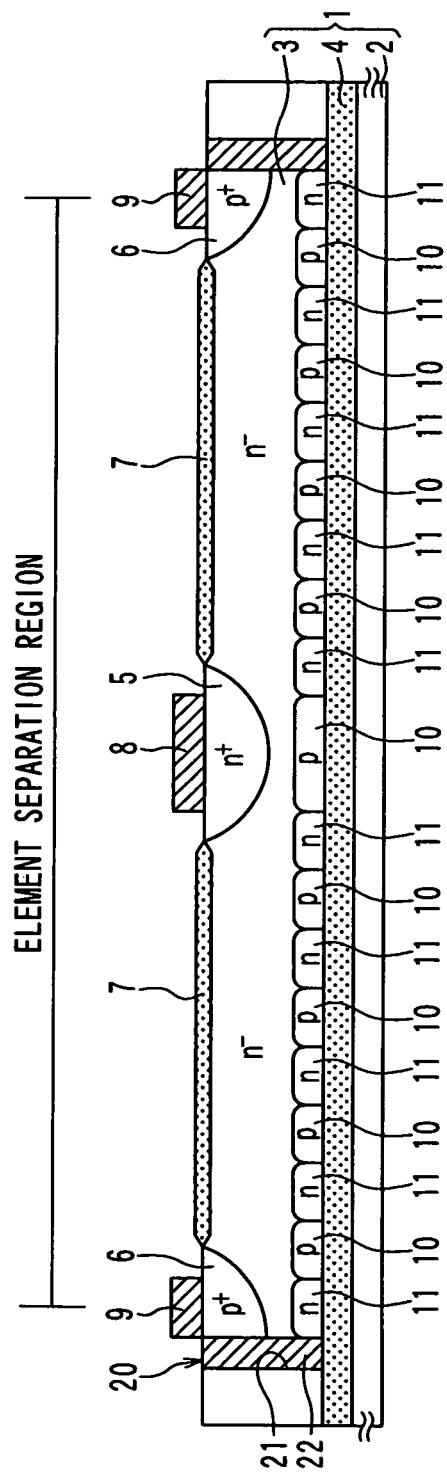
FIG. 6 is a diagram showing a cross sectional view of a semiconductor device according to a second embodiment.
Figure 7A:
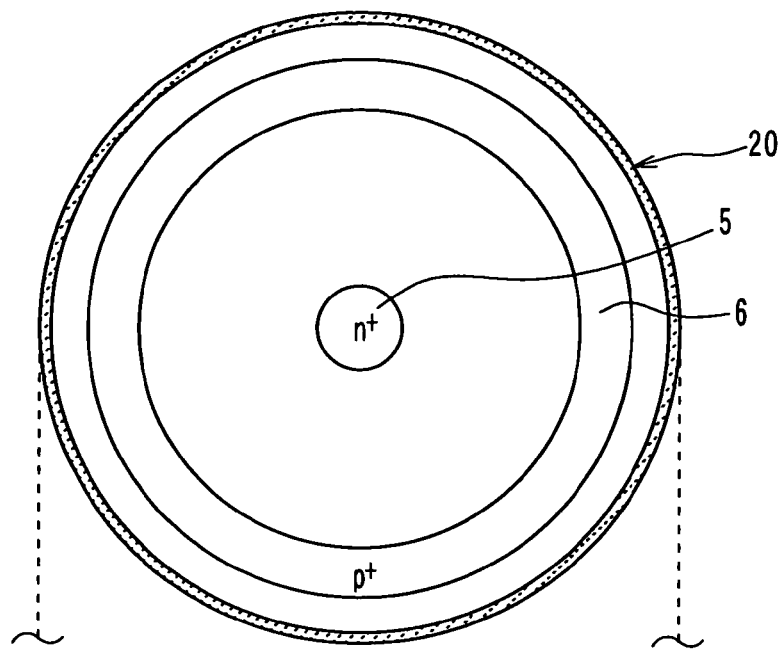
FIG. 7A is a diagram showing a layout of a top surface of the device in FIG. 6.
Figure 7B:
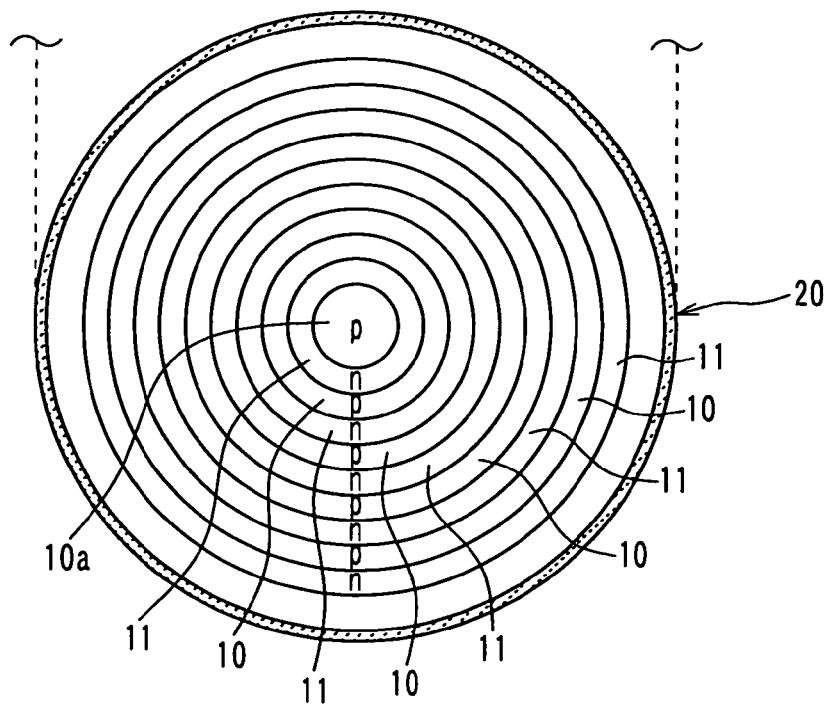
FIG. 7B is a diagram showing a layout of a backside surface of the device in FIG. 6.

FIG. 6 shows a semiconductor device according to the present embodiment. FIGS. 7A and 7B show an layout view and a lower layout view of the device. In the device, a trench separation structure 20 for surrounding the outer periphery of the anode region 6 is formed. The trench separation structure 20 includes a groove 21 and an insulation film 22. The groove 21 is formed on the surface of the active layer 3, and reaches the embedded insulation film 4. The insulation film 22 is filled in the groove 21. For example, a mask formed by the photo etching method is used for etching the active layer 3 so that the groove 21 is formed. Then, the insulation film 22 is filled in the groove 21 such that a thermal oxidation process is performed, or an insulation material is deposited in the groove 21. Thus, the insulation material is filled in the groove 21. Thus, the trench separation structure 20 is formed.

The trench separation structure 20 surrounds the semiconductor element such as the PN diode. The semiconductor element is separated from other elements, which are formed in other regions of the active layer 3. Thus, even when the PN diode is integrated with the other element such as a circuit element, for example, a logic circuit into one chip, the high voltage influence is not affected on the circuit element. Thus, it is easy to form the one chip device having the PN diode and the circuit element.

Third Embodiment

A third embodiment will be explained.

Figure 8:
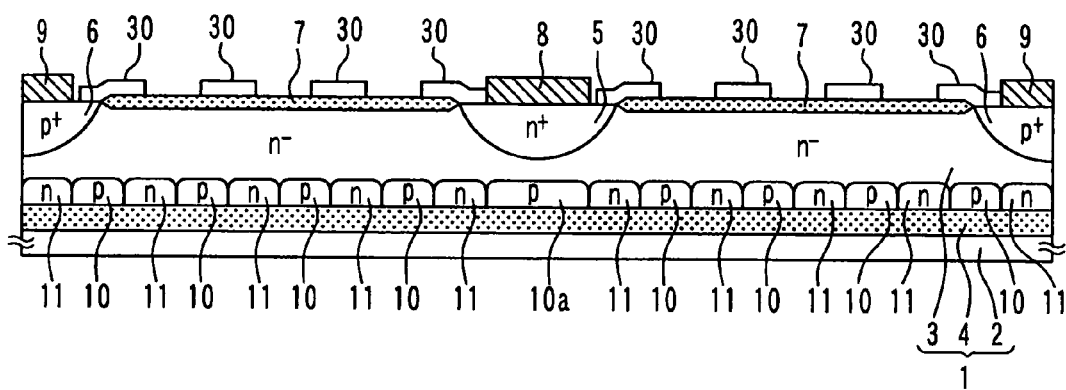
FIG. 8 is a diagram showing a cross sectional view of a semiconductor device according to a third embodiment.
Figure 9A:
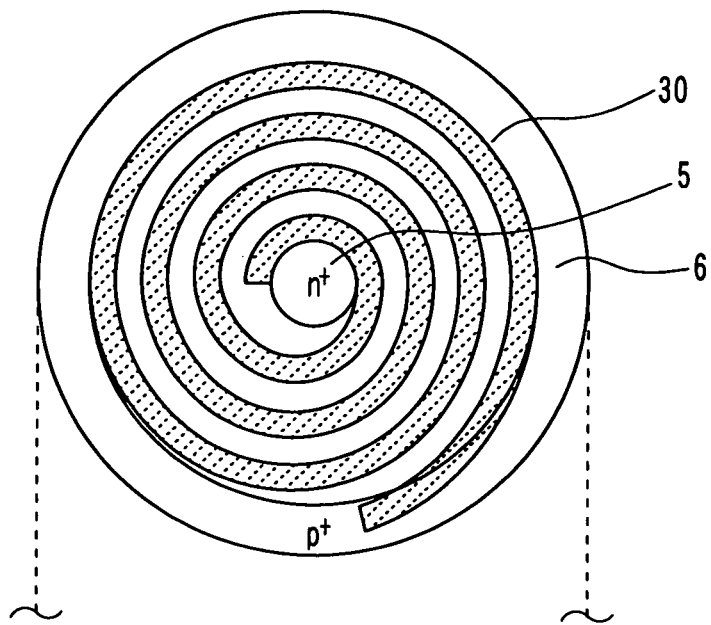
FIG. 9A is a diagram showing a layout of a top surface of the device in FIG. 8.
Figure 9B:
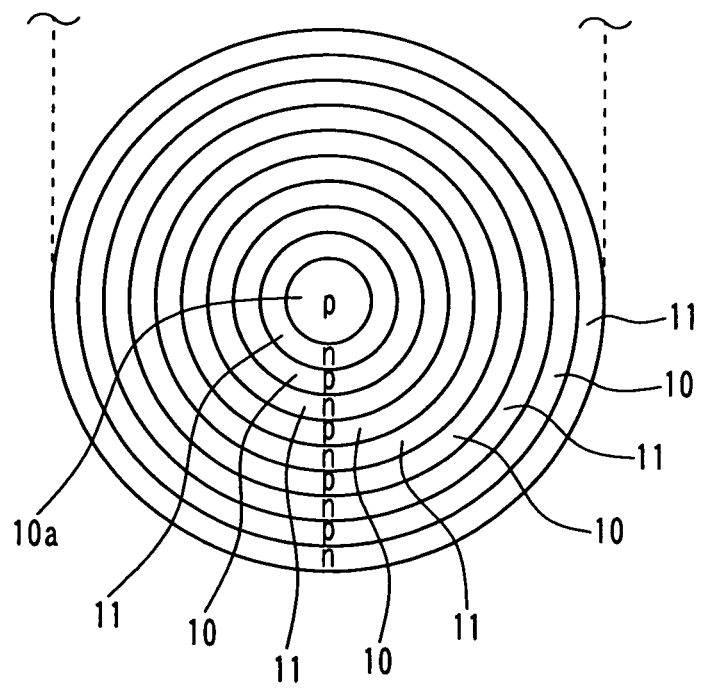
FIG. 9B is a diagram showing a layout of a backside surface of the device in FIG. 8.

FIG. 8 shows a semiconductor device according to the present embodiment. FIGS. 9A and 9b show an upper layout view and a lower layout view of the semiconductor device. In the semiconductor device, a resistance type field plate 30 is formed on the PN diode via a LOCOS oxide film 7. The resistance type field plate 30 is made of, for example, a high resistance layer such as non-doped poly silicon. The resistance type field plate 30 extends in a spiral manner around the cathode region 5 as a center, and reaches the anode region 6.

In the resistance type field plate 30, a voltage drop according to the distance of the high resistance layer is generated between the cathode region 5 having the high electric potential and the anode region 6. The voltage drop is caused by an inner resistance of the high resistance layer. Accordingly, the voltage drops proportionally along with the radial direction around the cathode region 5 as the center in accordance with the distance from the cathode region 5.

Thus, the device includes the PN junction structure in a lower portion of the active layer 3 and further includes the resistance type field plate 30 on the active layer 3, so that the width of the equivalent electric potential lines extending in the vertical direction toward the N type region from the surface of the active layer 3 is much uniformed when the high voltage is applied to the cathode electrode 8 in the PN diode, and the anode electrode 9 and the support substrate 2 are grounded. Accordingly, the distance between the equivalent electric potential lines is much compensated, so that the breakdown voltage is improved.

The manufacturing method of the semiconductor device having the above structure is almost similar to that of the device in FIG. 1, and further includes a step for forming the resistance type field plate 30. For example, in the step for forming the resistance type field plate 30, after the cathode region 5 and the anode region 6 are formed, the high resistance layer is deposited on the surface of the LOCOS oxide film 7. Further, the high resistance layer is patterned so that the resistance type field plate 30 is formed. After that, the step for forming the interlayer insulation film, the step for forming the electrode and the step for forming the protection film are performed. Thus, the semiconductor device is manufactured.

Fourth Embodiment

A fourth embodiment will be explained.

Figure 10:
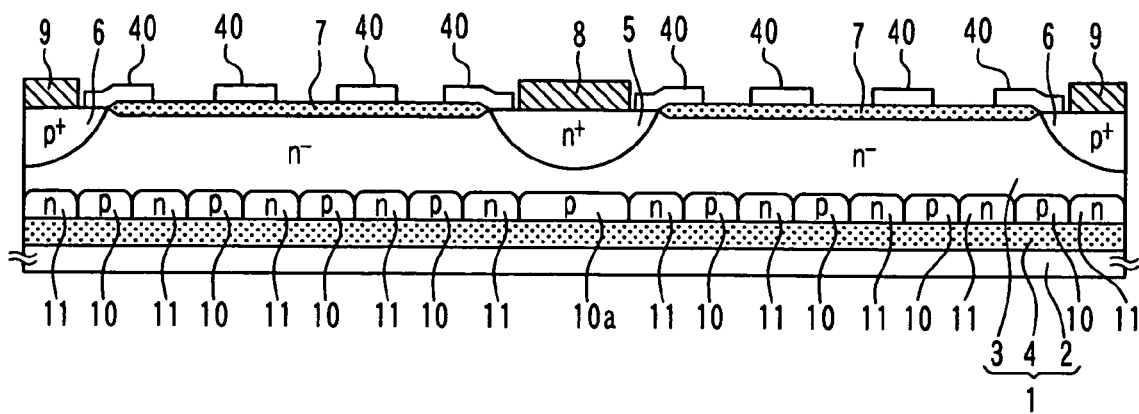
FIG. 10 is a diagram showing a cross sectional view of a semiconductor device according to a fourth embodiment.
Figure 11A:
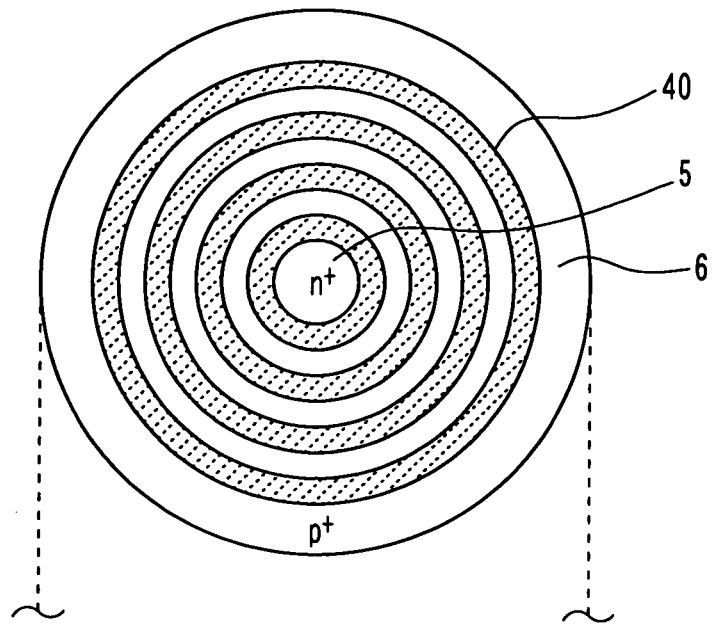
FIG. 11A is a diagram showing a layout of a top surface of the device in FIG. 10.
Figure 11B:
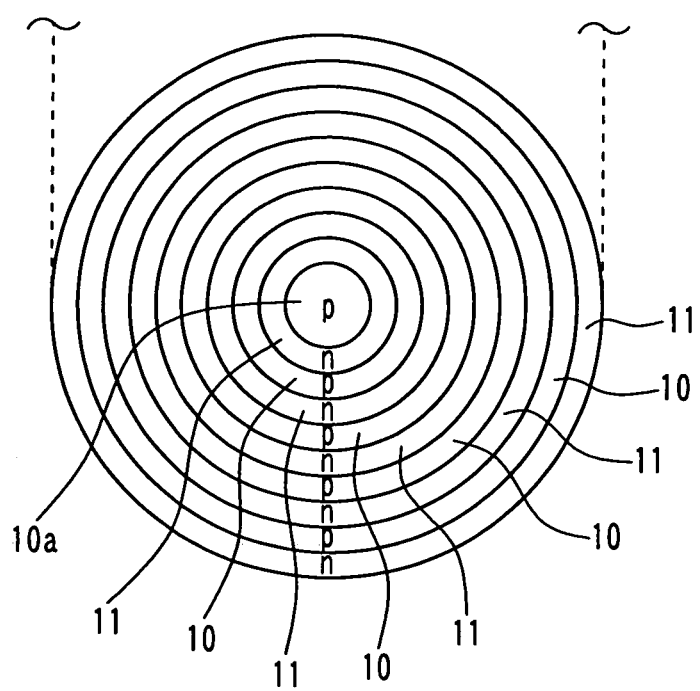
FIG. 11B is a diagram showing a layout of a backside surface of the device in FIG. 10.

FIG. 10 shows a semiconductor device according to the present embodiment. FIGS. 11A and 11B show an upper layout view and a lower layout view of the semiconductor device in FIG. 10. In the semiconductor device, a capacitive field plate 40 is formed on the PN diode via the LOCOS oxide film 7. The capacitive field plate 40 is made of a high resistance layer such as non-doped poly silicon. The capacitive field plate 40 includes multiple ring shaped high resistance layers, which are concentrically arranged at regular intervals around the cathode region 5 between the cathode region 5 and the anode region 6.

In the capacitive field plate 40, a voltage drop according to a capacitance between the high resistance layers is generated between the cathode region 5 having a high voltage and the anode region 6. Thus, the voltage drops proportionally along with the radial direction around the cathode region 5 as the center in accordance with the distance from the cathode region 5.

Thus, the device includes the PN junction structure in a lower portion of the active layer 3 and further includes the capacitive field plate 40 on the active layer 3, so that the width of the equivalent electric potential lines extending in the vertical direction toward the N type region from the surface of the active layer 3 is much uniformed when the high voltage is applied to the cathode electrode 8 in the PN diode, and the anode electrode 9 and the support substrate 2 are grounded. Accordingly, the distance between the equivalent electric potential lines is much compensated, so that the breakdown voltage is improved.

The manufacturing method of the semiconductor device having the above structure is almost similar to that of the device in FIG. 1, and further includes a step for forming the capacitive field plate 40. For example, in the step for forming the capacitive field plate 40, after the cathode region 5 and the anode region 6 are formed, the high resistance layer is deposited on the surface of the LOCOS oxide film 7. Further, the high resistance layer is patterned so that the capacitive field plate 40 is formed. After that, the step for forming the interlayer insulation film, the step for forming the electrode and the step for forming the protection film are performed. Thus, the semiconductor device is manufactured.

Fifth Embodiment

A fifth embodiment will be explained.

Figure 12:
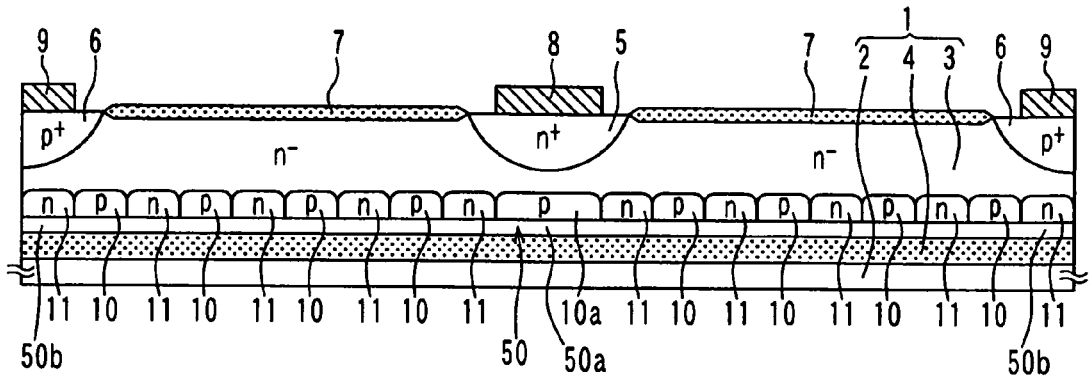
FIG. 12 is a diagram showing a cross sectional view of a semiconductor device according to a fifth embodiment.

FIG. 12 shows a semiconductor device according to the present embodiment. In FIG. 12, a SIPOS (semi-insulating poly crystalline silicon) film 50 is formed between the embedded insulation film 4 and the active layer 3 in the SOI substrate 1. The SIPOS film 50 functions as a semi-insulating layer, i.e., a high resistance layer. A voltage drop is generated proportionally in accordance with the distance in a lower portion of the active layer 3 between the cathode region 5 having the high voltage and the anode region 6 having the low voltage. The voltage drop is caused by the inner resistance of the SIPOS film 50. Accordingly, the width of the equivalent electric potential lines extending in the vertical direction toward the N type region from the surface of the active layer 3 is much uniformed when the high voltage is applied to the cathode electrode 8 in the PN diode, and the anode electrode 9 and the support substrate 2 are grounded. Accordingly, the distance between the equivalent electric potential lines is much compensated, so that the breakdown voltage is improved.

When the device includes the SIPOS film 50, current leakage may occur. However, when the device includes the SIPOS film 50, a voltage drop amount between the cathode region 5 and a portion 50a of the SIPOS film 50 just under the cathode region 5 is larger than a voltage drop amount between the cathode region 5 and a portion of the center region 10a in a case where the device does not include the SIPOS film 50. Further, a voltage drop amount between the anode region 6 and a portion 50b of the SIPOS film 50 just under the anode region 6 is larger than a voltage drop amount between the cathode region 5 and a portion of the N type region 11 just under the anode region 6 in a case where the device does not include the SIPOS film 50. Accordingly, a potential difference between the portion 50a of the SIPOS film 50 just under the cathode region 5 and the portion 50b of the SIPOS film 50 just under the anode region 6 is small. Thus, current leakage between the portion 50a of the SIPOS film 50 just under the cathode region 5 and the portion 50b of the SIPOS film 50 just under the anode region 6 is prevented from occurring.

Sixth Embodiment

A sixth embodiment will be explained.

Figure 13:
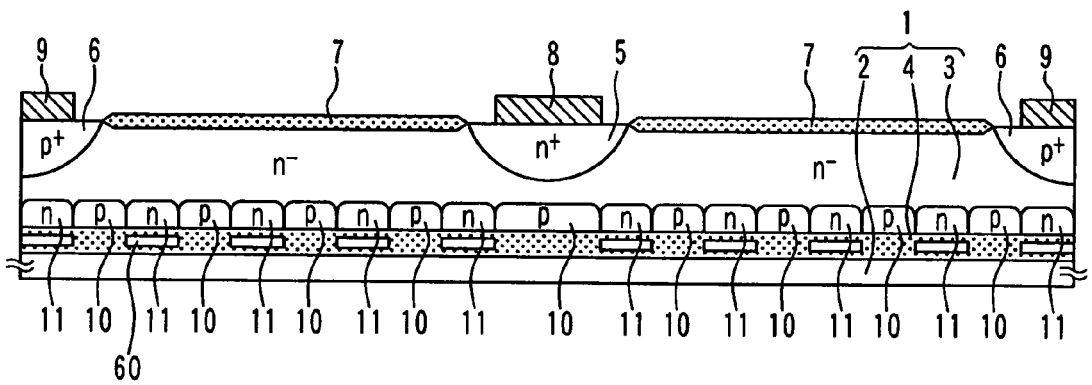
FIG. 13 is a diagram showing a cross sectional view of a semiconductor device according to a sixth embodiment.

FIG. 13 shows a semiconductor device according to the present embodiment. In the present embodiment, the device includes a charge accumulation layer 60 in the insulation film 4. The charge accumulation layer 60 accumulates a positive charge. The charge accumulation layer 60 is disposed under the N type region 11 to face the N type region 11 via the insulation film 4. Specifically, the charge accumulation layer 60 is concentrically arranged to have multiple ring shape corresponding to the N type region 11.

When the device includes the charge accumulation layer 60, a negative charge is induced to a lower portion of the N type region 11. The negative charge is caused by the positive charge accumulated in the charge accumulation layer 60. Thus, the positive charge is prevented from being induced to the lower portion of the N type region 11. Thus, the positive charge is induced to only the P type region 10. Thus, the width of the equivalent electric potential lines extending in the vertical direction toward the N type region from the surface of the active layer 3 is much uniformed when the high voltage is applied to the cathode electrode 8 in the PN diode, and the anode electrode 9 and the support substrate 2 are grounded. Accordingly, the distance between the equivalent electric potential lines is much compensated, so that the breakdown voltage is improved.

A difference between a manufacturing method of the semiconductor device having the above structure and the device in FIG. 1 is a step for forming the embedded insulation film 4 and the charge accumulation layer 60 and a step for accumulating the charge in the charge accumulation layer 60. Other steps are the same. The step for forming the embedded insulation film 4 and the charge accumulation layer 60 includes: a step for thinning a part of the insulation film 4 on the surface of the silicon substrate 12, in which the P type region 10 and the N type region 11 are formed; a step for forming the charge accumulation layer 60 by patterning a poly silicon film formed on the insulation film 4; and a step for forming an upper portion of the insulation film 4 to cover the surface of the charge accumulation layer 60. The step for forming the upper portion of the insulation film 4 may include a flattening step if necessary. Then, after the silicon substrate 12 is bonded to the support substrate 2 via the insulation film 4, the silicon substrate 12 is thinned. Then, the cathode region 5 and the anode region 6 are formed. After that, the step for accumulating the charge is performed. In the step for accumulating the charge, when the high voltage is applied to the cathode region 5 so that the reverse bias is provided, avalanche breakdown occurs. Thus, a hot carrier generated in the N type region 11 is injected into the charge accumulation layer 60 via the insulation film 4 between the charge accumulation layer 60 and the active layer 3. Thus, the positive charge is accumulated in the charge accumulation layer 60. Thus, the semiconductor device having the above structure is completed.

Seventh Embodiment

A seventh embodiment will be explained.

Figure 14:
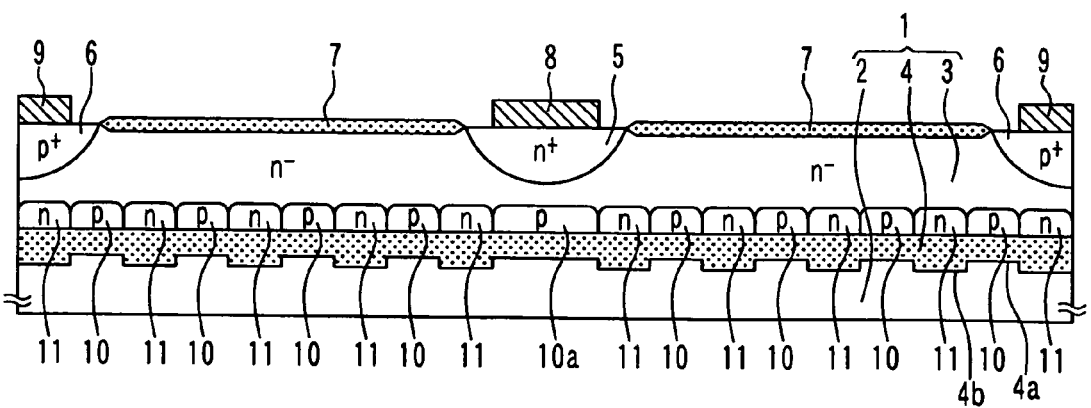
FIG. 14 is a diagram showing a cross sectional view of a semiconductor device according to a seventh embodiment.

FIG. 14 shows a semiconductor device according to the present embodiment. In FIG. 14, a concavity and convexity are formed on the surface of the insulation film 4 on the support substrate side. Specifically, the concavity is formed on the surface of the support substrate 2 by a photo etching method. The insulation film 4 is formed to fill the concavity so that the concavity 4a of the insulation film 4 is formed on the convexity of the support substrate 2, and the convexity 4b of the insulation film 4 is formed on the concavity of the support substrate 2. In this case, the concavity 4a of the insulation film 4 faces the P type region 10, and the convexity 4b of the insulation film 4 faces the N type region 11. Then, the insulation film 4 is flattened if necessary. The silicon substrate 12, in which the P type region 10 and the N type region 11 are formed, is bonded to the support substrate 2 via the insulation film 4. Thus, the SOI substrate 1 includes the insulation film 4 having the concavity and convexity.

In the semiconductor device having the above structure, the thickness of the insulation film 4 corresponding to the convexity 4b is thick. Accordingly, when the high voltage is applied to the cathode electrode 8 in the PN diode, and the anode electrode 9 and the support substrate 2 are grounded, the negative charge is easily induced to the part of the support substrate corresponding to the concavity 4a of the insulation film 4 since the thickness of the insulation film 4 is thin. However, it is difficult to induce the negative charge to the part of the support substrate corresponding to the convexity 4b of the insulation film 4 since the thickness of the insulation film 4 is thick. Accordingly, the negative charge is localized at the part of the support substrate 2 corresponding to the concavity 4a of the insulation film 4, the part of the support substrate 2 being adjacent to the insulation film 4.

Thus, it is difficult to induce the positive charge in the N type region 11, which faces the convexity 4b of the insulation film 4. The width of the equivalent electric potential lines extending in the vertical direction toward the N type region from the surface of the active layer 3 is much uniformed when the high voltage is applied to the cathode electrode 8 in the PN diode, and the anode electrode 9 and the support substrate 2 are grounded. Accordingly, the distance between the equivalent electric potential lines is much compensated, so that the breakdown voltage is improved.

A step for forming the concavity and convexity on the insulation film 4 is necessitated. However, since the breakdown improvement structure is provided by the PN junction structure having the P type region 10 and the N type region 11, the concavity and the convexity on the insulation film 4 may be smaller than a conventional concavity and convexity. Thus, even when the concavity and convexity are formed on the insulation film 4, the manufacturing process is not complicated.

Eighth Embodiment

An eighth embodiment will be explained.

Figure 15:
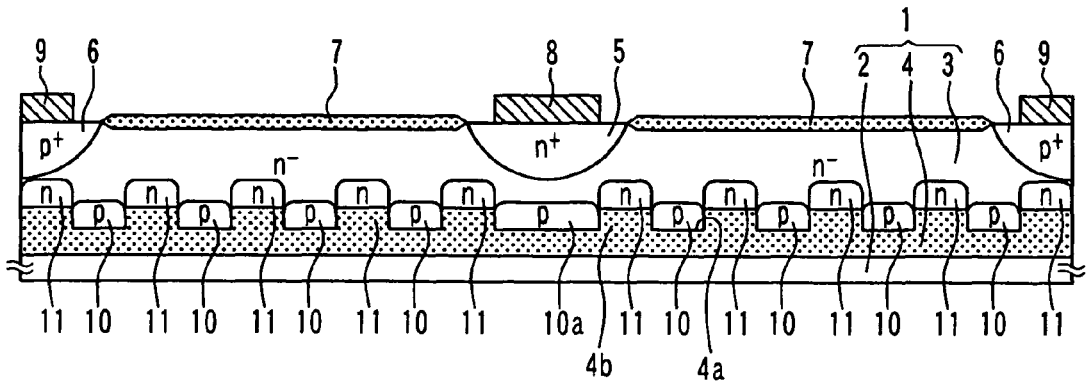
FIG. 15 is a diagram showing a cross sectional view of a semiconductor device according to an eighth embodiment.

FIG. 15 shows a semiconductor device according to the present embodiment. In FIG. 15, the surface of the insulation film 4 on the active layer side has a convexity and concavity. Specifically, the concavity 4a of the insulation film 4 concaves with respect to the surface of the active layer 3. The convexity 4b of the insulation film 4 protrudes toward the surface of the active layer 3. The P type region 10 is arranged in the concavity 4a, and the N type region 11 is arranged on the convexity 4b.

In the above structure, the thickness between the N type region 11 and the support substrate 2 is larger than the thickness between the P type region 10 and the support substrate 2. Accordingly, when the high voltage is applied to the cathode electrode 8 in the PN diode, and the anode electrode 9 and the support substrate 2 are grounded, it is further difficult to induce the positive charge to the part of the N type region 11 adjacent to the insulation film 4. Thus, the width of the equivalent electric potential lines extending in the vertical direction toward the N type region from the surface of the active layer 3 is much uniformed when the high voltage is applied to the cathode electrode 8 in the PN diode, and the anode electrode 9 and the support substrate 2 are grounded. Accordingly, the distance between the equivalent electric potential lines is much compensated, so that the breakdown voltage is improved.

A difference between the manufacturing method of the device according to the present embodiment and the method of the device in FIG. 1 is a step for forming the concavity and convexity on the insulation film 4 and a step for adjusting an ion implantation energy so as to deepen the junction depth of the N type region 11 according to the height of the convexity 4b. Other steps are similar to the first embodiment. For example, the step for forming the concavity and convexity on the insulation film 4 is performed as follows. First, the P type region 10 and the N type region 11 are formed in the active layer 3 of the silicon substrate 12. Then, the concavity is formed on the surface of the substrate 12 by the photo etching method. The insulation film 4 is formed to fill the concavity. Thus, the concavity 4a of the insulation film 4 is formed to correspond to the convexity of the substrate 12, and the convexity 4b of the insulation film 4 is formed to correspond to the concavity of the substrate 12.

A step for forming the concavity and convexity on the insulation film 4 is necessitated. However, since the breakdown improvement structure is provided by the PN junction structure having the P type region 10 and the N type region 11, the concavity and the convexity on the insulation film 4 may be smaller than a conventional concavity and convexity. Thus, even when the concavity and convexity are formed on the insulation film 4, the manufacturing process is not complicated.

Other Embodiments

Figure 16:
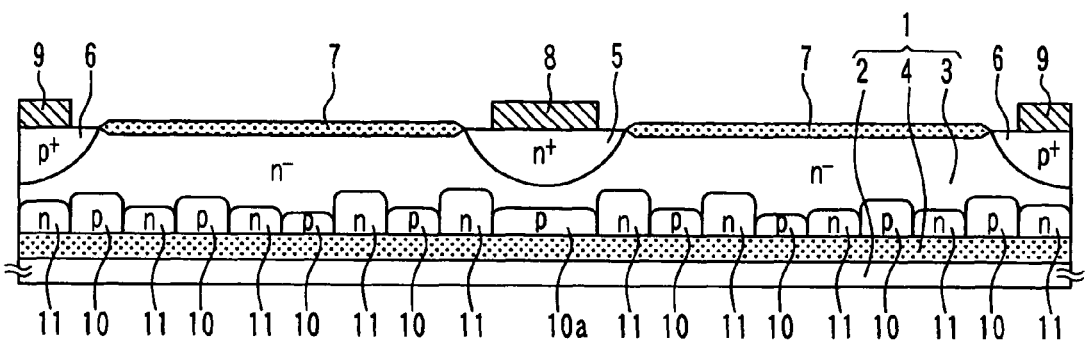
FIG. 16 is a diagram showing a cross sectional view of a semiconductor device according to other embodiments.

In the above embodiments, the heights of the P type regions 10 are same, and the heights of the N type regions 11 are same. However, the heights of the P type regions 10 and the heights of the N type regions 11 may be different. For example, as shown in FIG. 16, the heights of the P type regions 10 and the N type regions 11 are different, i.e., unequal. This semiconductor device is formed with using multiple masks by implanting ions multiple.

Figure 17:
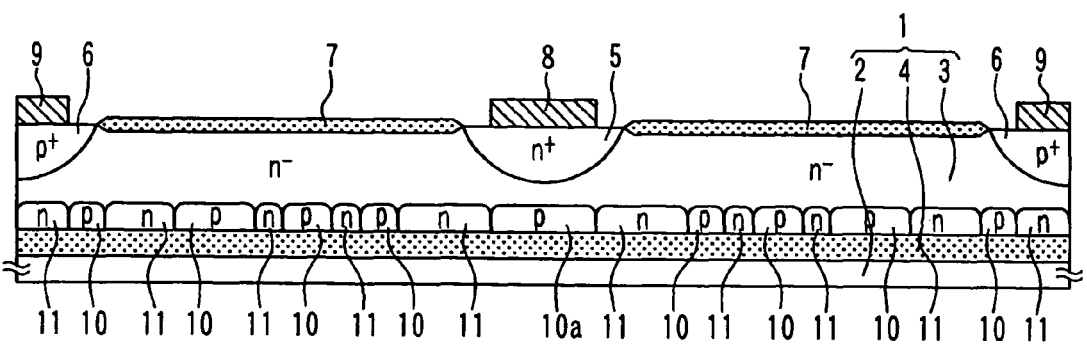
FIG. 17 is a diagram showing a cross sectional view of a semiconductor device according to other embodiments.

In the above embodiments, the widths of the P type regions 10 are same, and the widths of the N type regions 11 are same. However, the widths of the P type regions 10 and the widths of the N type regions 11 may be different. For example, as shown in FIG. 17, the widths of the P type regions 10 and the N type regions 11 are different, i.e., unequal. This semiconductor device is formed with using a mask having unequal openings in case of forming the P type regions 10 and a mask having unequal openings in case of forming the N type regions 11.

In the above embodiments, the impurity concentrations of the P type regions 10 are same, and the impurity concentrations of the N type regions 11 are same. However, the impurity concentrations of the P type regions 10 and the N type regions 11 may be different. This semiconductor device is formed with using multiple masks by implanting ions multiple with different concentrations.

Figure 18:
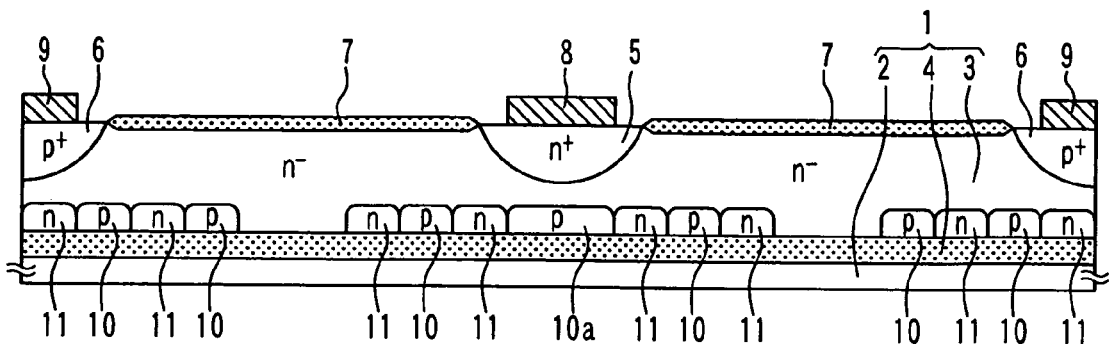
FIG. 18 is a diagram showing a cross sectional view of a semiconductor device according to other embodiments.

In the above embodiments, the P type regions 10 and the N type regions are arranged in a whole area from the cathode region 5 to the anode region 6. However, the P type regions 10 and the N type regions 11 may be arranged in a part of the area from the cathode region 5 to the anode region 6. For example, as shown in FIG. 18, there is no P type region 10 and no N type region 11 in a part of the area from the cathode region 5 to the anode region 6.

In the first embodiment, the mask for forming the P type regions 10 is different from the mask for forming the N type regions 11. One of the P type regions and the N type regions may be formed without a mask. For example, the ion is implanted on the surface of the silicon substrate 12 without a mask so as to form the N type regions 11, and the ions is implanted on the surface of the substrate with using the mask so as to form the p type regions 10. In the step of diffusing ions, the conductive type of a part of the substrate 1, at which the P conductive type ions are implanted, is reversed so that the P type regions 10 are formed. Further, the N type regions, 11 are formed at another part of the substrate 1, at which no P conductive type ion is implanted.

Similarly, the silicon substrate 12 may be prepared such that the impurity concentration in the substrate 12 has gradient, and the N conductive type impurity concentration in the part of the substrate 12 on the insulation film side is larger than that in the other parts of the substrate 12. In this case, the step for implanting ions in order to form the N type regions 10 is not necessary.

In the above embodiments, the semiconductor device includes the PN diode as the semiconductor element. The semiconductor device may include other semiconductor elements. Specifically, the semiconductor element may have the upper layout with the circular shape, and the PN junction structure with the P type regions 10 and the N type regions 11 is concentrically arranged so as to have the lower layout.

Figure 19:
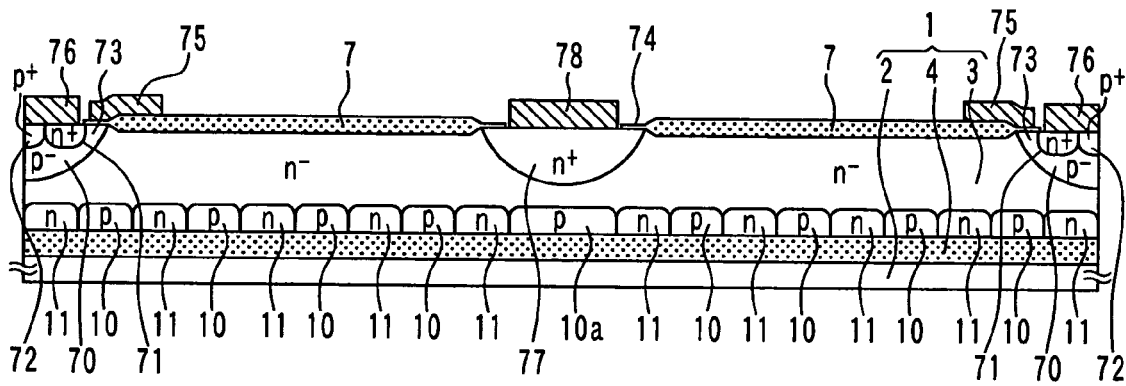
FIG. 19 is a diagram showing a cross sectional view of a semiconductor device having a LDMOS element according to other embodiments.

FIG. 19 shows a semiconductor device having a LDMOS element as the semiconductor element. A P− type channel layer 70 is formed in a surface portion of the active layer 3. Further, a N+ type source region 71 as the second impurity layer and a P+ type contact region 72 as the first impurity layer are formed in a surface portion of the channel layer 70. A channel region 73 is provided by a part of the channel layer 70 between the source region 71 and the active layer 3. A gate electrode 75 is arranged on the channel region 73 via a gate insulation film 74. A source electrode 76 is formed on the source region 71 and the contact region 72. The source electrode 76 is electrically coupled with the source region 71 and the contact region 72.

A N+ type drain region 77 is formed in a surface portion of the active layer 3 such that the drain region 77 has a layout with a circular shape, and is separated from the P− type channel layer 70 via the LOCOS oxide film 7. The drain electrode 78 is formed on the drain region 77 so that the drain electrode 78 is electrically coupled with the drain region 77. The P− type channel layer 70, the N+ type source region 71, the P+ type contact region 72 are arranged to have a ring shape so that they surround the drain region 77 and the drain electrode 78. An interlayer insulation film (not shown) and a protection film (not shown) are formed in the substrate 12. Thus, the LDMOS element is formed.

In the semiconductor device having the LDMOS element, the PN junction structure having the P type regions 10 and the n type regions 11 are formed in a part of the active layer 3, which is adjacent to the insulation film 4. The PN junction structure surrounds the center region 10a corresponding to the drain region 77. In this case, the effects similar to the above embodiments are obtained. Here, FIG. 19 shows the semiconductor device having the LDMOS element, which is similar to the device in FIG. 1. Alternatively, the semiconductor devices according to the second to eighth embodiments may include the LDMOS element.

Figure 20:
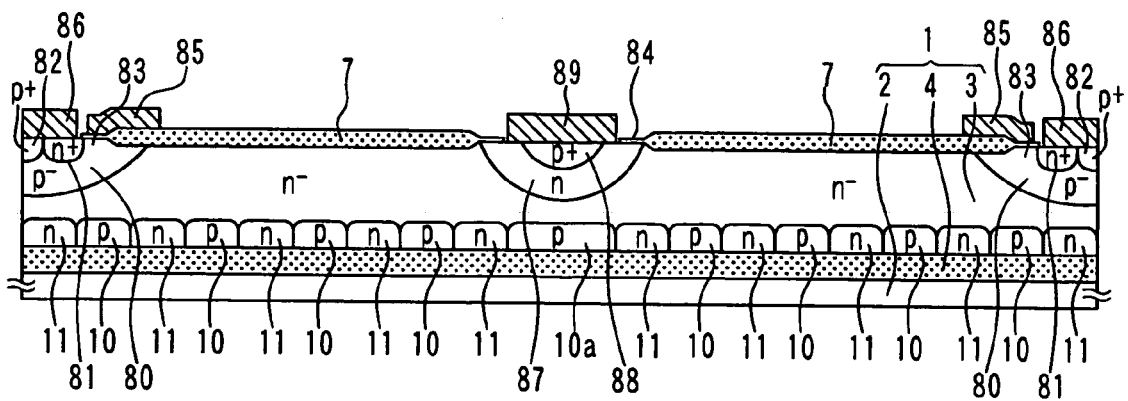
FIG. 20 is a diagram showing a cross sectional view of a semiconductor device having a IGBT according to other embodiments.

FIG. 20 shows a semiconductor device having an IGBT as the semiconductor element. A P− type base region 80 is formed in a surface portion of the active layer 3. A N+ type emitter region 81 as the second impurity layer and a P+ type contact region 82 as the first impurity layer are formed in a surface portion of the base region 80. A channel region 83 is provided by a part of the base region 80, which is disposed between the N+ type emitter region 81 and the active layer 3. A gate electrode 85 is formed on the channel region 83 via a gate insulation film 84. An emitter electrode 86 is arranged on the N+ type emitter region 81 and the P+ type contact region 82. The emitter electrode 86 is electrically coupled with the emitter region 81 and the contact region 82.

A N+ buffer layer 87 is formed in a surface portion of the active layer 3 such that the buffer layer 87 is separated from the base region 80 with the LOCOS oxide film 7, and the buffer layer 87 has a circular shaped layout. A P+ type collector region 88 is formed in a surface portion of the buffer layer 87. A collector electrode 89 is formed on the collector region 88 so that the collector electrode 89 is electrically coupled with the collector region 88. The base region 80, the emitter region 81, the contact region 82 and the like have a ring shaped layout so that they surround the buffer layer 87, the collector region 88 and the collector electrode 89. An interlayer insulation film (not shown) and a protection film (not shown) are formed in the substrate 12. Thus, the IGBT is formed.

In the semiconductor device having the IGBT, the PN junction structure having the P type regions 10 and the n type regions 11 are formed in a part of the active layer 3, which is adjacent to the insulation film 4. The PN junction structure surrounds the center region 10a corresponding to the collector region 88. In this case, the effects similar to the above embodiments are obtained. Here, FIG. 20 shows the semiconductor device having the IGBT, which is similar to the device in FIG. 1. Alternatively, the semiconductor devices according to the second to eighth embodiments may include the IGBT.

In the above embodiments, the semiconductor element has the upper layout with the circular shape, and the PN junction structure has the lower layout with the concentrically arranged P type regions 10 and the N type regions 11. The shape of the upper layout of the semiconductor element and the shape of the lower layout of the PN junction structure may be different from the circular shape and the concentrically arranged structure. Specifically, as long as the second impurity layer such as the anode region 6, the source region 71 and the emitter region 81 surrounds the first impurity layer such as the cathode region 5, the drain region 77 and the collector region 88 as the center, the effects of the above embodiments are obtained. The second impurity layer surrounds the first impurity layer in a radial manner.

For example, the first impurity layer as the center may have a regular polygonal shape with a sharp corner, or a regular polygonal shape with a rounded corner. For example, the first impurity layer may have a regular hexagonal shape. Alternatively, the first impurity layer may have an ellipsoid shape or a rectangular shape. The second impurity layer surrounds the first impurity layer. The PN junction structure having the P type regions 10 and the N type regions 11 may have a lower layout in a radial manner corresponding to the semiconductor element. Specifically, the PN junction may have a ring shape, a regular polygonal shape, an ellipsoid shape, a rectangular shape or the like with a center having a circular shape, a regular polygonal shape, an ellipsoid shape, the rectangular shape or the like so that the p type regions 10 and the N type regions 11 are alternately arranged. Thus, the effects of the above embodiments are obtained.

Figure 21:
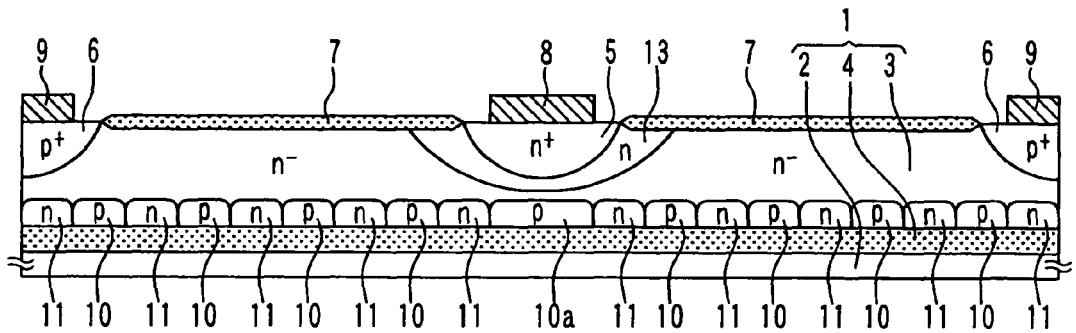
FIG. 21 is a diagram showing a cross sectional view of a semiconductor device according to other embodiments.
Figure 22:
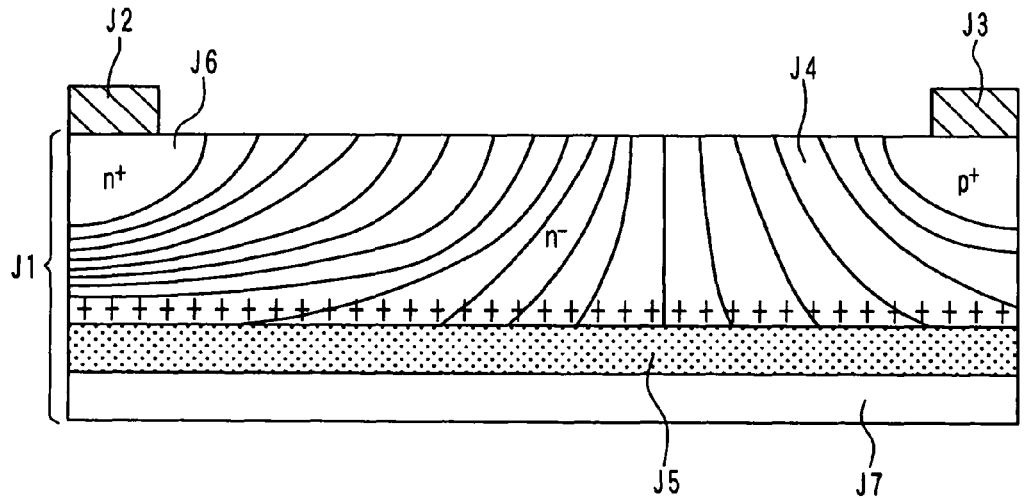
FIG. 22 is a diagram showing an equivalent electric potential distribution in a semiconductor device having a lateral PN diode, which is formed in a SOI substrate.
Figure 23:
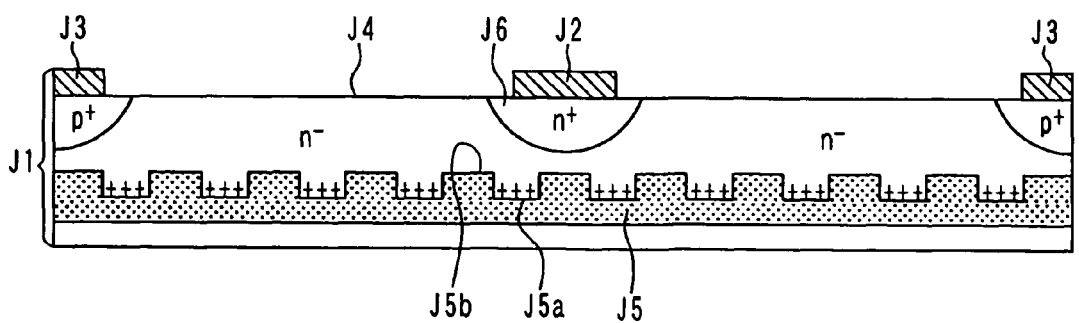
FIG. 23 is a diagram showing a semiconductor device having an insulation film, on which concavities and convexities are formed.

In the above embodiments, the device includes the PN diode. Alternatively, the device may include other structure. For example, as shown in FIG. 21, a N type electric field relaxation layer 13 surrounds the cathode region 5 so that the high electric field applied to the cathode region 5 is reduced in a case of breakdown. The electric field relaxation layer 13 has a depth in a range between 1 micrometer and 10 micrometers, and a surface concentration in a range between $1\times10^{16}$ cm$^{-3}$ and $1\times10^{18}$ cm$^{-3}$.

The above embodiments may be combined. For example, the trench separation structure 20 according to the second embodiment may be incorporated into the device according to the third to eighth embodiments and other embodiments. The resistance type field plate 30 or the capacitive field plate 40 according to the third and fourth embodiments may be may be incorporated into the device according to the fifth to eighth embodiments and other embodiments. The SIPOS film 50 according to the fifth embodiment may be incorporated into the device according to the seventh to eighth embodiments and other embodiments. In the above embodiments, the first conductive type is the N conductive type, and the second conductive type is the P conductive type. Alternatively, the first conductive type may be the P conductive type, and the second conductive type may be the N conductive type.

Further, for example, before the substrate 12 is bonded to the support substrate 2, a mark for positioning is formed on a surface of the substrate 12, which is opposite to the pseudo field plate. The positioning is performed with using the mark. Thus, the pseudo field plate provided by the P type regions 10 and the N type regions 11, which are alternately arranged, is formed. In this case, when the semiconductor element is manufactured, and the semiconductor element has the structure such that the first impurity layer such as the cathode region 5, the drain region 77 and the collector region 88 and the second impurity layer such as the anode region 6, the source region 71 and the emitter region 81 have the upper layout in a radial manner so that the second impurity layer surrounds the first impurity layer, the positioning between the upper layout and the pseudo field plate may be easily performed with using the mark.

The device according to the first embodiment has the layout structure having the wire retrieving structure shown in FIG. 5. Alternatively, the device according to the second to eighth embodiments and other embodiments may have the wire retrieving structure shown in FIG. 5.

In the above embodiments, the substrate is made of silicon. Alternatively, the substrate may be made of SiC.

Ninth Embodiment

Figure 24:
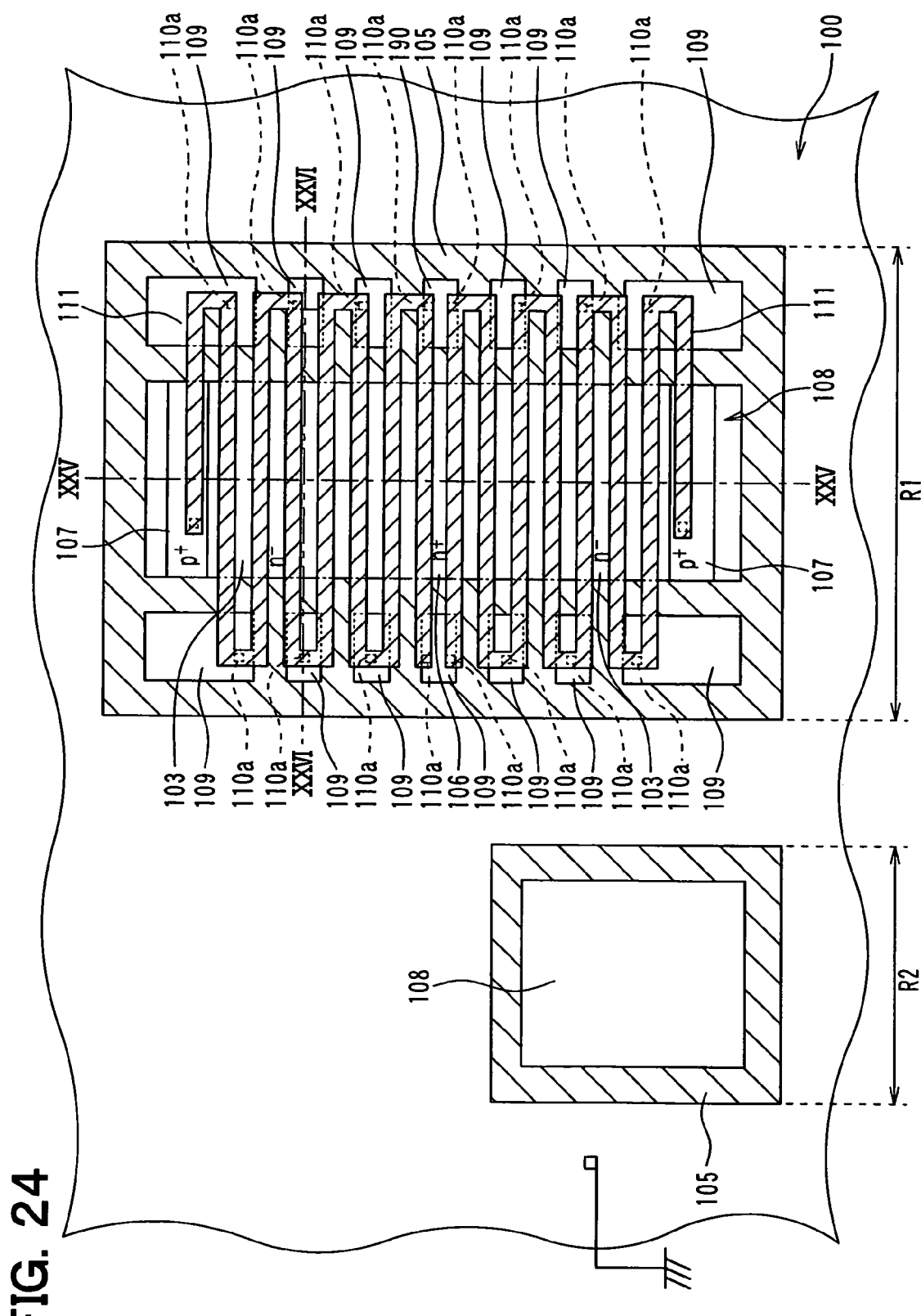
FIG. 24 is a diagram showing an upper layout of a semiconductor device according to a ninth embodiment.
Figure 25:
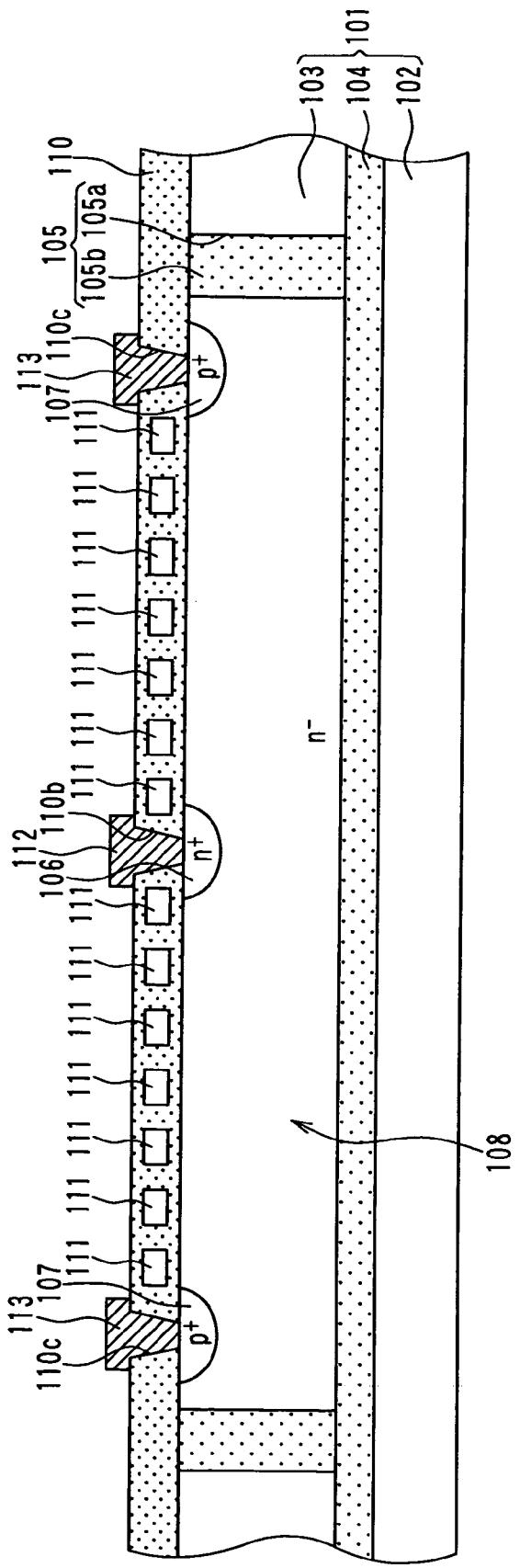
FIG. 25 is a diagram showing a cross sectional view of the device taken along line XXV-XXV in FIG. 24.
Figure 26:
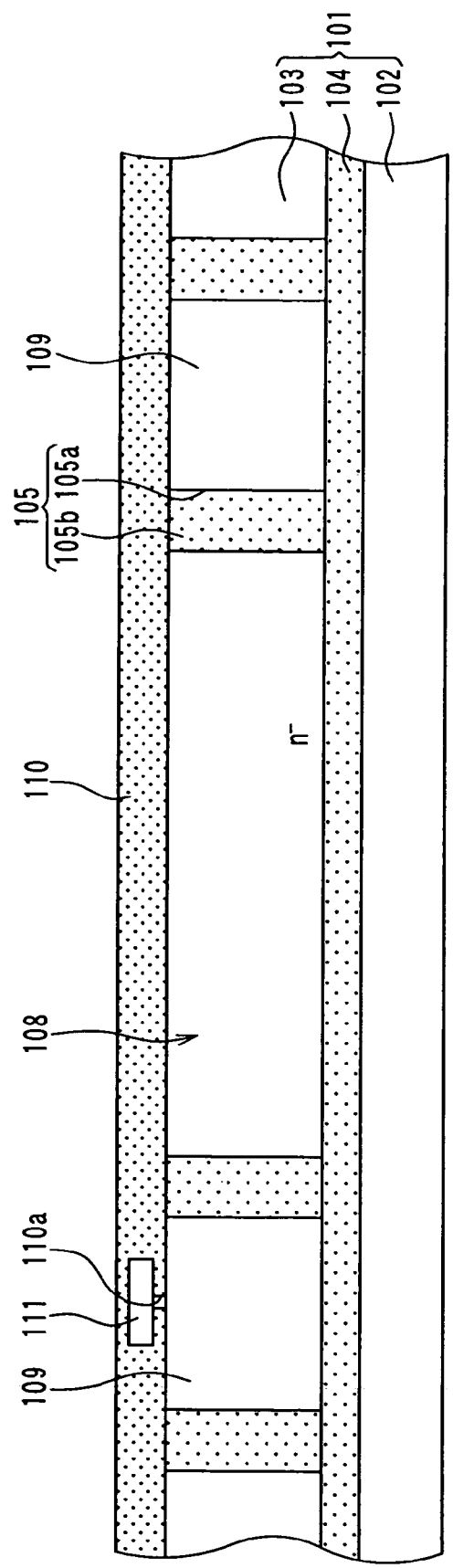
FIG. 26 is a diagram showing a cross sectional view of the device taken along line XXVI-XXVI in FIG. 24.

A ninth embodiment will be explained. A semiconductor device according to the ninth embodiment includes a lateral PN diode. FIGS. 24-26 show the device. Although FIG. 24 is not a cross sectional view, a hatching is drawn for convenience.

An element forming region such as a PN diode forming region R1 and an other element forming region R2 is integrated into one chip. Specifically, as shown in FIG. 25, the semiconductor device includes a SOI substrate 101. The SOI substrate 101 is prepared such that a support substrate 102 made of a silicon substrate is bonded to an active layer 103 via an embedded insulation film 104. The active layer 103 is formed by thinning a N− type silicon substrate. The insulation film 104 is made of an oxide film.

The semiconductor element is formed in the active layer 103. The thickness of the active layer 103 is for example in a range between 102 micrometers and 25 micrometers. The trench separation structure 105 formed in the active layer 103 separates the PN diode forming region R1 from the other element forming region R2. The trench separation structure 105 includes a groove 105a and an insulation film 105b. The groove 105a is formed on the surface of the active layer 103 and reaches the insulation film 104. The insulation film 105b is embedded in the groove 105a. The trench separation structure 105 surrounds at least an outer circumference of the PN diode forming region R1, and further, the trench separation structure 105 surrounds at least an outer circumference of the other element forming region R2. The active layer 103 in an outside region of the trench separation structure 105 is fixed to a low impedance region. For example, the active layer 103 other than the PN diode forming region R1 and the other element forming region R2 is grounded. Thus, voltage interference between the PN diode forming region R1 and the other element forming region R2 is restricted.

A N+ type cathode region 106 as a first impurity layer and a P+ type anode region 107 as a second impurity layer are formed in a surface portion of the active layer 103. The cathode region 106 and the anode region 107 are made of a diffusion layer. For example, the cathode region 106 has a N type impurity concentration in a range between $1\times10^{18}$ cm$^{-3}$ and $1\times10^{20}$ cm$^{-3}$ and a junction depth in a range between 0.1 micrometers and 1.0 micrometer. The anode region 107 has a P type impurity concentration in a range between $1 \times 10^{18}$ cm$^{-3}$ and $1 \times 10^{20}$ cm$^{-3}$ and a junction depth in a range between 0.2 micrometers and 2.0 micrometer.

The cathode region 106 and the anode region 107 have a reed shape, i.e., a rectangular shape. As shown in FIG. 24, one cathode region 106 provides a center, and two anode regions 107 are arranged on each side of the center. One of the anode regions 107 is spaced apart from the cathode region 106 by a predetermined distance. Thus, the cathode region 106 and the anode regions 107 provide a stripe shape. The active layer 103 surrounding the cathode region 106 and the anode region 107 has a rectangular shape layout. This active layer 103 provides a semiconductor element region 108, in which the PN diode is arranged. The trench separation structure 105 surrounds the semiconductor element region 108.

The trench separation structure 105 has an inner sidewall, which is disposed on a long side of the rectangular shape of the semiconductor element region 108. The structure 105 further includes multiple portions, which extend from the inner sidewall in a vertical direction. Furthermore, the structure 105 includes a pair of outer sidewalls, which sandwich the semiconductor element region 8 and the multiple portions. The outer sidewall faces the inner sidewall, and the multiple portions are disposed between the outer and inner sidewalls. Thus, multiple regions, each of which is surrounded with the trench separation structure 5, are disposed adjacent to the long side of the semiconductor element region 108. The multiple regions provide electric potential control regions 109. The electric potential control regions 109 are arranged to have line symmetry with respect to a center line passing through a center of the PN diode forming region R1 along a right-left direction of the drawing (i.e., the center line passing through the cathode region 106) and another center line along a top-bottom direction of the drawing.

An interlayer insulation film 110 is formed on the surface of the active layer 103. An electrode pattern 111 for controlling electric potentials are embedded in the interlayer insulation film 110. The electrode pattern 111 is arranged to have line symmetry with respect to the center line passing through the diode forming region R1 along the right-left direction of the drawing. The electrode pattern 111 has a line shape from the cathode region 106 on the high voltage side to the anode region 107 on the low voltage side. Further, the electrode pattern 111 is arranged to have a meander shape so as to have sufficient length between the cathode region 106 and the anode region 107 and further to pass multiple electric potential control regions 109 disposed on both sides of the PN diode. Specifically, the electrode pattern 111 includes a parallel portion and a vertical portion. The parallel portion extends in parallel to the right-left direction of the drawing, i.e., the longitudinal direction of the cathode region 106 and the anode region 107. The vertical portion is perpendicular to the parallel portion. The parallel portion extends to reach the electric potential control regions 109 on both sides of the semiconductor element region 108. The vertical portion connects between two adjacent parallel portions disposed on upper and lower sides of the vertical portion at ends of the parallel portions.

As shown in FIGS. 25 and 26, a part of the interlayer insulation film 110 is disposed between the electrode pattern 111 and the active layer 103. A contact hole 110a is formed partially in the interlayer insulation film 110. A predetermined part of the electrode pattern 111 is electrically coupled with a predetermined part of the active layer 103 via the contact hole 10a. Other parts of the electrode pattern 111 is electrically separated from other parts of the active layer 103.

Specifically, the predetermined part of the electrode pattern 111 disposed on the electric potential control region side is electrically coupled with the predetermined part of the active layer 103 via the contact hole 10a. Further, the electric potential control regions 109 are electrically coupled with each other via the electrode pattern 111, and the potential difference between the electric potential control regions 109 is generated by the inner resistance of the electrode pattern 111. Accordingly, the vertical portions of the electrode pattern 111 between the cathode region 106 and the anode region 107 are only connected to the electric potential control regions 109, which are disposed on one side of the semiconductor element region 108. Thus, the vertical portions of the electrode pattern 111 are not connected to both of the electric potential control regions 109, which are disposed on both sides of the semiconductor element region 108. Thus, a length of a part of the electrode pattern 111 is sufficient long, the part generating the high potential difference. The electrode pattern 111 is covered with another part of the interlayer insulation film 110.

Further, contact holes 110b, 100c are formed in the interlayer insulation film 110 at positions corresponding to the cathode region 106 and the anode region 107. The cathode electrode 112 as the first electrode is coupled with the cathode region 106 via the contact hole 110b, and the anode electrode 113 as the second electrode is coupled with the anode region 107 via the contact hole 110c.

The semiconductor device having the PN diode has the above structure. In the semiconductor device, the cathode region 106 is arranged at a center, and the anode regions 107 are arranged on both sides of the cathode region 106. The electrode pattern 111 is formed on the semiconductor element region 108, and the electrode pattern 111 is coupled with the electric potential control region 109 disposed on the side of the semiconductor element region 108.

Accordingly, with using the voltage drop caused by the inner resistance of the electrode pattern 111, the electric potential of the surface portion of the semiconductor element region 108 is gradually reduced along the direction from the cathode region 106 to the anode region 107. Further, with using the voltage drop caused by the inner resistance of the electrode pattern 111, the electric potential of the side portion of the semiconductor element region 108 is gradually reduced along the direction from the cathode region 106 to the anode region 107. Accordingly, the electric potential of the surface portion of the semiconductor element region 108 and the electric potential of the side portion of the semiconductor element region 108 are reduced according to the voltage drop in the semiconductor element region 108 from the cathode region 106 to the anode region 107.

Thus, the electric field concentration at each end of the cathode region 106 and the anode regions 107 is restricted, so that the breakdown voltage reduction is improved. The electric potential of each electric potential control region 109 formed on the side of the semiconductor element region 108 is controlled to differentiate from each other by the electrode pattern 111, which is arranged to overlap over the semiconductor element region 108. Thus, the electric potential control region 109 is provided by a part of the active layer 103. Accordingly, an additional control device forming region, in which a control device such as a voltage dividing diode is formed, is not necessary to arrange around the semiconductor element region 108. Instead, a part of the active layer 3 is partially used for the electric potential control region 109. Thus, the element forming area is minimized, and the electric field concentration at a periphery of the high breakdown voltage device is effectively restricted. The breakdown voltage reduction is improved.

A manufacturing method of the semiconductor device is similar to a manufacturing method of a conventional semiconductor device having a PN diode. A pattern of a mask for forming the trench separation structure 105 is changed to provide the electric potential control region 109, and a step for forming the electrode pattern 111 is additionally performed. Specifically, the mask pattern for forming the trench separation structure 105 is changed such that the mask pattern for forming the trench 105a corresponds to the pattern for forming the trench separation structure 105. In the step for forming the electrode pattern 111, a step for forming the interlayer insulation film 110 includes a step for forming the electrode pattern 111. For example, a part of the interlayer insulation film 110 is formed by a thermal oxidation process or the like. After that, the contact hole 110a is formed at a predetermined position by a photo etching method. Then, a none-doped poly silicon film or a poly silicon film having a low concentration doped impurity is formed on the interlayer insulation film 110, and the poly silicon film is patterned so that the electrode pattern 111 is formed. Further, the other part of the interlayer insulation film 110 is formed by a deposition method of an insulation film. Then, the contact holes 110b, 110c are formed, and the cathode electrode 12 and the anode electrode 13 are formed. Thus, the semiconductor device is manufactured.

Tenth Embodiment

A tenth embodiment will be explained.

Figure 27:
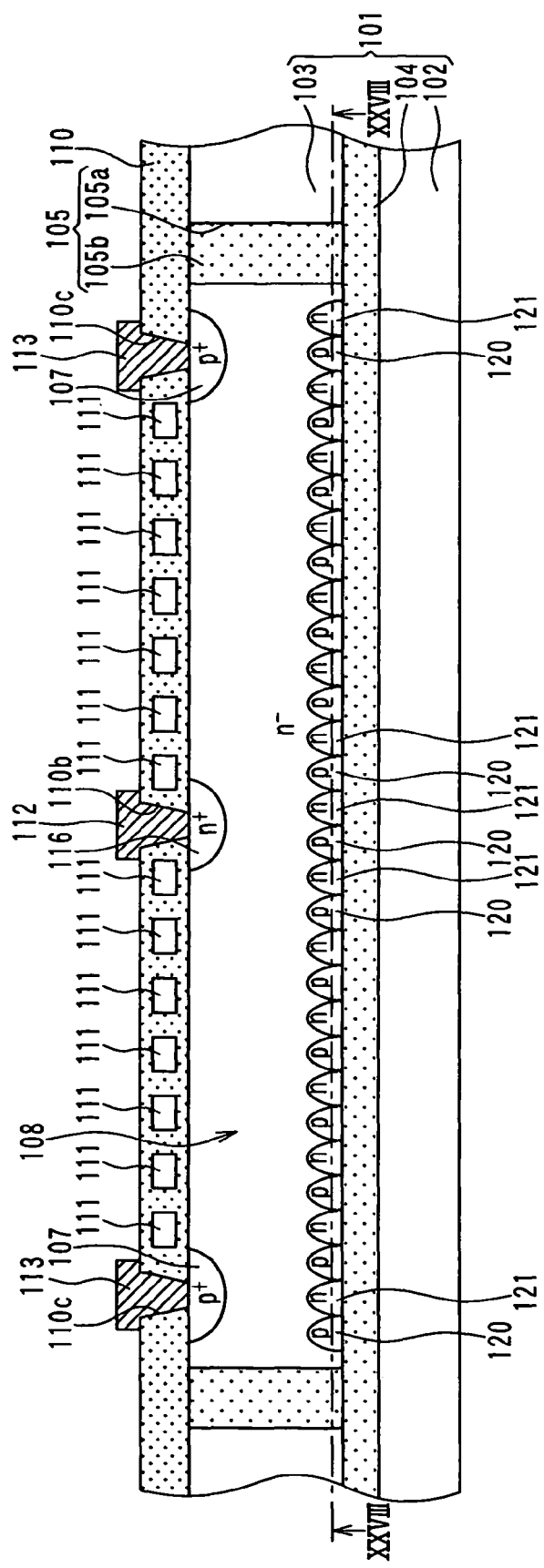
FIG. 27 is a diagram showing a cross sectional view of a semiconductor device according to a tenth embodiment.
Figure 28:
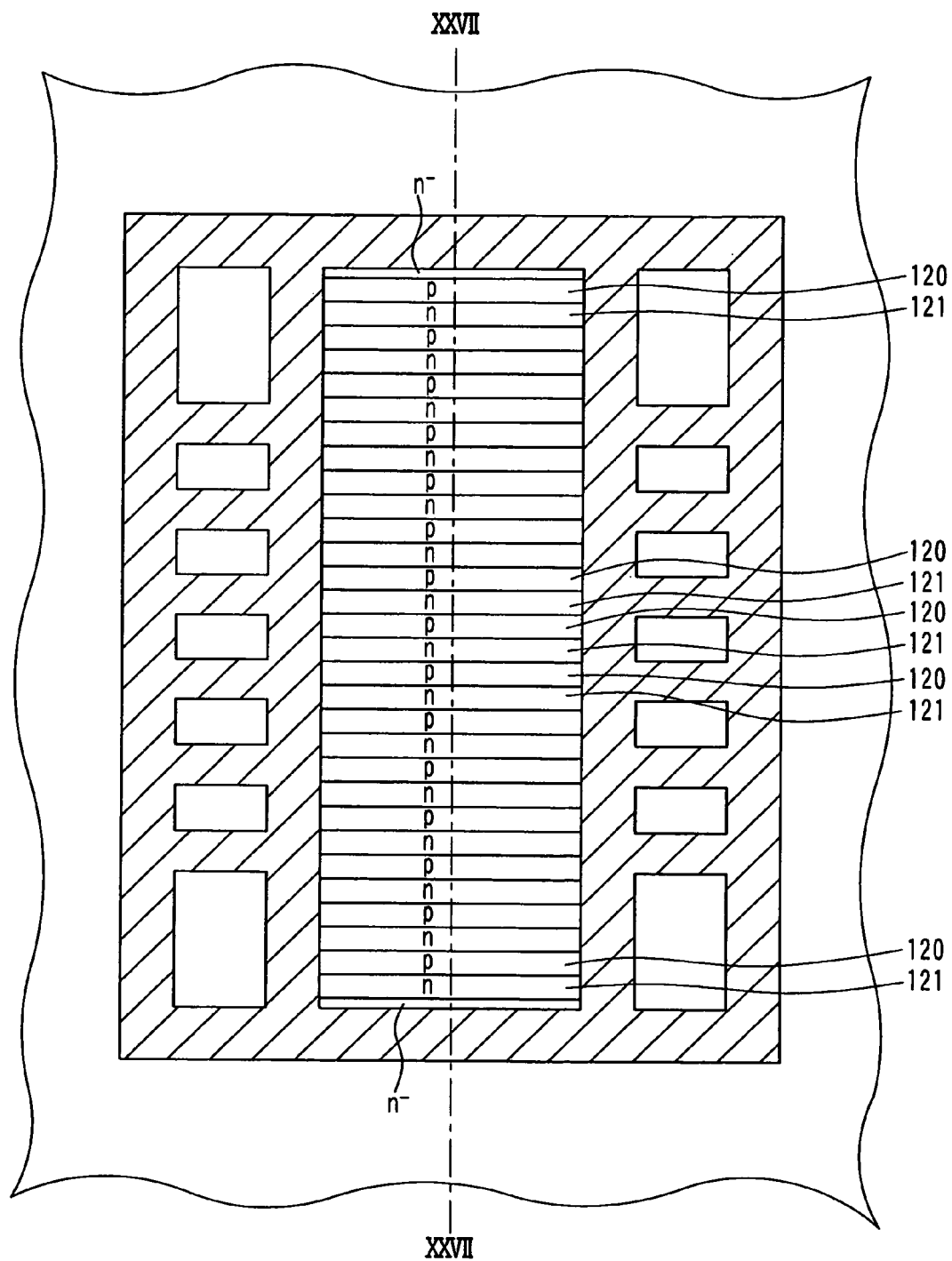
FIG. 28 is a diagram showing a cross sectional view of the device taken along line XXVIII-XXVIII in FIG. 27.

FIG. 27 shows a semiconductor device according to the present embodiment. FIG. 28 shows a cross sectional view of the device viewing from line XXVIII-XXVIII in FIG. 27. Thus, FIG. 28 shows a bottom layout of the active layer 103 viewing from the embedded insulation film side. Here, FIG. 27 corresponds to a cross sectional view of the device taken along line XXVII-XXVII in FIG. 28.

In the semiconductor device according to the present embodiment, a structure for improving a breakdown voltage is formed under the PN junction. An upper layout of the semiconductor device is similar to that in FIG. 24. As shown in FIGS. 27 and 28, a PN junction structure provided by multiple P type regions 120 and multiple N type regions 121 is formed at a boundary between the active layer 103 and the insulation film 104. The PN junction structure is arranged under the PN diode. Multiple P type regions 120 and multiple N type regions 121 have a stripe pattern so that the P type regions 120 and the N type regions 121 are arranged alternately. The stripe pattern has the same distance between the P type region 120 and the N type region 121. The stripe pattern of the P type regions 120 and the N type regions 121 has a longitudinal direction of the stripe pattern, which is in parallel to the longitudinal direction of the anode region 107 and the cathode region 106. The P type regions 120 and the N type regions 121 have the same junction depth in a range between 1 micrometer and 10 micrometers from the embedded insulation film 104. The P type regions 120 have a P conductive type impurity concentration in a range between $1 \times 10^{15}$ cm$^{-3}$ and $1 \times 10^{19}$ cm$^{-3}$. The N type regions 121 have a N conductive type impurity concentration in a range between $1 \times 10^{15}$ cm$^{-3}$ and $1 \times 10^{19}$ cm$^{-3}$.

The semiconductor device has the above features. In the device, the P type regions 120 and the N type regions 121 are repeatedly arranged in a lower portion of the active layer 103, which is adjacent to the embedded insulation film 104. The P type regions 120 and the N type regions 121 are arranged under the semiconductor element. Accordingly, the following effects and functions are obtained.

When the high voltage is applied to the cathode electrode 112, and the anode electrode 113 and the support substrate 102 are grounded, the positive charge is induced to a part of the P type region 120 adjacent to the insulation film 104. Thus, the N type region 121 has sufficient impurity concentration so that the N type region 121 does not provide the reverse layer. Thus, the positive charge is not induced to the part of the N type region 121 adjacent to the insulation film 104. Thus, the reverse layer is localized at a portion other than the N type region 121. Accordingly, the pseudo field plate is formed, and the voltage drop is homogeneously generated according to the distance of the P type regions 120 in a lower portion of the active layer 103 between the cathode region 6 and the anode region 107.

When the device includes only the N type regions 121, the depletion layer from the N type regions 121 does not expand sufficiently. Thus, a RESURF (reduced surface field) effect is not obtained. Thus, the breakdown voltage is not sufficiently improved. In the present embodiment, since the device includes the P type regions 120 and the N type regions 121, the depletion layer expands sufficiently. Accordingly, the electric potential of the electric potential control region 109 on the backside of the semiconductor element region 108 is gradually reduced in a direction from the cathode region 106 to the anode region 107 in addition to the electric potential control region 109 on the front surface and the side of the semiconductor element region 108. Thus, the breakdown voltage of the semiconductor device is much improved.

The above semiconductor device is manufactured by the following manufacturing method. Before the SOI substrate 101 is formed, a mask having the opening corresponding to the P type region to-be-formed region is formed on the surface of the silicon substrate for providing the active layer 103. The P conductive type impurity is implanted through the mask on the substrate. Then, the mask is removed, and another mask having the opening corresponding to the N type region to-be-formed region is arranged on the substrate. The N conductive type impurity is implanted through the mask on the substrate. Then, the substrate is thermally processed, so that the P type regions 120 and the N type regions 121 are formed. Further, the silicon substrate is bonded to the support substrate 102 via the insulation film 104 such that the surface of the silicon substrate, on which the P type regions 120 and the N type regions 121 are formed, faces the support substrate 102. Then, the silicon substrate is thinned so that the active layer 103 is formed. After that, steps of the manufacturing method according to the ninth embodiment are performed. Thus, the semiconductor device according to the present embodiment is completed.

Eleventh Embodiment

An eleventh embodiment will be explained. The trench separation structure 105 in the ninth embodiment is changed, and the electric potential control region 109 is also changed.

In the ninth and tenth embodiments, the trench separation structure 105 has a structure such that the insulation film 105b is embedded in the trench 105a. Alternatively, the trench separation structure 105 may have other structures. For example, the insulation film 105b and a poly silicon layer may be embedded in the trench 105a. If the structure of the trench separation structure 105 is merely changed, difficulties may be generated. The difficulties will be explained with respect to FIGS. 29A and 29B.

Figure 29:
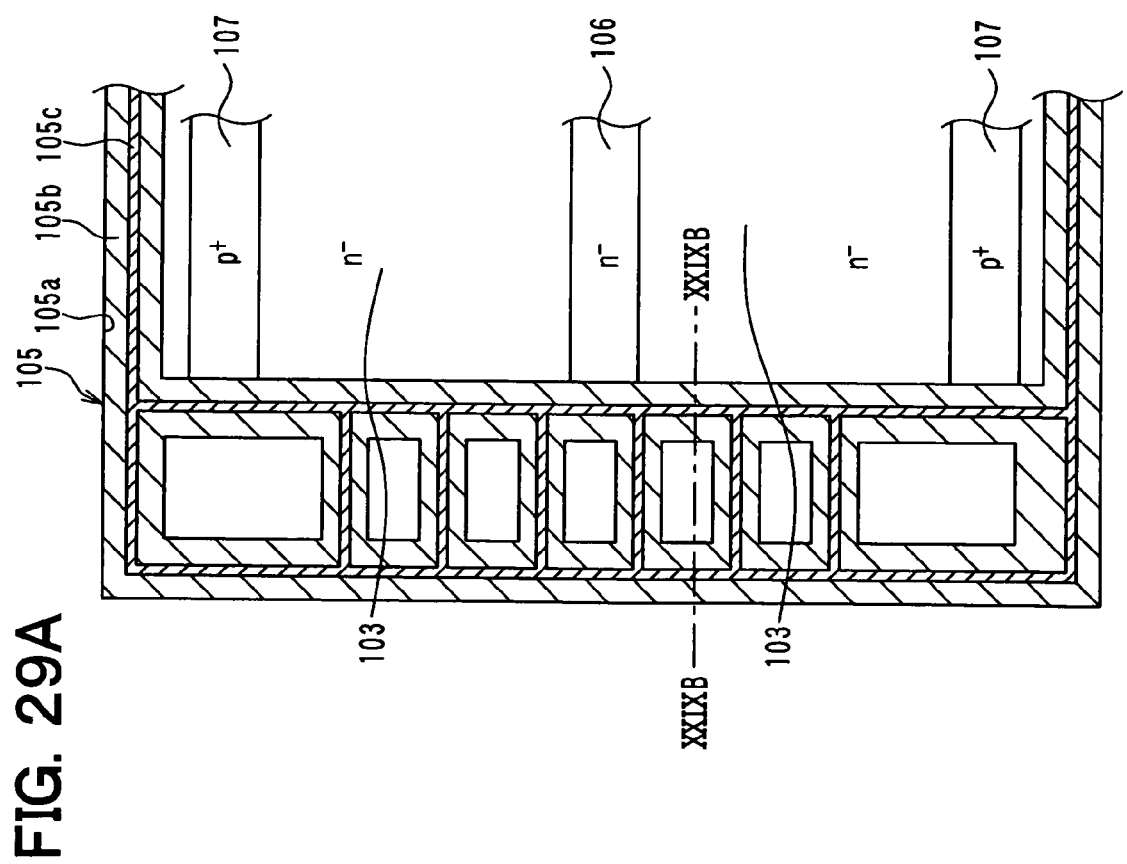
FIG. 29A is a diagram showing an upper layout of another semiconductor device having a different trench separation structure.
FIG. 29B is a diagram showing a cross sectional view of the device taken along line XXIXB-XXIXB in FIG. 29A.

FIG. 29A shows an upper layout of the semiconductor device when the trench separation structure 105 is changed.

FIG. 29B is a cross sectional view of the device taken along line XXIXB-XXIXB in FIG. 29A.

In FIGS. 29A and 29B, the trench separation structure 105 includes the trench 105a, the insulation film 105b and the poly silicon layer 105c. The insulation film 105b is formed by thermally oxidizing an inner wall of the trench 105a. The poly silicon layer 105c is formed on the surface of the insulation film 105b to fill in the trench 105a. When only the insulation film 105b fills in the trench 105a, stress caused by difference of physical properties such as thermal expansion coefficient between material of the insulation film 105b and silicon may be applied to silicon material, so that a crystal defect or the like may be generated in silicon material. The crystal defect may generate current leakage, and therefore, normal function of the semiconductor element may be deteriorated. Accordingly, it is preferred that the poly silicon layer 105c is arranged in the trench 105a in order to reduce occurrence of the crystal defects caused by the stress.

In the above case, as shown in FIG. 29A, all sides of the semiconductor element region 108 are surrounded with the poly silicon layer 105c. Accordingly, the electric potential control of the semiconductor element region 108 on the side is not performed. Similarly, the same difficulties may be occur at the semiconductor device in JP-B-4204895. Thus, when the trench separation structure 105 is formed such that the insulation film 105b and the poly silicon layer 105c are arranged in the trench 105a, a breakdown voltage may not be improved.

In the present embodiment, although the insulation film 105b and the poly silicon layer 105c are arranged in the trench 105a, the electric potential of the side of the semiconductor element region 108 is controlled.

Figure 30:
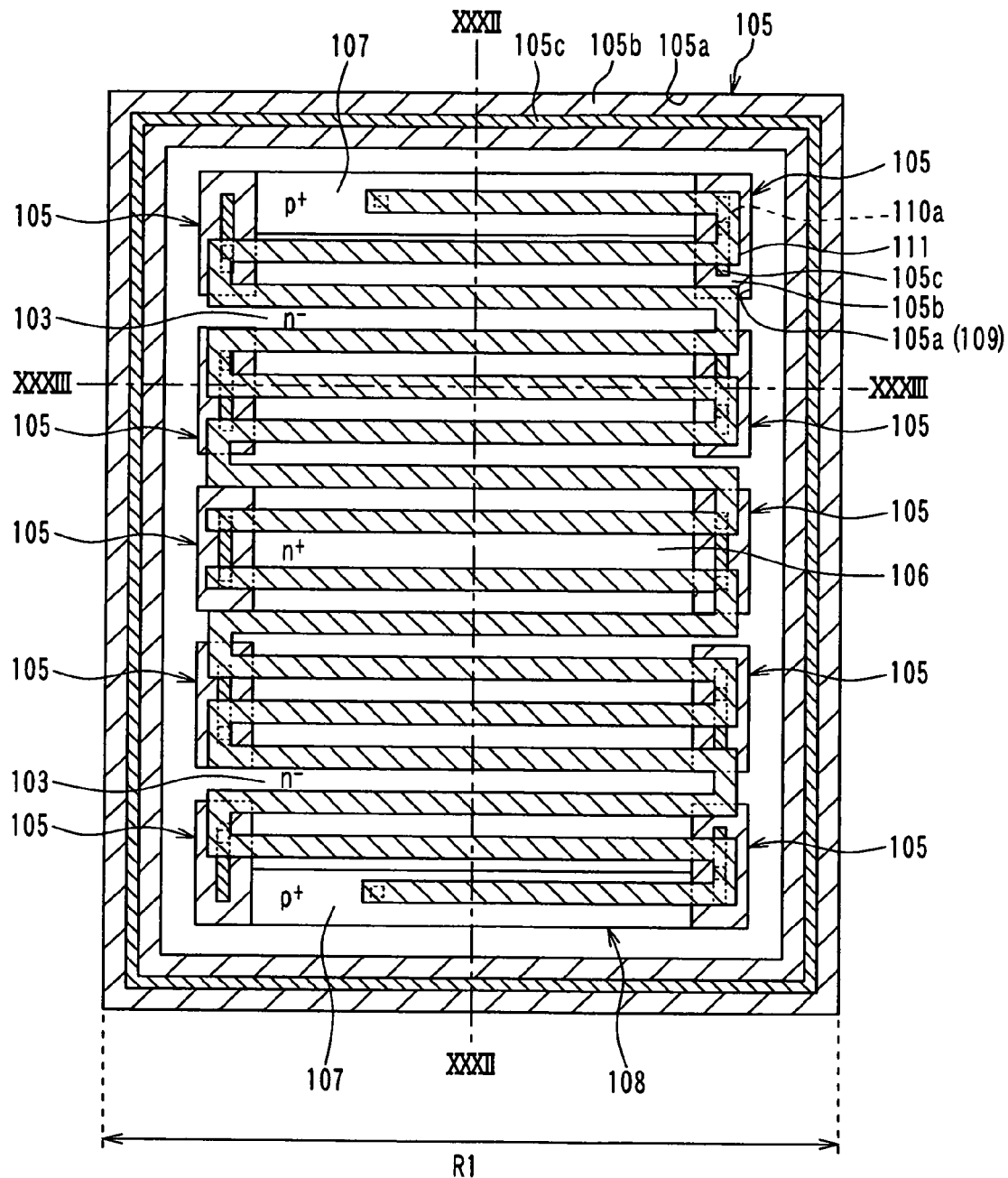
FIG. 30 is a diagram showing an upper layout of a PN diode forming region in a semiconductor device according to a eleventh embodiment.
Figure 31:
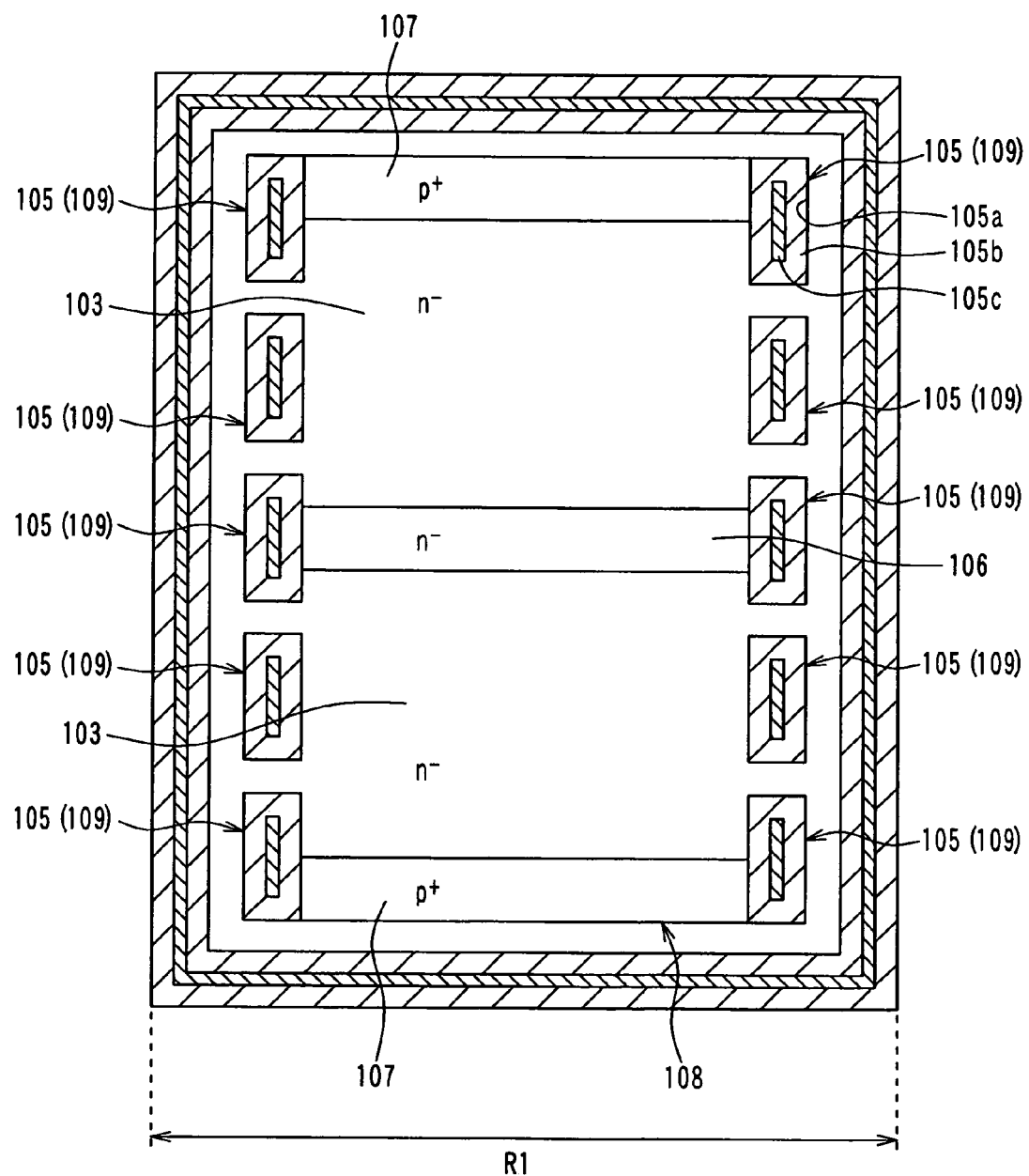
FIG. 31 is a diagram showing a lower layout of the PN diode forming region in the device in FIG. 30.
Figure 32:
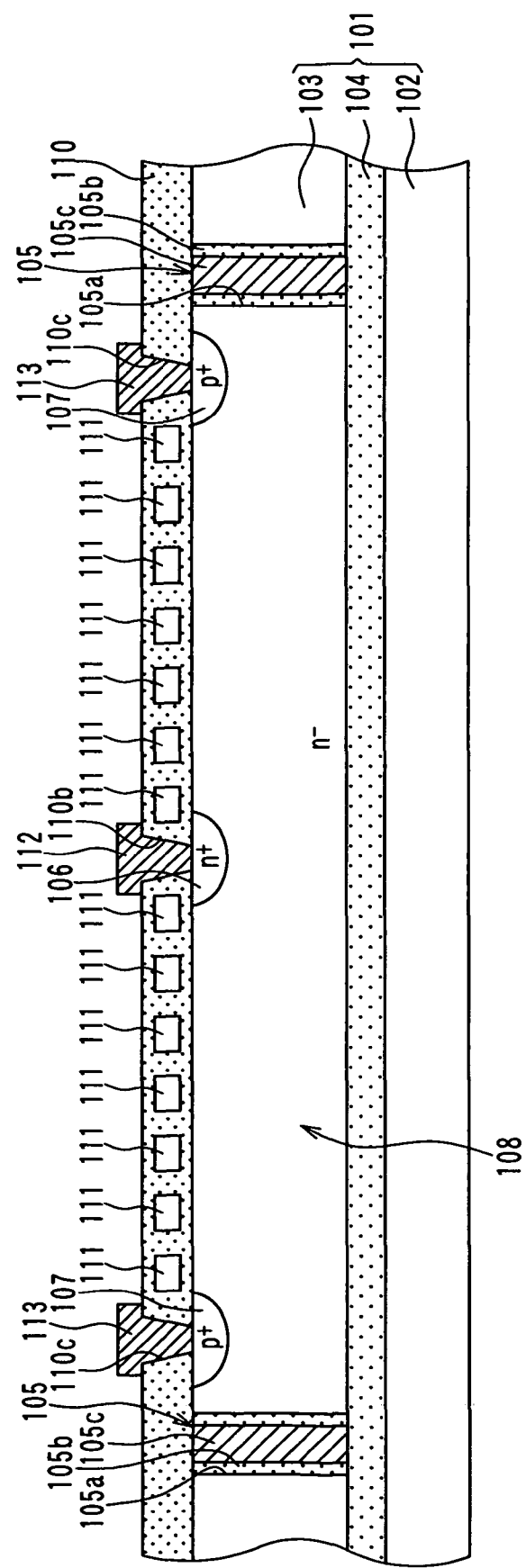
FIG. 32 is a diagram showing a cross sectional view of the device taken along line XXXII-XXXII in FIG. 30.
Figure 33:
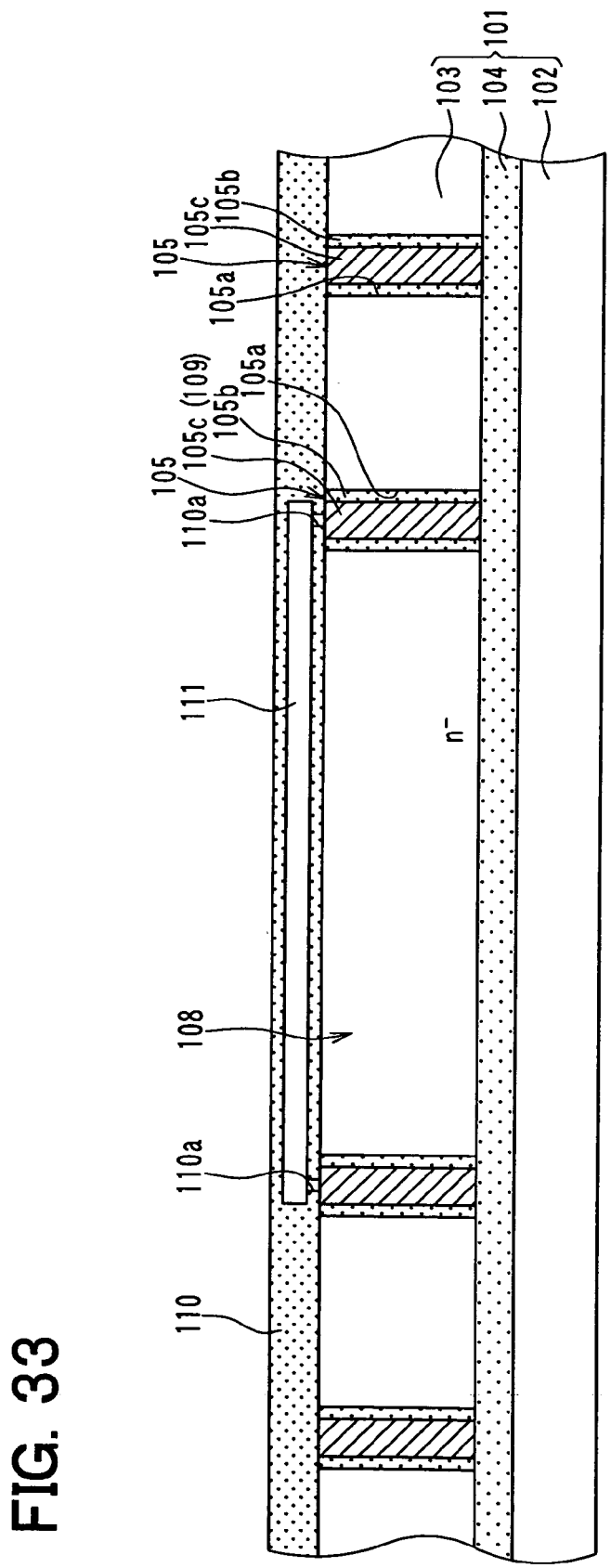
FIG. 33 is a diagram showing a cross sectional view of the device taken along line XXXIII-XXXIII in FIG. 30.

FIG. 30 shows an upper layout of the PN diode forming region R1 in the semiconductor device. FIG. 31 shows a lower layout of the PN diode forming region R1. FIG. 32 shows a cross sectional view of the device taken along line XXXII-XXXII in FIG. 30, and FIG. 33 shows a cross sectional view of the device taken line XXXIII-XXXIII in FIG. 30. Although FIG. 30 is not a cross sectional view, a hatching area is drawn in FIG. 30 for convenience to understand easily.

As shown in FIG. 30, in the present embodiment, the trench separation structure 105 disposed on the side of the semiconductor element region 108 is divided into multiple portions. The trench separation structure 105 surrounds each portion of the region 108. Specifically, the poly silicon layer 105c disposed in the trench separation structure 105 disposed on the side of the semiconductor element region 108 provides the electric potential control region 109. The poly silicon layer 105c is electrically coupled with the electrode pattern 111. In this case, the trench separation structure 105 disposed on the side of the semiconductor element region 108 is divided into multiple portions, and the poly silicon layer 105c in each portion of the trench separation structure 105 is electrically separated from each other. Thus, each poly silicon layer 105c can be controlled independently, so that the potentials of the poly silicon layer 105c in the portions of the trench separation structure 105 are different from each other. Accordingly, based on the voltage drop of the electrode pattern 111, the poly, silicon layer 105c functions as an electric potential control area. Thus, the effects of the present embodiment are similar to those of the ninth embodiment.

Here, in the above structure, silicon material is disposed between the trench separation structure 105 arranged on the side of the semiconductor element region 108 and another trench separation structure surrounding the trench separation structure 105 and the semiconductor element region 108. However, the silicon material is not affected by the voltage of the semiconductor element region 108 since the device includes the trench separation structure 5 on the side of the semiconductor element region 108. Thus, the equivalent electric potential lines in the silicon material becomes parallel to the right-left direction of the drawing. Thus, the breakdown voltage is not reduced because of the silicon material between the trench separation structure 105 and another trench separation structure.

The device according to the present embodiment has a pattern of the trench separation structure 105, which is different from the ninth embodiment. Accordingly, the mask pattern for forming the trench 105a is changed in the manufacturing method of the device according to the ninth embodiment, and further, the insulation film 105b and the poly silicon layer 105c are formed in the trench 105a. Other steps are similar to the ninth embodiment.

Twelfth Embodiment

A twelfth embodiment will be explained. A difference between a semiconductor device according to the present embodiment and the device according to the eleventh embodiment is the limitation of the width of the trench separation structure 105.

Figure 34:
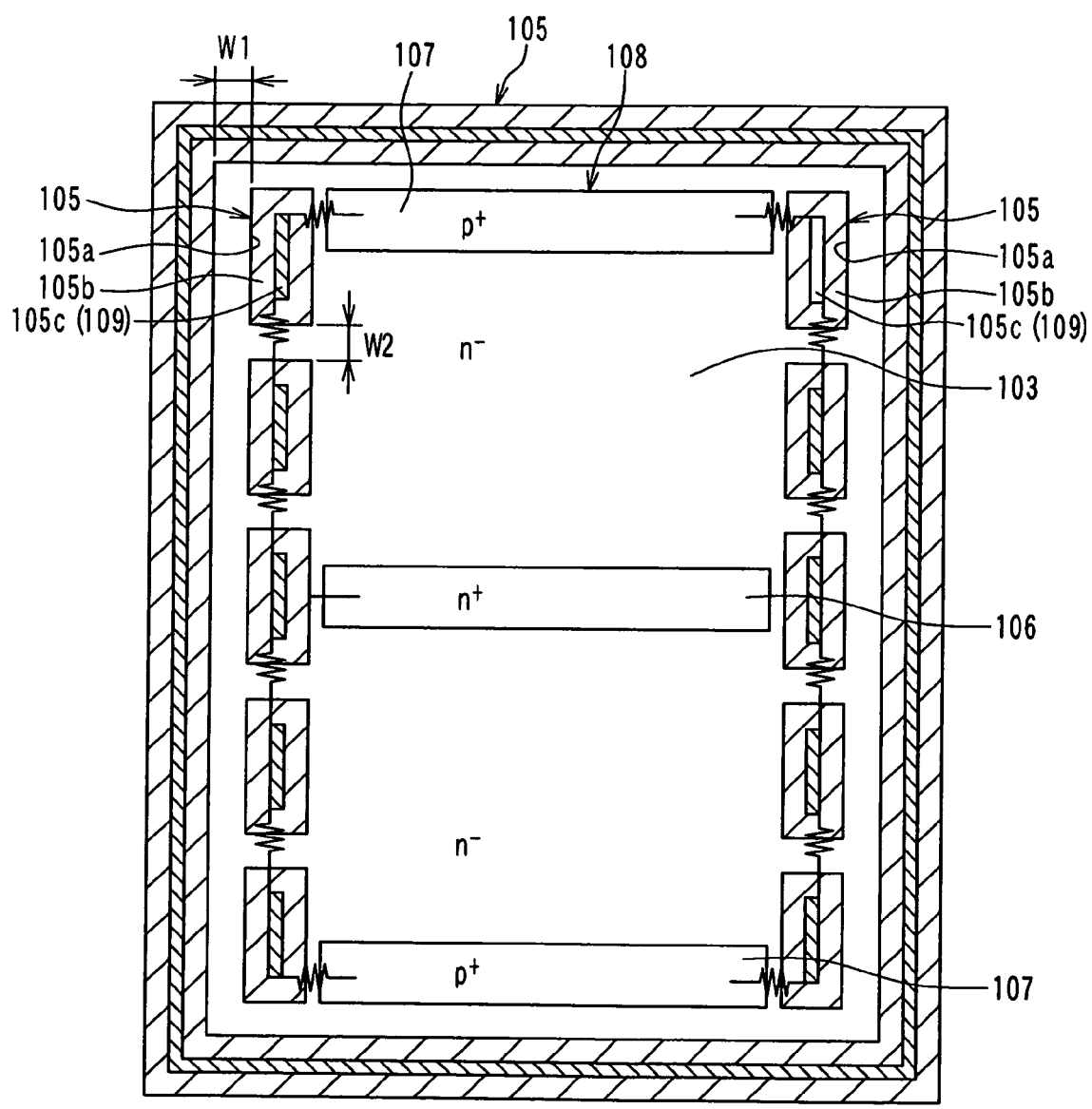
FIG. 34 is a diagram showing an upper layout of a trench separation structure in a semiconductor device according to a twelfth embodiment.

FIG. 34 shows an upper layout of the trench separation structure 105 of the device according to the present embodiment. In FIG. 34, the electrode pattern 111 is not shown. The electrode pattern 111 is arranged on the semiconductor element region 108, similar to the eleventh embodiment.

As shown in FIG. 34, a width W1 between the trench separation structure 105 on the side of the semiconductor element region 108 and another trench separation structure 105 surrounding the trench separation structure 105 and the semiconductor element region 108 is equal to or smaller than 2 micrometers. Further, a width W2 between two adjacent trench separation structures 105 on the side of the semiconductor element region 108 is equal to or smaller than 2 micrometers.

When the width W1 and the width W2 are equal to or smaller than 2 micrometers, the silicon material between the trench separation structure 105 on the side of the semiconductor element region 108 and another trench separation structure 105 and the silicon material between two adjacent trench separation structures 105 are completely depleted by the depletion layer expanding and generated according to the difference of work function between the insulation film 105b such as an oxide film for providing the trench separation structure 105 and silicon material. Accordingly, the reduction of the breakdown voltage in the semiconductor device is much improved.

Thirteenth Embodiment

A thirteenth embodiment will be explained. A difference between a semiconductor device according to the present embodiment and the device according to the eleventh embodiment is the layout of the trench separation structure 105.

Figure 35:
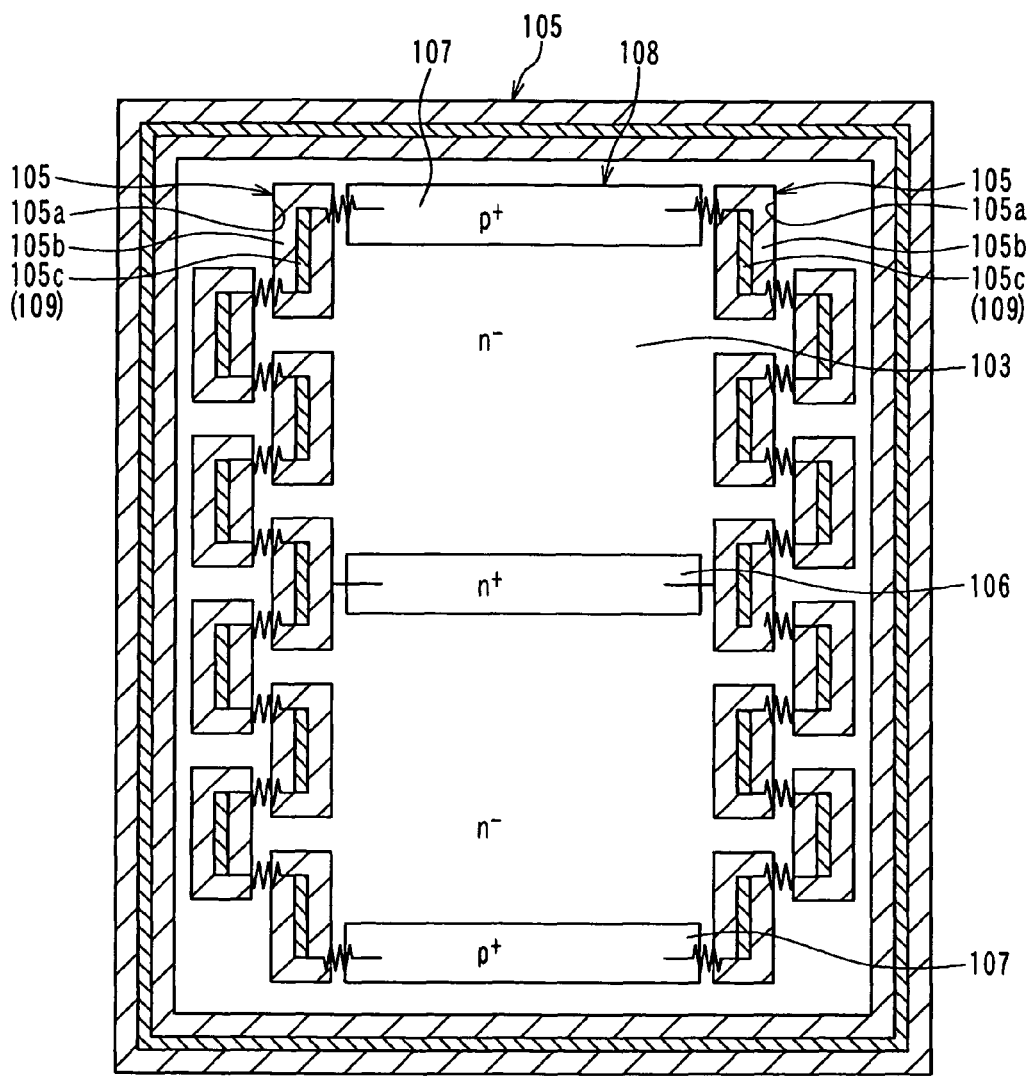
FIG. 35 is a diagram showing an upper layout of a trench separation structure in a semiconductor device according to a thirteenth embodiment.

FIG. 35 shows an upper layout of the trench separation structure 105 of the device according to the present embodiment. In FIG. 35, the electrode pattern 111 is not shown. The electrode pattern 111 is arranged on the semiconductor element region 108, similar to the eleventh embodiment.

As shown in FIG. 35, a distance between the trench separation structure 105 on the side of the semiconductor element region 108 and the trench separation structure 105 surrounding the trench separation structure 105 and the semiconductor element region 108 is various. Specifically, between the cathode region 106 and the anode region 107, the trench separation structure 105 having a short distance to the structure 105 surrounding the structure 105 and the region 108 and the structure 105 having a long distance to the structure 105 surrounding the structure 105 and the region 108 are alternately arranged from the cathode region 106 to the anode region 107. More specifically, the trench separation structure 105 disposed on the side of the semiconductor element region 108 includes multiple rows. In this embodiment, the number of rows of the structure 105 is two.

In the above construction, the trench separation structure 105 on the side of the semiconductor element region 108 has a multi-step structure such that the structure 105 includes the structure 105 disposed near the structure 105 for surrounding the structure 105 and the region 108 and the structure 105 disposed further the structure for surrounding the structure 105 and the region 108. Here, the structure 105 disposed further the structure for surrounding the structure 105 and the region 108 is the structure 105 disposed on the semiconductor element region side. The multi-step structure shields influence of an electric potential of the outside of the PN diode forming region R1. Thus, the shielding performance with respect to the electric potential of the outside of the PN diode forming region R1 is improved. The breakdown voltage is effectively improved.

Fourteenth Embodiment

A fourteenth embodiment will be explained. A difference between a semiconductor device according to the present embodiment and the device according to the ninth embodiment is the construction of the trench separation structure 105.

Figure 36:
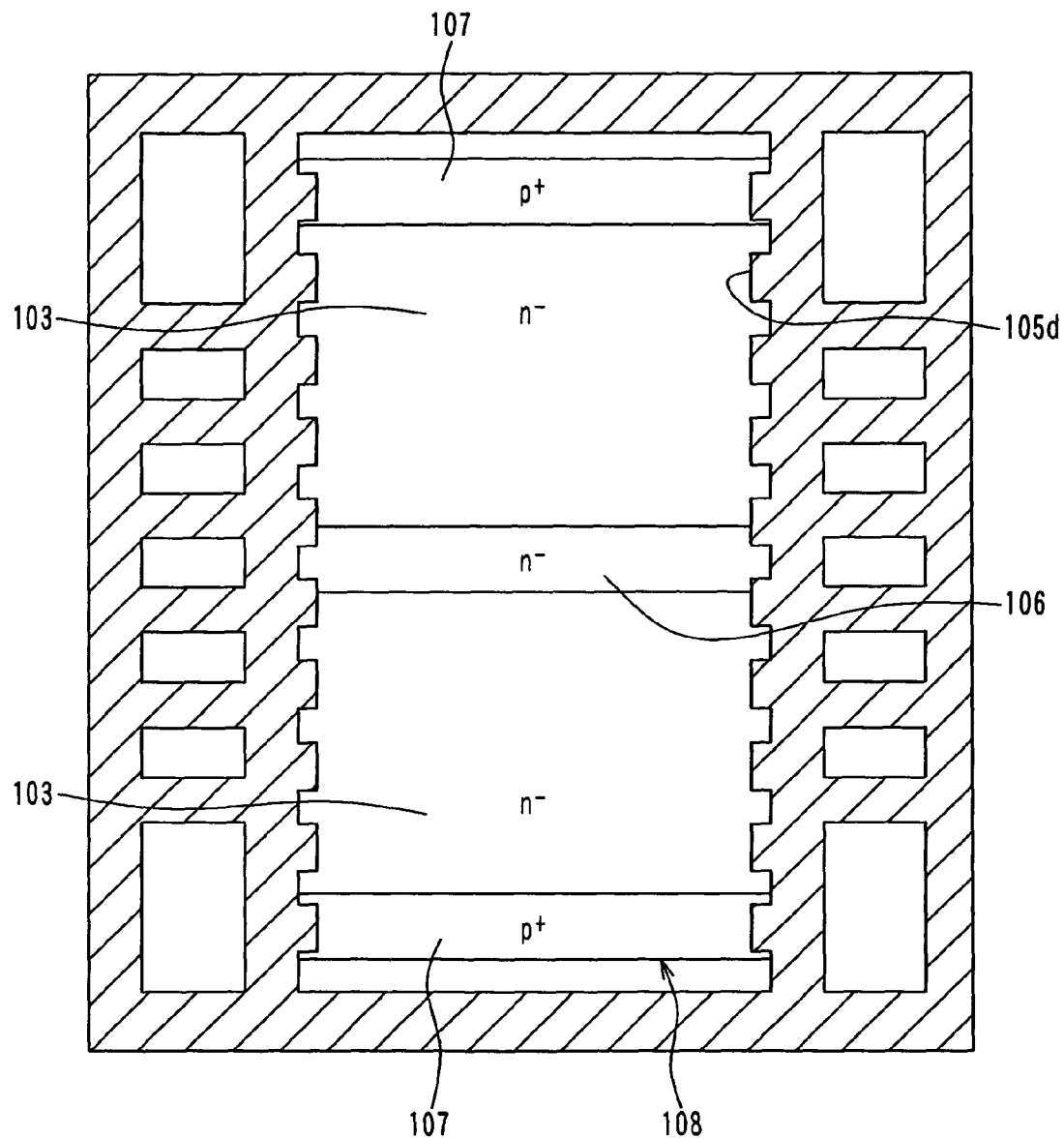
FIG. 36 is a diagram showing an upper layout of a trench separation structure in a semiconductor device according to a fourteenth embodiment.

FIG. 36 shows an upper layout of the trench separation structure 105 of the semiconductor device. In FIG. 36, the electrode pattern 111 is not shown. The electrode pattern 111 is arranged on the semiconductor element region 108, similar to the ninth embodiment.

As shown in FIG. 36, in the semiconductor device according to the present embodiment, the trench separation structure 105 includes multiple protrusions 105d, which protrude toward the semiconductor element region 108 from the structure 105 on the side of the semiconductor element region 108. Thus, the trench separation structure 105 has the concavity and convexity shape.

In the present embodiment, the protrusion 105d protrudes toward the semiconductor element region 108. In general, a charge is induced to a part of the active layer 103 contacting the trench separation structure 105 because of the influence of the electric potential of the electric potential control region 109 disposed on the side of the semiconductor element region 108. The charge generates deviation of the equivalent electric potential line distribution, and therefore, the breakdown voltage may be reduced. However, in the present embodiment, since the protrusion 105d protrudes toward the semiconductor element region side, the distance between the active layer 103 and the electric potential control region 109 becomes long. Thus, it is difficult to induce the charge to the part of the active layer 103 contacting the protrusion 105d. Accordingly, the deviation of the equivalent electric potential line distribution is restricted. Thus, the breakdown voltage is improved.

Fifteenth Embodiment

A fifteenth embodiment will be explained. A difference between a semiconductor device according to the present embodiment and the device according to the fourteenth embodiment is the construction of the trench separation structure 105.

Figure 37:
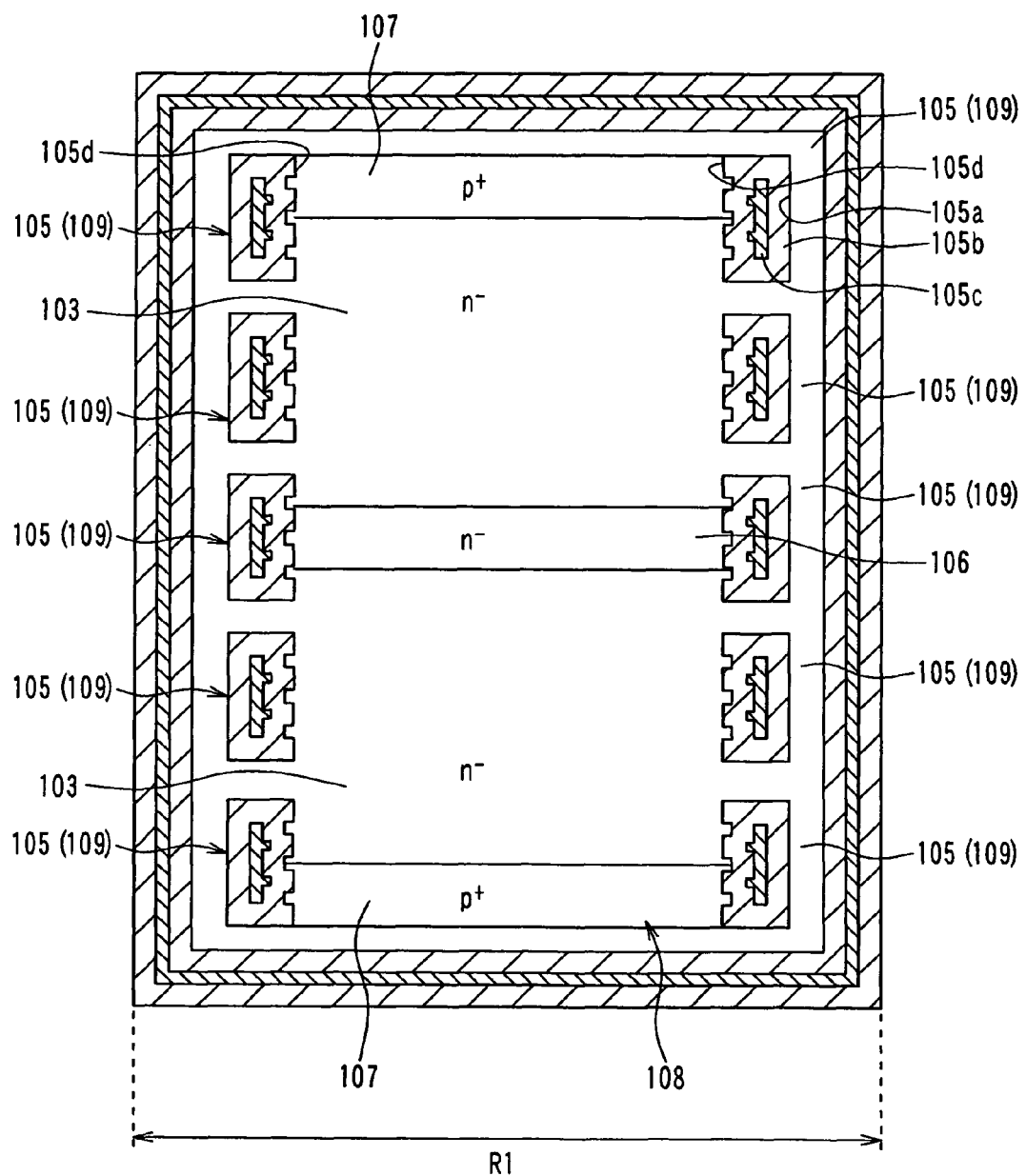
FIG. 37 is a diagram showing an upper layout of a trench separation structure in a semiconductor device according to a fifteenth embodiment.

FIG. 37 shows an upper layout of the trench separation structure 105 of the semiconductor device. In FIG. 36, the electrode pattern 111 is not shown. The electrode pattern 111 is arranged on the semiconductor element region 108, similar to the ninth embodiment.

As shown in FIG. 37, the protrusions 105d are formed on the trench separation structure 105, which is disposed on the side of the semiconductor element region 108. The protrusion 105d protrudes toward the semiconductor element region 108. Thus, the trench separation structure 105 has a concavity and convexity shape. Further, the trench separation structure 105 includes the trench 105a, the insulation film 105b and the poly silicon layer 105c. The insulation film 105b is formed by thermally oxidizing the inner wall of the trench 105a. The poly silicon layer 105c is formed to fill in the trench 105a, and on the surface of the insulation film 105b.

The protrusions 105d are formed on the trench separation structure 105 having the insulation film 105b and the poly silicon layer 105c embedded in the trench 105a. The trench separation structure 105 is disposed on the side of the semiconductor element region 108. Thus, the effects of the present embodiment are same as the effects according to the fourteenth embodiment.

Sixteenth Embodiment

A sixteenth embodiment will be explained. A difference between a semiconductor device according to the present embodiment and the device according to the fourteenth embodiment is the construction of the trench separation structure 105.

FIG. 38A shows an upper layout of the trench separation structure 105 of the semiconductor device. FIG. 38B is a cross sectional view of the device taken along line XXXVIIIB-XXXVIIIB in FIG. 38A, and FIG. 38C is a cross sectional view of the device taken along line XXXVIIIC-XXXVIIIC in FIG. 38A. In FIG. 38A, the electrode pattern 111 is not shown. The electrode pattern 111 is arranged on the semiconductor element region 108, similar to the ninth embodiment.

As shown in FIG. 38A, in the device according to the present embodiment, the PN junction structure having the P type regions 130 and the N type regions 131 is formed in a part of the active layer 103, which is disposed inside of the trench separation structure 105. Specifically, the PN junction structure is formed on the side of the semiconductor element region 108 between the cathode region 106 and the anode region 107. The P type regions 130 and the N type regions 131 are made of a diffusion layer, as shown in FIGS. 38B and 38C. The P conductive type impurity or the N conductive type impurity is implanted on the surface of the active layer 103 with using a mask having an opening corresponding to the P type region or N type region to-be-formed region. Then, the impurity is thermally diffused so that the P type regions 130 or the N type regions 131 is formed.

Thus, the PN junction structure having the P type regions 130 and the N type regions 131 is formed on the side of the semiconductor element region 108. Accordingly, although the charge is induced to the part of the P type region 130 contacting the trench separation structure 105, the charge is not induced to the part of the N type region 131 contacting the trench separation structure 105. Thus, similar to the fourteenth embodiment, the deviation of the equivalent electric potential line distribution is restricted. The breakdown voltage is much improved.

Seventeenth Embodiment

A seventeenth embodiment will be explained. A difference between a semiconductor device according to the present embodiment and the device according to the sixteenth embodiment is the construction of the trench separation structure 105.

FIG. 39A shows an upper layout of the trench separation structure 105 of the semiconductor device. FIG. 39B is a cross sectional view of the device taken along line XXXIXB-XXXIXB in FIG. 39A, and FIG. 39C is a cross sectional view of the device taken along line XXXIXC-XXXIXC in FIG. 39A. In FIG. 39A, the electrode pattern 111 is not shown. The electrode pattern 111 is arranged on the semiconductor element region 108, similar to the sixteenth embodiment.

As shown in FIG. 39A, in the semiconductor device according to the present embodiment, the PN junction structure having the P type regions 130 and the N type regions 131 is repeatedly formed on the side of the semiconductor element region 108 from the cathode region 106 to the anode region 107. Specifically, the PN junction structure is disposed in the active layer 103 inside of the trench separation structure 105. The P type regions 130 and the N type regions 131 are made of a diffusion layer, as shown in FIGS. 39B and 39C. The P conductive type impurity is implanted on the surface of the active layer 103 with using a mask having an opening corresponding to the P type region to-be-formed region, and the N conductive type impurity is implanted on the surface of the active layer 103 with using a mask having an opening corresponding to the N type region to-be-formed region. After that, the P conductive type impurity and the N conductive type impurity are diffused in a thermal process. Then, the trench separation structure 105 is prepared such that the structure 105 includes the trench 105a, the insulation film 105b, and the poly silicon layer 105c. The insulation film 105b is formed by thermally oxidizing the inner wall of the trench 105a. The poly silicon layer 105c is formed such that the silicon layer 105c is embedded in the trench 105a via the insulation film 105b.

Thus, not only the insulation film 105b but also the poly silicon layer 105c fill in the trench 105a. Even when the device has the trench separation structure 105, the PN junction structure is formed on the side of the semiconductor element region 108. Thus, the effects according to the sixteenth embodiment are obtained.

Other Embodiments

Although the semiconductor element is the PN diode, the device may include other semiconductor elements.

Figure 40:
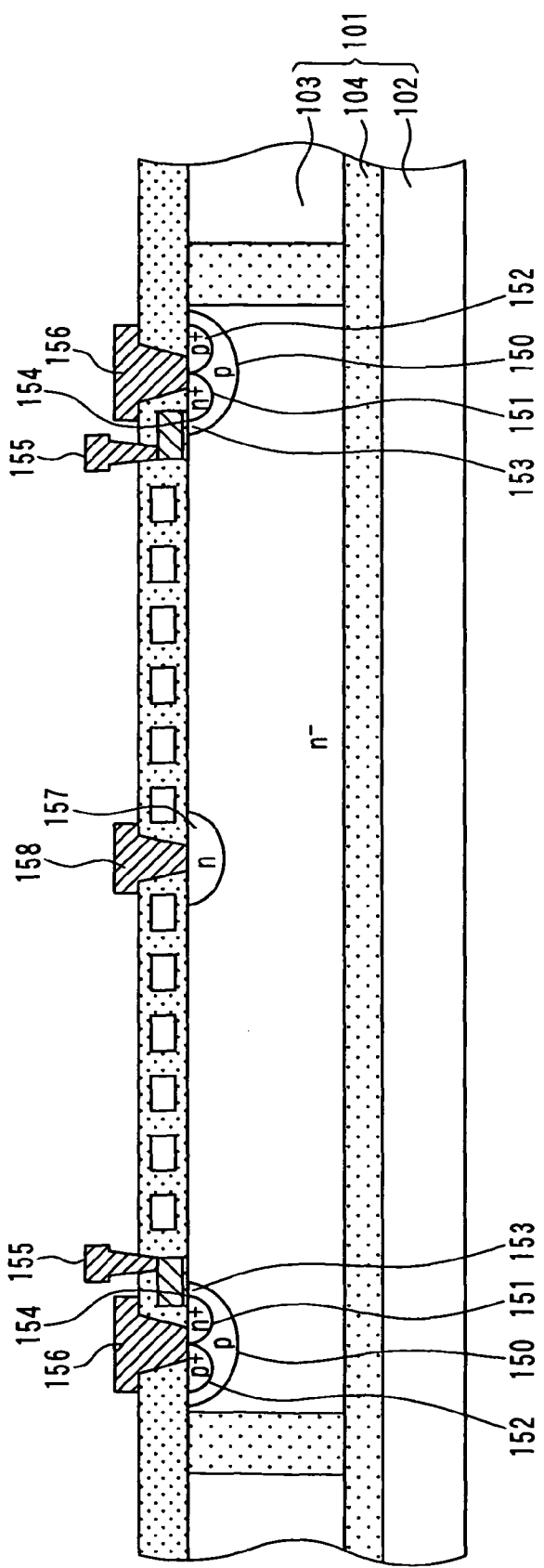
FIG. 40 is a diagram showing a cross sectional view of a semiconductor device having a LDMOS element according to other embodiments.

FIG. 40 shows a semiconductor device having a LDMOS element as a semiconductor element. A P− type channel layer 150 is formed in a surface portion of the active layer 103. Further, a N+ type source region 151 as the second impurity layer and a P+ type contact region 152 as the first impurity layer are formed in a surface portion of the channel layer 150. A channel region 153 is provided by a part of the channel layer 150 between the source region 151 and the active layer 103. A gate electrode 155 is arranged on the channel region 153 via a gate insulation film 154. A source electrode 156 as the second electrode is formed on the source region 151 and the contact region 152. The source electrode 156 is electrically coupled with the source region 151 and the contact region 152. These regions are arranged to have a stripe pattern along a vertical direction of the drawing as a longitudinal direction.

A N+ type drain region 157 as the first impurity layer is formed in a surface portion of the active layer 103 such that the drain region 157 is separated from the P− type channel layer 150. The drain electrode 158 as the first electrode is formed on the drain region 157 so that the drain electrode 158 is electrically coupled with the drain region 157. The drain region 157 and the drain electrode 158 are arranged to have a stripe pattern along a vertical direction of the drawing as a longitudinal direction. The drain region 157 and the drain electrode 158 are arranged at the center. The channel layer 150, the source region 151 and the contact region 152 are arranged on both sides of the center, so that the above regions have a stripe shape. An interlayer insulation film (not shown) and a protection film (not shown) are formed in the substrate 102. Thus, the LDMOS element is formed.

In the semiconductor device having the LDMOS element, the effects similar to the above embodiments are obtained. Here, FIG. 40 shows the semiconductor device having the LDMOS element, which is similar to the device in FIG. 24. Alternatively, the semiconductor devices according to the tenth to seventeenth embodiments may include the LDMOS element.

Figure 41:
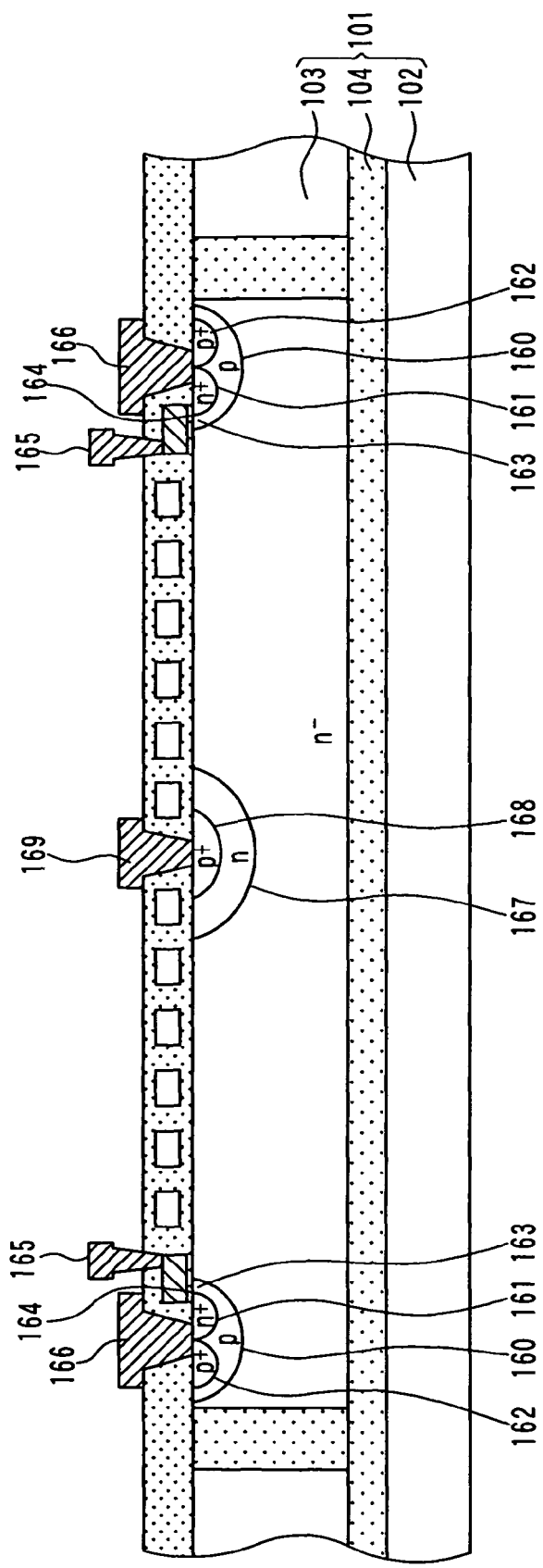
FIG. 41 is a diagram showing a cross sectional view of a semiconductor device having a IGBT according to other embodiments.

FIG. 41 shows a semiconductor device having an IGBT as the semiconductor element. A P− type base region 160 is formed in a surface portion of the active layer 103. A N+ type emitter region 161 as the second impurity layer and a P+ type contact region 162 as the first impurity layer are formed in a surface portion of the base region 160. A channel region 163 is provided by a part of the base region 160, which is disposed between the N+ type emitter region 161 and the active layer 103. A gate electrode 165 is formed on the channel region 163 via a gate insulation film 164. An emitter electrode 166 as the second electrode is arranged on the N+ type emitter region 161 and the P+ type contact region 162. The emitter electrode 166 is electrically coupled with the emitter region 161 and the contact region 162. These regions are arranged to have a stripe pattern along a vertical direction of the drawing as a longitudinal direction.

A N+ buffer layer 167 is formed in a surface portion of the active layer 103 such that the buffer layer 167 is separated from the base region 80. A P+ type collector region 168 as the first impurity layer is formed in a surface portion of the buffer layer 167. A collector electrode 169 as the first electrode is formed on the collector region 168 so that the collector electrode 169 is electrically coupled with the collector region 168. The collector region 168 and the collector electrode 169 are arranged to have a stripe pattern along with the vertical direction of the drawing as the longitudinal direction. The collector region 168 and the collector electrode 169 are arranged at the center. The channel layer 160, the emitter region 161 and the contact region 162 are arranged on both sides of the center. Thus, the above regions have a stripe shape. An interlayer insulation film (not shown) and a protection film (not shown) are formed in the substrate 102. Thus, the IGBT is formed.

In the semiconductor device having the IGBT, the effects similar to the above embodiments are obtained. Here, FIG. 41 shows the semiconductor device having the IGBT, which is similar to the device in FIG. 24. Alternatively, the semiconductor devices according to the tenth to seventeenth embodiments may include the IGBT.

In the above ninth to seventeenth embodiments, the electrode pattern 111 is shown as one of examples. Alternatively, the electrode pattern 111 may have other patterns. For example, in the ninth to seventeenth embodiments, the electrode pattern 111 is formed from one line from the cathode region 106 to the anode region 107. Alternatively, the electrode pattern 111 may be formed from two lines. Specifically, one electrode pattern 111 and the other electrode pattern 111 are arranged to have line symmetry with respect to the center line in parallel to an arrangement direction of the cathode region 106 and the anode region 107. In this case, the electric potential difference on one side of the semiconductor element region 108 may be equal to the electric potential difference on the other side of the semiconductor element region 108.

The above ninth to seventeenth embodiments may be combined. For example, the PN junction structure having the P type regions 120 and the N type regions 121 according to the tenth embodiment may be incorporated into the device according to the eleventh to seventeenth embodiments and other embodiments. In the above ninth to seventeenth embodiments, the first conductive type is the N conductive type, and the second conductive type is the P conductive type. Alternatively, the first conductive type may be the P conductive type, and the second conductive type may be the N conductive type.

The above disclosure has the following aspects.

According to a first aspect of the present disclosure, a semiconductor device includes: a SOI substrate having a support substrate, an embedded insulation film and an active layer, which are stacked in this order, wherein the active layer is made of silicon having a first conductive type; a semiconductor element having a first impurity layer and a second impurity layer, which are disposed in a surface portion of the active layer, wherein the second impurity layer surrounds the first impurity layer so that the first impurity layer and the second impurity layer have a first layout; a element separation region disposed in the active layer and surrounded with an element separation structure; and a plurality of first conductive type regions and a plurality of second conductive type regions, which are disposed in the element separation region. The first conductive type regions and the second conductive type regions are disposed in a part of the active layer, which is adjacent to the embedded insulation film, and are alternately arranged between the first impurity layer and the second impurity layer. The first conductive type regions and the second conductive type regions have a second layout, which corresponds to the semiconductor element. The first conductive type regions have an impurity concentration, which is higher than the active layer.

In the above device, the second conductive type regions sandwich the first conductive type region so that the second conductive type regions are spaced apart from each other by a predetermined distance. The first and second conductive type regions are disposed in the part of the active layer adjacent to the embedded insulation film and under the semiconductor element. Accordingly, a charge is induced to a part of the second conductive type regions adjacent to the insulation film. Specifically, no charge is induced to a part of the first conductive type regions adjacent to the insulation film. Thus, a reverse layer is localized in the part of the second conductive type regions. Accordingly, a pseudo field plate is formed. Thus, a voltage drop is generated in accordance with a distance of the first conductive type region in a lower portion of the active layer adjacent to the insulation film. Without forming concavity and convexity having a large depth, the breakdown voltage is improved.

Alternatively, the element separation structure may be a trench separation structure disposed on a surface of the active layer. The trench separation structure reaches the embedded insulation film, and the trench separation structure surrounds the semiconductor element, the first conductive type regions and the second conductive type regions. In this case, the semiconductor element is separated from other elements disposed in other regions of the active layer. Thus, the semiconductor element and other element are integrated into one chip.

According to a second aspect of the present disclosure, a semiconductor device includes: a SOI substrate having a support substrate, an embedded insulation film and an active layer, which are stacked in this order, wherein the active layer is made of silicon having a first conductive type; a semiconductor element having a first impurity layer and a second impurity layer, which are disposed in a surface portion of the active layer, wherein the second impurity layer surrounds the first impurity layer so that the first impurity layer and the second impurity layer have a first layout; and a plurality of first conductive type regions and a plurality of second conductive type regions, which are disposed in a part of the active layer adjacent to the embedded insulation film. The first conductive type regions and the second conductive type regions are alternately arranged. The first conductive type regions and the second conductive type regions have a second layout, which corresponds to the semiconductor element.

In the above device, the second conductive type regions sandwich the first conductive type region so that the second conductive type regions are spaced apart from each other by a predetermined distance. The first and second conductive type regions are disposed in the part of the active layer adjacent to the embedded insulation film and under the semiconductor element. Accordingly, a charge is induced to a part of the second conductive type regions adjacent to the insulation film. Specifically, no charge is induced to a part of the first conductive type regions adjacent to the insulation film. Thus, a reverse layer is localized in the part of the second conductive type regions. Accordingly, a pseudo field plate is formed. Thus, a voltage drop is generated in accordance with a distance of the first conductive type region in a lower portion of the active layer adjacent to the insulation film. Thus, the equivalent electric potential lines extends in the vertical direction toward the first conductive type region, and therefore, the distance between the equivalent electric potential lines is compensated. Thus, the breakdown voltage is improved. Without forming concavity and convexity having a large depth, the breakdown voltage of the device is improved.

Alternatively, the semiconductor device may further include: a trench separation structure disposed on a surface of the active layer. The trench separation structure reaches the embedded insulation film, and the trench separation structure surrounds the semiconductor element, the first conductive type regions and the second conductive type regions. In this case, the semiconductor element is separated from other elements disposed in other regions of the active layer. Thus, the semiconductor element and other element are integrated into one chip.

Alternatively, the semiconductor device may further include: a resistance type field plate, which is disposed on the semiconductor element. The resistance type field plate has a spiral shape, which corresponds to the semiconductor element. The resistance type field plate provides a state such that the distance between the equivalent electric potential lines extending in the vertical direction toward the first conductive type region is much uniformed. Thus, the distance between the equivalent electric potential lines is much compensated, and therefore, the breakdown voltage is much improved.

Alternatively, the semiconductor device may further include: a capacitive field plate, which is disposed on the semiconductor element. The capacitive field plate has a concentric circular shape, which corresponds to the semiconductor element. The capacitive field plate provides a state such that the distance between the equivalent electric potential lines extending in the vertical direction toward the first conductive type region is much uniformed. Thus, the distance between the equivalent electric potential lines is much compensated, and therefore, the breakdown voltage is much improved.

Alternatively, the semiconductor device may further include: a semi-insulating poly crystalline silicon layer disposed between the active layer and the embedded, insulation film. The semi-insulating poly crystalline silicon layer is made of poly silicon having a resistance, which is higher than the active layer. The SIPOS film functions as a semi-insulating layer, i.e., a high resistance layer. Thus, a voltage drop is generated proportionally in accordance with the distance in a lower portion of the active layer 3 between the high voltage side and the low voltage side. The voltage drop is caused by the inner resistance of the SIPOS film. Accordingly, the width of the equivalent electric potential lines extending in the vertical direction toward the first conductive type region from the surface of the active layer is much uniformed. Accordingly, the distance between the equivalent electric potential lines is much compensated, so that the breakdown voltage is improved.

Alternatively, the semiconductor device may further include: a charge accumulation layer disposed in the embedded insulation film. The charge accumulation layer has a third layout, which corresponds to the first conductive type regions. In this case, a charge accumulated in the charge accumulation layer provides to induce a charge in a lower portion of the first conductive type region. Thus, the width of the equivalent electric potential lines extending in the vertical direction toward the first conductive type region from the surface of the active layer is much uniformed. Accordingly, the distance between the equivalent electric potential lines is much compensated, so that the breakdown voltage is improved.

Further, the first conductive type regions may be N conductive type regions, and the charge accumulation layer is configured to accumulate a positive charge.

Alternatively, the embedded insulation film may have a plurality of concavities and a plurality of convexities, which are disposed on a surface of the embedded insulation film facing the support substrate. In this case, the thickness of the insulation film at the convexities becomes thick. Thus, a charge is easily induced to a part of the support substrate corresponding to the concavities of the insulation film since the thickness of the insulation film at the concavities is thin. However, a charge is not easily induced to a part of the support substrate corresponding to the convexities of the insulation film since the thickness of the insulation film at the concavities is thick. Thus, the width of the equivalent electric potential lines extending in the vertical direction toward the first conductive type region from the surface of the active layer is much uniformed. Accordingly, the distance between the equivalent electric potential lines is much compensated, so that the breakdown voltage is improved.

Alternatively, the embedded insulation film may have a plurality of concavities and a plurality of convexities, which are disposed on a surface of the embedded insulation film facing the active layer. Each second conductive type region is arranged in a corresponding concavity of the embedded insulation film, and each first conductive type region is arranged on a corresponding convexity of the embedded insulation film. In this case, the thickness between the support substrate and the first conductive type region is thicker than the thickness between the support substrate and the second conductive type region. Thus, a charge is easily induced to a part of the first conductive type region adjacent to the insulation film. Thus, the width of the equivalent electric potential lines extending in the vertical direction toward the first conductive type region from the surface of the active layer is much uniformed. Accordingly, the distance between the equivalent electric potential lines is much compensated, so that the breakdown voltage is improved.

Alternatively, the part of the active layer, in which the first conductive type regions and the second conductive type regions are disposed, may correspond to a whole area of the semiconductor element. In this case, the pseudo plate field is formed on a whole area corresponding to the semiconductor element, and therefore, the breakdown voltage is sufficiently improved.

Alternatively, the semiconductor element may be a PN diode. The first impurity layer is a cathode region having the first conductive type, and the second impurity layer is an anode region having a second conductive type. The PN diode further includes a cathode electrode electrically coupled with the cathode region and an anode electrode electrically coupled with the anode region. The second conductive type regions include a center region, which faces the cathode region, and the first conductive type regions and the second conductive type regions surround the center region.

Alternatively, the semiconductor element may be a LDMOS element. The first impurity layer is a drain region having the first conductive type, and the second impurity layer is a source region having the first conductive type. The LDMOS element further includes: a channel layer having a second conductive type and disposed in a surface portion of the active layer, wherein the source region is disposed in a surface portion of the channel layer, and the drain region is spaced apart from the channel layer; a channel region provided by a surface part of the channel layer between the source region and the active layer; a gate electrode disposed on the channel region via a gate insulation film; a source electrode electrically coupled with the source region and the channel layer; and a drain electrode electrically coupled with the drain region. The source region and the channel region surround the drain region. The second conductive type regions include a center region, which faces the drain region, and the first conductive type regions and the second conductive type regions surround the center region.

Alternatively, the semiconductor element may be a IGBT. The first impurity layer is a collector region having a second conductive type, and the second impurity layer is a emitter region having the first conductive type. The IGBT further includes: a base region having the second conductive type and disposed in a surface portion of the active layer, wherein the emitter region is disposed in a surface portion of the base region, and the collector region is spaced apart from the base region; a channel region provided by a surface part of the base region between the emitter region and the active layer; a gate electrode disposed on the channel region via a gate insulation film; a emitter electrode electrically coupled with the emitter region and the base region; and a collector electrode electrically coupled with the collector region. The emitter region and the base region surround the collector region. The second conductive type regions include a center region, which faces the collector region, and the first conductive type regions and the second conductive type regions surround the center region.

According to a third aspect of the present disclosure, a method for manufacturing a semiconductor device includes: preparing a silicon substrate having a first conductive type; forming a plurality of first conductive type regions and a plurality of second conductive type regions in a first surface portion of the silicon substrate in such a manner that the second conductive type regions include a center region, and the first conductive type regions and the second conductive type regions are alternately arranged to have a second layout around the center region; bonding the silicon substrate to a support substrate via an embedded insulation film in such a manner that the first surface portion of the silicon substrate faces the support substrate through the embedded insulation film; removing a part of a second surface portion of the silicon substrate so that the silicon substrate is thinned, and the silicon substrate provides an active layer, wherein the second surface portion is opposite to the first surface portion; forming a semiconductor element in the second surface portion of the silicon substrate. The semiconductor element includes a first impurity layer and a second impurity layer. The second impurity layer surrounds the first impurity layer, and the first impurity layer and the second impurity layer has a first layout, which corresponds to the second layout.

In the above method, the second conductive type regions sandwich the first conductive type region so that the second conductive type regions are spaced apart from each other by a predetermined distance. The first, and second conductive type regions are disposed in the part of the active layer adjacent to the embedded insulation film and under the semiconductor element. Accordingly, a charge is induced to a part of the second conductive type regions adjacent to the insulation film. Specifically, no charge is induced to a part of the first conductive type regions adjacent to the insulation film. Thus, a reverse layer is localized in the part of the second conductive type regions. Accordingly, a pseudo field plate is formed. Thus, a voltage drop is generated in accordance with a distance of the first conductive type region in a lower portion of the active layer adjacent to the insulation film. Thus, the equivalent electric potential lines extends in the vertical direction toward the first conductive type region, and therefore, the distance between the equivalent electric potential lines is compensated. Thus, the breakdown voltage is improved. Without forming concavity and convexity having a large depth, the breakdown voltage of the device is improved.

According to a fourth aspect of the present disclosure, a semiconductor device includes: a SOI substrate having a support substrate, an embedded insulation film and an active layer, which are stacked in this order, wherein the active layer has a first conductive type; a first region having a first semiconductor element region and a first trench separation structure and disposed in the SOI substrate; a second region having a second semiconductor element region and a second trench separation structure and disposed in the SOI substrate. The first region is separated from the second region. The first trench separation structure surrounds an outer periphery of the first region, and the second trench separation structure surrounds an outer periphery of the second region. The first semiconductor element region includes a first semiconductor element. The first semiconductor element includes a first impurity layer, a second impurity layer, a first electrode and a second electrode. The first impurity layer and the second impurity layer are disposed in a surface portion of the active layer. Each of the first impurity layer and the second impurity layer has a stripe pattern along with one direction as a longitudinal direction. A first voltage is applicable to the first impurity layer via the first electrode, and a second voltage is applicable to the second impurity layer via the second electrode. The first voltage is higher than the second voltage. The first region further includes a plurality of electric potential control regions, which are disposed on both sides of the semiconductor element region along with the longitudinal direction. The electric potential control regions are arranged between the first impurity layer and the second impurity layer along with each side of the semiconductor element region. The first region further includes an electrode pattern, which is disposed on the semiconductor element region and the electric potential control regions. The electrode pattern extends from the first impurity layer to the second impurity layer. The electrode pattern is electrically coupled with each electric potential control region.

In the above device, the electric potential of the surface portion of the semiconductor element region is gradually reduced from the first impurity layer as a high potential side to the second impurity layer as a low potential side since the voltage drop is generated by the inner resistance of the electrode pattern. Further, the electric potential of each electric potential control region on the side of the semiconductor element region is reduced in a stepwise manner from the first impurity layer as a high potential side to the second impurity layer as a low potential side since the voltage drop is generated by the inner resistance of the electrode pattern. Accordingly, since the electric potential of the semiconductor element region from the first impurity layer to the second impurity layer is reduced, the electric potential of each electric potential control region disposed on the side of the semiconductor element region and the electric potential of the surface portion of the semiconductor element region are reduced. Accordingly, the electric field at both ends of the first and second impurity layers along with the longitudinal direction is restricted from concentrating. Thus, the breakdown voltage reduction is prevented. Further, the electric potential of each electric potential control region disposed on the side of the semiconductor element region can be controlled to be different from each other by using the electrode pattern. Accordingly, it is not necessary to form a control device such as a conventional dividing diode around the semiconductor element region. Accordingly, the dimensions of the device is reduced, and the electric field concentration at the periphery of the high breakdown voltage device is restricted. Thus, the device has a high breakdown voltage.

Alternatively, the electrode pattern may have a meander shape. Further, the electrode pattern may include a parallel portion and a vertical portion. The parallel portion extends along with the longitudinal direction. The vertical portion extends along with a direction perpendicular to the longitudinal direction. The vertical portion is connected to the parallel portion at each side of the semiconductor element region, and the vertical portion is electrically coupled with each electric potential control region.

Alternatively, the SOI substrate may further include an interlayer insulation film, which covers the active layer, and the electrode pattern is embedded in the interlayer insulation film, which is disposed on the semiconductor element region and the electric potential control regions.

Alternatively, the electric potential control regions may be made of silicon and provided by a part of the active layer, which is separated by the first trench separation structure.

Alternatively, the first trench separation structure may include a trench, an insulation film and a poly silicon layer. The insulation film is a thermal oxidation film and disposed on an inner wall of the trench. The poly silicon layer is disposed on the insulation film in the trench so that the poly silicon layer and the insulation film are embedded in the trench. The electric potential control regions are made of poly silicon and provided by another poly silicon layer, which is arranged on both sides of the semiconductor element region. The another poly silicon layer is embedded in another trench via an insulation film, and the another poly silicon layer together with the trench and the insulation film is divided into a plurality of portions so that the electric potential control regions are electrically separated from each other. In this case, the influence of the electric potential of the outside of the first region is shielded. Accordingly, the shielding performance against the electric potential of the outside of the first region is improved. Thus, the breakdown voltage is effectively improved.

Alternatively, a distance between the first trench separation structure and the another poly silicon layer with the trench and the insulation film may be equal to or smaller than two micrometers, and a distance between two adjacent another poly silicon layers with the trenches and the insulation films may be equal to or smaller than two micrometers. In this case, the depletion layer caused by the work function difference between the insulation film providing the trench separation structure and silicon material completely depletes the silicon portion between the first trench separation structure and the another poly silicon layer with the trench and the insulation film and the silicon portion between two adjacent another poly silicon layers with the trenches and the insulation films. Thus, the breakdown voltage is effectively improved.

Alternatively, the semiconductor element region may further include a PN junction structure having a plurality of P type regions and a plurality of N type regions, which are alternately arranged along with the direction perpendicular to the longitudinal direction. The PN junction structure is disposed in a part of the active layer, which contacts the embedded insulation film, and each of the P type regions and the N type regions has a stripe pattern having a longitudinal direction in parallel to the longitudinal direction of the stripe pattern of the first impurity layer and the second impurity layer. In this case, the PN junction structure is repeatedly arranged in the portion of the active layer adjacent to the embedded insulation film. Thus, the electric potential of each electric potential control region disposed on the surface, the side and the backside of the semiconductor element region is reduced in a stepwise manner in a direction from the first impurity layer to the second impurity layer. Thus, the breakdown voltage of the semiconductor device is improved.

Alternatively, the first trench separation structure may be further arranged on both sides of the semiconductor element region. The first trench separation structure on each side of the semiconductor element region includes a plurality of protrusions, which protrude toward the semiconductor element region, and the protrusions are disposed between the first impurity layer and the second impurity layer. In this case, the distance between the active layer and the electric potential control region is made long. Thus, it is difficult to induce the charge at the part of the active layer contacting the protrusions. Accordingly, the deviation of the equivalent electric potential line distribution is restricted. The breakdown voltage is much improved.

Alternatively, the first trench separation structure may be further arranged on both sides of the semiconductor element region. The semiconductor element region further includes a PN junction structure having a plurality of P type regions and a plurality of N type regions, which are alternately arranged along with the direction perpendicular to the longitudinal direction. The PN junction structure is disposed in a surface part of the active layer, which contacts the first trench separation structure on each side of the semiconductor element region, and the surface part of the active layer is disposed between the first impurity layer and the second impurity layer. In this case, the charge is induced to the part of the P conductive type regions contacting the trench separation structure. It is difficult to induce the charge at the part of the N type regions contacting the trench separation structure. Accordingly, the deviation of the equivalent electric potential line distribution is restricted. The breakdown voltage is much improved.

Alternatively, the semiconductor element may be a PN diode. The first impurity layer is a cathode region having a first conductive type, and the second impurity layer is an anode region having a second, conductive type. The first electrode is a cathode electrode electrically coupled with the cathode region, and the second electrode is an anode electrode electrically coupled with the anode region, and the anode region is arranged on both sides of the cathode region.

Alternatively, the semiconductor element may be a LDMOS element. The first impurity layer is a drain region having a first conductive type, and the second impurity layer is a source region having the first conductive type. The LDMOS element further includes: a channel layer having a second conductive type and disposed in a surface portion of the active layer, wherein the source region is disposed in a surface portion of the channel layer, and the drain region is spaced apart from the channel layer; a channel region provided by a surface part of the channel layer between the source region and the active layer; a gate electrode disposed on the channel region via a gate insulation film; a source electrode electrically coupled with the source region and the channel layer and corresponding to the second electrode; and a drain electrode electrically coupled with the drain region and corresponding to the first electrode. The source region and the channel region are disposed on both sides of the drain region.

Alternatively, the semiconductor element may be a IGBT. The first impurity layer is a collector region having a second conductive type, and the second impurity layer is a emitter region having a first conductive type. The IGBT further includes: a base region having the second conductive type and disposed in a surface portion of the active layer, wherein the emitter region is disposed in a surface portion of the base region, and the collector region is spaced apart from the base region; a channel region provided by a surface part of the base region between the emitter region and the active layer; a gate electrode disposed on the channel region via a gate insulation film; a emitter electrode electrically coupled with the emitter region and the base region and corresponding to the second electrode; and a collector electrode electrically coupled with the collector region and corresponding to the first electrode. The emitter region and the base region are disposed on both sides of the collector region.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:
1. A semiconductor device comprising:
an SOI substrate having a support substrate, an embedded insulation film and an active layer, which are stacked in this order, wherein the active layer is made of silicon having a first conductive type;
a semiconductor element having a first impurity layer and a second impurity layer, which are disposed in a surface portion of the active layer, wherein the second impurity layer surrounds the first impurity layer so that the first impurity layer and the second impurity layer have a first layout; and a plurality of first conductive type regions and a plurality of second conductive type regions, which are disposed in a part of the active layer adjacent to the embedded insulation film, wherein the first conductive type regions and the second conductive type regions are alternately arranged, wherein the first conductive type regions and the second conductive type regions have a second layout, which corresponds to the semiconductor element, wherein the semiconductor element is a PN diode, wherein the first impurity layer is a cathode region having the first conductive type, and the second impurity layer is an anode region having a second conductive type, wherein the PN diode further includes a cathode electrode electrically coupled with the cathode region and an anode electrode electrically coupled with the anode region, wherein the second conductive type regions include a center region, which faces the cathode region, and wherein the first conductive type regions and the second conductive type regions surround the center region.

2. The semiconductor device according to claim 1, further comprising:
a trench separation structure disposed on a surface of the active layer,
wherein the trench separation structure reaches the embedded insulation film, and
wherein the trench separation structure surrounds the semiconductor element, the first conductive type regions and the second conductive type regions.

3. The semiconductor device according to claim 1, further comprising:
a resistance type field plate, which is disposed on the semiconductor element,
wherein the resistance type field plate has a spiral shape, which corresponds to the semiconductor element.

4. The semiconductor device according to claim 1, further comprising:
a capacitive field plate, which is disposed on the semiconductor element,
wherein the capacitive field plate has a concentric circular shape, which corresponds to the semiconductor element.

5. The semiconductor device according to claim 1, further comprising:
a semi-insulating poly crystalline silicon layer disposed between the active layer and the embedded insulation film,
wherein the semi-insulating poly crystalline silicon layer is made of poly silicon having a resistance, which is higher than the active layer.

6. The semiconductor device according to claim 1,
wherein the embedded insulation film has a plurality of concavities and a plurality of convexities, which are disposed on a surface of the embedded insulation film facing the support substrate.

7. The semiconductor device according to claim 1,
wherein the part of the active layer, in which the first conductive type regions and the second conductive type regions are disposed, corresponds to a whole area of the semiconductor element.

8. A semiconductor device comprising:
an SOI substrate having a support substrate, an embedded insulation film and an active layer, which are stacked in this order, wherein the active layer is made of silicon having a first conductive type;
a semiconductor element having a first impurity layer and a second impurity layer, which are disposed in a surface portion of the active layer, wherein the second impurity layer surrounds the first impurity layer so that the first impurity layer and the second impurity layer have a first layout;
a plurality of first conductive type regions and a plurality of second conductive type regions, which are disposed in a part of the active layer adjacent to the embedded insulation film; and
a charge accumulation layer disposed in the embedded insulation film,
wherein the first conductive type regions and the second conductive type regions are alternately arranged,
wherein the first conductive type regions and the second conductive type regions have a second layout, which corresponds to the semiconductor element, and
wherein the charge accumulation layer has a third layout, which corresponds to the first conductive type regions.

9. The semiconductor device according to claim 8,
wherein the first conductive type regions are N conductive type regions, and
wherein the charge accumulation layer is configured to accumulate a positive charge.

10. A semiconductor device comprising:
an SOI substrate having a support substrate, a embedded insulation film and an active layer, which are stacked in this order, wherein the active layer is made of silicon having a first conductive type;
a semiconductor element having a first impurity layer and a second impurity layer, which are disposed in a surface portion of the active layer, wherein the second impurity layer surrounds the first impurity layer so that the first impurity layer and the second impurity layer have a first layout; and
a plurality of first conductive type regions and a plurality of second conductive type regions, which are disposed in a part of the active layer adjacent to the embedded insulation film,
wherein the first conductive type regions and the second conductive type regions are alternately arranged,
wherein the first conductive type regions and the second conductive type regions have a second layout, which corresponds to the semiconductor element,
wherein the embedded insulation film has a plurality of concavities and a plurality of convexities, which are disposed on a surface of the embedded insulation film facing the active layer,
wherein each second conductive type region is arranged in a corresponding concavity of the embedded insulation film, and
wherein each first conductive type region is arranged on a corresponding convexity of the embedded insulation film.

11. A semiconductor device comprising:
an SOI substrate having a support substrate, an embedded insulation film and an active layer, which are stacked in this order, wherein the active layer is made of silicon having a first conductive type;
a semiconductor element having a first impurity layer and a second impurity layer, which are disposed in a surface portion of the active layer, wherein the second impurity layer surrounds the first impurity layer so that the first impurity layer and the second impurity layer have a first layout; and a plurality of first conductive type regions and a plurality of second conductive type regions, which are disposed in part of the active layer adjacent to the embedded insulation film, wherein the first conductive type regions and the second conductive type regions are alternately arranged, wherein the first conductive type regions and the second conductive type regions have a second layout, which corresponds to the semiconductor element, wherein the semiconductor element is a LDMOS element, wherein the first impurity layer is a drain region having the first conductive type, and the second impurity layer is a source region having the first conductive type, wherein the LDMOS element further includes:

a channel layer having a second conductive type and disposed in a surface portion of the active layer, wherein the source region is disposed in a surface portion of the channel layer, and the drain region is spaced apart from the channel layer;

a channel region provided by a surface part of the channel layer between the source region and the active layer;

a gate electrode disposed on the channel region via a gate insulation film;

a source electrode electrically coupled with the source region and the channel layer; and a drain electrode electrically coupled with the drain region, wherein the source region and the channel region surround the drain region, wherein the second conductive type regions include a center region, which faces the drain region, and wherein the first conductive type regions and the second conductive type regions surround the center region.

12. A semiconductor device comprising:

an SOI substrate having a support substrate, an embedded insulation film and an active layer, which are stacked in this order, wherein the active layer is made of silicon having a first conductive type;

a semiconductor element having a first impurity layer and a second impurity layer, which are disposed in a surface portion of the active layer, wherein the second impurity layer surrounds the first impurity layer so that the first impurity layer and the second impurity layer have a first layout; and a plurality of first conductive type regions and a plurality of second conductive type regions, which are disposed in a part of the active layer adjacent to the embedded insulation film, wherein the first conductive type regions and the second conductive type regions are alternately arranged, wherein the first conductive type regions and the second conductive type regions have a second layout, which corresponds to the semiconductor element, wherein the semiconductor element is a IGBT, wherein the first impurity layer is a collector region having a second conductive type, and the second impurity layer is a emitter region having the first conductive type, wherein the IGBT further includes:

a base region having the second conductive type and disposed in a surface portion of the active layer, wherein the emitter region is disposed in a surface portion of the base region, and the collector region is spaced apart from the base region;

a channel region provided by a surface part of the base region between the emitter region and the active layer;

a gate electrode disposed on the channel region via a gate insulation film;

a emitter electrode electrically coupled with the emitter region and the base region; and a collector electrode electrically coupled with the collector region, wherein the emitter region and the base region surround the collector region, wherein the second conductive type regions include a center region, which faces the collector region, and wherein the first conductive type regions and the second conductive type regions surround the center region.

13. A semiconductor device comprising:

a SOI substrate having a support substrate, an embedded insulation film and an active layer, which are stacked in this order, wherein the active layer has a first conductive type;

a first region having a first semiconductor element region and a first trench separation structure and disposed in the SOI substrate;

a second region having a second semiconductor element region and a second trench separation structure and disposed in the SOI substrate, wherein the first region is separated from the second region, wherein the first trench separation structure surrounds an outer periphery of the first region, and the second trench separation structure surrounds an outer periphery of the second region, wherein the first semiconductor element region includes a first semiconductor element, wherein the first semiconductor element includes a first impurity layer, a second impurity layer, a first electrode and a second electrode, wherein the first impurity layer and the second impurity layer are disposed in a surface portion of the active layer, wherein each of the first impurity layer and the second impurity layer has a stripe pattern along with one direction as a longitudinal direction, wherein a first voltage is applicable to the first impurity layer via the first electrode, and a second voltage is applicable to the second impurity layer via the second electrode, wherein the first voltage is higher than the second voltage, wherein the first region further includes a plurality of electric potential control regions, which are disposed on both sides of the semiconductor element region along with the longitudinal direction, wherein the electric potential control regions are arranged between the first impurity layer and the second impurity layer along with each side of the semiconductor element region, wherein the first region further includes an electrode pattern, which is disposed on the semiconductor element region and the electric potential control regions, wherein the electrode pattern extends from the first impurity layer to the second impurity layer, and wherein the electrode pattern is electrically coupled with each electric potential control region.

14. The semiconductor device according to claim 13, wherein the electrode pattern has a meander shape.

15. The semiconductor device according to claim 1, wherein the electrode pattern includes a parallel portion and a vertical portion, wherein the parallel portion extends along with the longitudinal direction, wherein the vertical portion extends along with a direction perpendicular to the longitudinal direction, wherein the vertical portion is connected to the parallel portion at each side of the semiconductor element region, and
wherein the vertical portion is electrically coupled with each electric potential control region.

16. The semiconductor device according to claim 13,
wherein the SOI substrate further includes an interlayer insulation film, which covers the active layer, and
wherein the electrode pattern is embedded in the interlayer insulation film, which is disposed on the semiconductor element region and the electric potential control regions.

17. The semiconductor device according to claim 13,
wherein the electric potential control regions are made of silicon and provided by a part of the active layer, which is separated by the first trench separation structure.

18. The semiconductor device according to claim 13,
wherein the first trench separation structure includes a trench, an insulation film and a poly silicon layer,
wherein the insulation film is a thermal oxidation film and disposed on an inner wall of the trench,
wherein the poly silicon layer is disposed on the insulation film in the trench so that the poly silicon layer and the insulation film are embedded in the trench,
wherein the electric potential control regions are made of poly silicon and provided by another poly silicon layer, which is arranged on both sides of the semiconductor element region,
wherein the another poly silicon layer is embedded in another trench via an insulation film, and
wherein the another poly silicon layer together with the trench and the insulation film is divided into a plurality of portions so that the electric potential control regions are electrically separated from each other.

19. The semiconductor device according to claim 18,
wherein a distance between the first trench separation structure and the another poly silicon layer with the trench and the insulation film is equal to or smaller than two micrometers, and
wherein a distance between two adjacent another poly silicon layers with the trenches and the insulation films is equal to or smaller than two micrometers.

20. The semiconductor device according to claim 13,
wherein the semiconductor element region further includes a PN junction structure having a plurality of P type regions and a plurality of N type regions, which are alternately arranged along with the direction perpendicular to the longitudinal direction,
wherein the PN junction structure is disposed in a part of the active layer, which contacts the embedded insulation film, and
wherein each of the P type regions and the N type regions has a stripe pattern having a longitudinal direction in parallel to the longitudinal direction of the stripe pattern of the first impurity layer and the second impurity layer.

21. The semiconductor device according to claim 13,
wherein the first trench separation structure is further arranged on both sides of the semiconductor element region,
wherein the first trench separation structure on each side of the semiconductor element region includes a plurality of protrusions, which protrude toward the semiconductor element region, and
wherein the protrusions are disposed between the first impurity layer and the second impurity layer.

22. The semiconductor device according to claim 13,
wherein the first trench separation structure is further arranged on both sides of the semiconductor element region,
wherein the semiconductor element region further includes a PN junction structure having a plurality of P type regions and a plurality of N type regions, which are alternately arranged along with the direction perpendicular to the longitudinal direction,
wherein the PN junction structure is disposed in a surface part of the active layer, which contacts the first trench separation structure on each side of the semiconductor element region, and
wherein the surface part of the active layer is disposed between the first impurity layer and the second impurity layer.

23. The semiconductor device according to claim 13,
wherein the semiconductor element is a PN diode,
wherein the first impurity layer is a cathode region having a first conductive type, and the second impurity layer is an anode region having a second conductive type,
wherein the first electrode is a cathode electrode electrically coupled with the cathode region, and the second electrode is an anode electrode electrically coupled with the anode region, and
wherein the anode region is arranged on both sides of the cathode region.

24. The semiconductor device according to claim 13,
wherein the semiconductor element is a LDMOS element,
wherein the first impurity layer is a drain region having a first conductive type, and the second impurity layer is a source region having the first conductive type,
wherein the LDMOS element further includes:
a channel layer having a second conductive type and disposed in a surface portion of the active layer, wherein the source region is disposed in a surface portion of the channel layer, and the drain region is spaced apart from the channel layer;
a channel region provided by a surface part of the channel layer between the source region and the active layer;
a gate electrode disposed on the channel region via a gate insulation film;
a source electrode electrically coupled with the source region and the channel layer and corresponding to the second electrode; and
a drain electrode electrically coupled with the drain region and corresponding to the first electrode, and
wherein the source region and the channel region are disposed on both sides of the drain region.

25. The semiconductor device according to claim 13,
wherein the semiconductor element is a IGBT,
wherein the first impurity layer is a collector region having a second conductive type, and the second impurity layer is a emitter region having a first conductive type,
wherein the IGBT further includes:
a base region having the second conductive type and disposed in a surface portion of the active layer, wherein the emitter region is disposed in a surface portion of the base region, and the collector region is spaced apart from the base region;
a channel region provided by a surface part of the base region between the emitter region and the active layer;
a gate electrode disposed on the channel region via a gate insulation film;
a emitter electrode electrically coupled with the emitter region and the base region and corresponding to the second electrode; and a collector electrode electrically coupled with the collector region and corresponding to the first electrode, and wherein the emitter region and the base region are disposed on both sides of the collector region.

* * * * *